(12) United States Patent
Miyazaki

(10) Patent No.: US 11,417,812 B2
(45) Date of Patent: Aug. 16, 2022

(54) SEMICONDUCTOR LIGHT EMITTING DEVICE

(71) Applicant: ROHM CO., LTD., Kyoto (JP)

(72) Inventor: Dai Miyazaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/997,626

(22) Filed: Aug. 19, 2020

(65) Prior Publication Data

US 2021/0098670 A1 Apr. 1, 2021

(30) Foreign Application Priority Data

Sep. 26, 2019 (JP) .............................. JP2019175690

(51) Int. Cl.
*H01L 33/62* (2010.01)
*H01L 23/00* (2006.01)
*H01L 25/16* (2006.01)

(52) U.S. Cl.
CPC .............. *H01L 33/62* (2013.01); *H01L 24/32* (2013.01); *H01L 24/48* (2013.01); *H01L 24/49* (2013.01); *H01L 24/73* (2013.01); *H01L 25/165* (2013.01); *H01L 25/167* (2013.01); H01L 2224/32245 (2013.01); H01L 2224/4811 (2013.01); H01L 2224/48101 (2013.01); H01L 2224/48106 (2013.01); H01L 2224/48108 (2013.01); H01L 2224/48137 (2013.01); H01L 2224/48245 (2013.01); H01L 2224/49109 (2013.01); H01L 2224/49112 (2013.01); H01L 2224/73265 (2013.01)

(58) Field of Classification Search
CPC ......... H01L 24/48; H01L 24/73; H01L 24/32; H01L 25/167; H01L 33/62; H01L 33/483; H01L 24/29; H01L 2924/12035
See application file for complete search history.

(56) References Cited

U.S. PATENT DOCUMENTS

| | | | | |
|---|---|---|---|---|
| 10,424,699 | B2 * | 9/2019 | Tosuke | H01L 33/62 |
| 10,622,531 | B2 * | 4/2020 | Kato | H01L 24/45 |
| 11,233,186 | B2 * | 1/2022 | Miyazaki | H01L 33/52 |

FOREIGN PATENT DOCUMENTS

JP 2016162811 A 9/2016

* cited by examiner

*Primary Examiner* — Jasmine J Clark
(74) *Attorney, Agent, or Firm* — Hamre, Schumann, Mueller & Larson, P.C.

(57) ABSTRACT

A semiconductor light emitting device includes a main lead, a sub lead, a semiconductor light emitting element bonded to the main lead, and a protective element bonded to the sub lead, wherein the semiconductor light emitting element is connected to the main lead and the sub lead via a first wire and a second wire, respectively, wherein the protective element has a main surface electrode and a back surface electrode which is connected to the sub lead via a conductive bonding material, and wherein the main surface electrode of the protective element is connected to the main lead via a third wire, a connecting wiring which connects electrodes of the semiconductor light emitting element, and a connecting member including the second wire.

15 Claims, 35 Drawing Sheets

SEMICONDUCTOR LIGHT EMITTING DEVICE

CROSS-REFERENCE TO RELATED APPLICATION

This application is based upon and claims the benefit of priority from Japanese Patent Application No. 2019-175690, filed on Sep. 26, 2019, the entire contents of which are incorporated herein by reference.

TECHNICAL FIELD

The present disclosure relates to a semiconductor light emitting device.

BACKGROUND

A semiconductor light emitting device in the related art has leads on which a semiconductor light emitting element and a protective element are mounted, a case that supports the leads, and wires that connect the semiconductor light emitting element and the leads.

By the way, the protective element such as a Zener diode may be mounted in parallel with the semiconductor light emitting element. Thus, the arrangement position of the mounted protective element and the connecting position of the wires connecting the protective element to the leads are limited.

SUMMARY

Some embodiments of the present disclosure provide a semiconductor light emitting device that includes a semiconductor light emitting element and a protective element with a high degree of freedom in package design.

According to an aspect of the present disclosure, there is provided a semiconductor light emitting device including: a main lead having a main surface and a first back surface facing a side opposite to the main surface; a sub lead arranged in a first direction with respect to the main lead, and having a main surface facing the same side as the main surface of the main lead and a second back surface facing the side opposite to the main surface of the sub lead; a case configured to support the main lead and the sub lead, and having a case main surface facing the same side as the main surfaces of the main lead and the sub lead, and an opening formed in the case main surface to expose portions of the main lead and the sub lead; a semiconductor light emitting element arranged on the main surface of the main lead, and having an element main surface facing the same side as the main surface of the main lead, an element back surface facing the main surface of the main lead, a first electrode formed on the element main surface, and a main surface connecting portion formed on the element main surface; a first bonding material bonding the semiconductor light emitting element to the main lead; a first wire connecting the first electrode of the semiconductor light emitting element to the sub lead; a protective element arranged on the main surface of the sub lead, and having a main surface and a back surface facing opposite sides, a main surface electrode formed on the main surface of the protective element, and a back surface electrode formed on the back surface of the protective element; a conductive second bonding material bonding the back surface electrode of the protective element to the sub lead; and a connecting member configured to connect the main surface electrode of the protective element to the main lead via the main surface connecting portion of the semiconductor light emitting element.

With this configuration, it is possible to obtain a semiconductor light emitting device with fewer restrictions on the connection position of the wires connecting the semiconductor light emitting element and the protective element to the main lead and the sub lead, the arrangement position of the protective element, and the like, and with a high degree of freedom in package design.

According to another aspect of the present disclosure, there is provided a semiconductor light emitting device including: a main lead having a main surface and a first back surface facing a side opposite to the main surface; a sub lead arranged in a first direction with respect to the main lead, and having a main surface facing the same side as the main surface of the main lead and a second back surface facing a side opposite to the main surface of the sub lead; a case configured to support the main lead and the sub lead, and having a case main surface facing the same side as the main surfaces of the main lead and the sub lead, and an opening formed in the case main surface to expose portions of the main lead and the sub lead; a semiconductor light emitting element arranged on the main surface of the main lead, and having an element main surface facing the same side as the main surface of the main lead, an element back surface facing the main surface of the main lead, and a main surface connecting portion formed on the element main surface; a protective element arranged on the main surface of the main lead, and having a main surface and a back surface facing opposite sides, a main surface electrode formed on the main surface of the protective element, and a back surface electrode formed on the back surface of the protective element; a first bonding material bonding the semiconductor light emitting element to the main lead; a conductive second bonding material bonding the back surface electrode of the protective element to the main lead; and a connecting member configured to connect the main surface electrode of the protective element to the sub lead via the main surface connecting portion of the semiconductor light emitting element.

With this configuration, it is possible to obtain a semiconductor light emitting device with fewer restrictions on the connection position of the wires connecting the semiconductor light emitting element and the protective element to the main lead and the sub lead, the arrangement position of the protective element, and the like, and with a high degree of freedom in package design.

DETAILED DESCRIPTION

Figure 1:
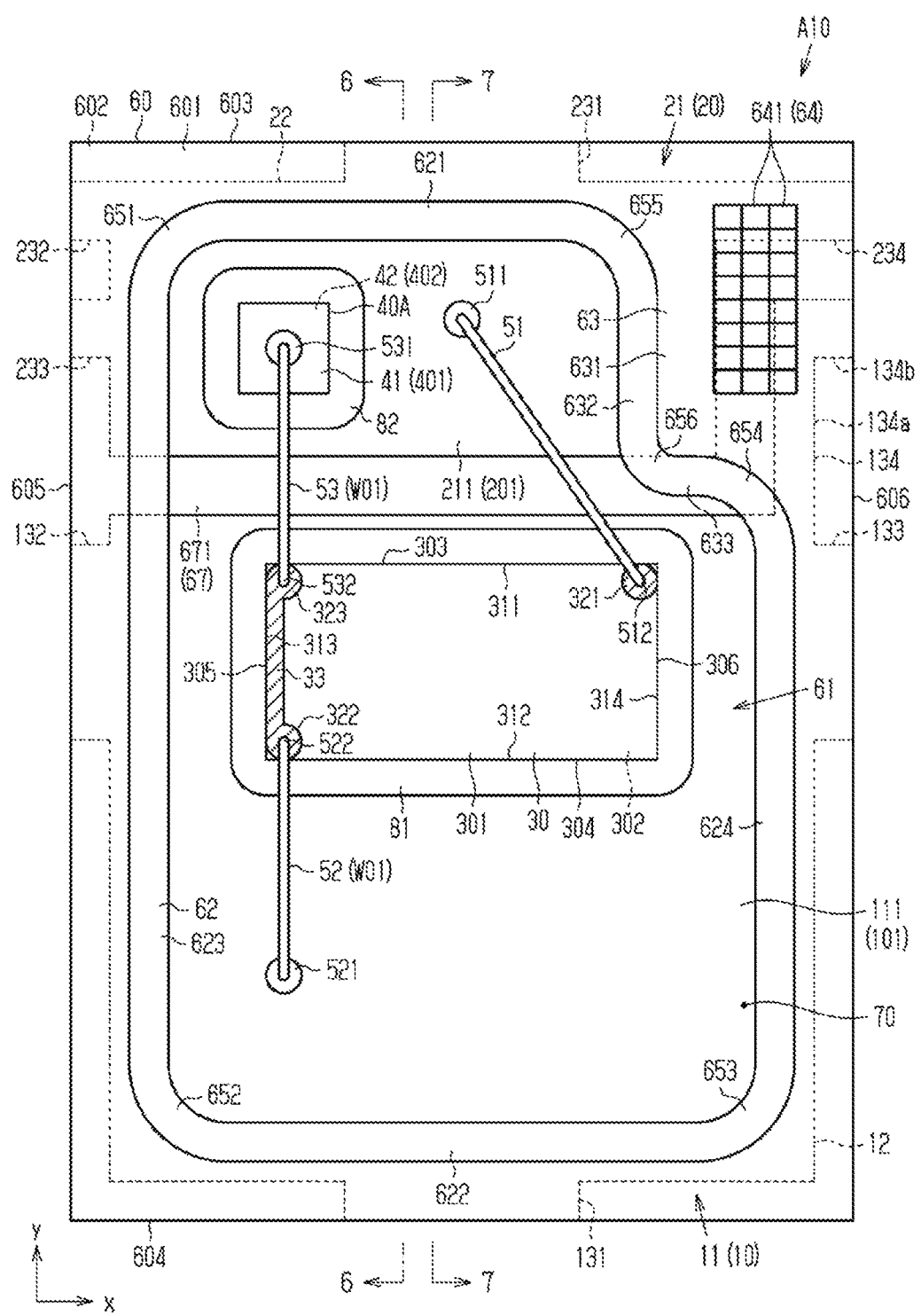
FIG. 1 is a schematic plan view of a semiconductor light emitting device according to a first embodiment.

Embodiments and modifications of the present disclosure will now be described in detail with reference to the drawings. The following embodiments and modifications exemplify a configuration and method for embodying the technical idea of the present disclosure, and do not limit the material, shape, structure, arrangement, dimension, and the like of each constituent part of the present disclosure. The following embodiments and modifications can be changed in various ways. Further, the following embodiments and modifications can be implemented in combination unless technically contradictory.

First Embodiment

Hereinafter, a semiconductor light emitting device A10 according to a first embodiment will be described with reference to FIGS. 1 to 8. As shown in FIGS. 1 to 7, the semiconductor light emitting device A10 according to the first embodiment is a package including a semiconductor light emitting element 30 and a protective element 40A. The semiconductor light emitting device A10 includes a main lead 10, a sub lead 20, the semiconductor light emitting element 30, the protective element 40A, wires 51, 52, and 53, a case 60, and a sealing member 70.

The semiconductor light emitting device A10 has a rectangular parallelepiped shape. The semiconductor light emitting device A10 has a length of, for example, 2.7 mm, a width of, for example, 2.0 mm, and a thickness of, for example, 0.6 mm, and is configured as a thin semiconductor light emitting device. Here, for convenience of description, a thickness direction of the semiconductor light emitting device A10 is defined as z, a longitudinal direction (long side direction) of the semiconductor light emitting device A10 orthogonal to the thickness direction z is defined as a first direction y, and a lateral direction (short side direction) of the semiconductor light emitting device A10 orthogonal to the thickness direction z and the first direction y is defined as a second direction x.

Figure 2:
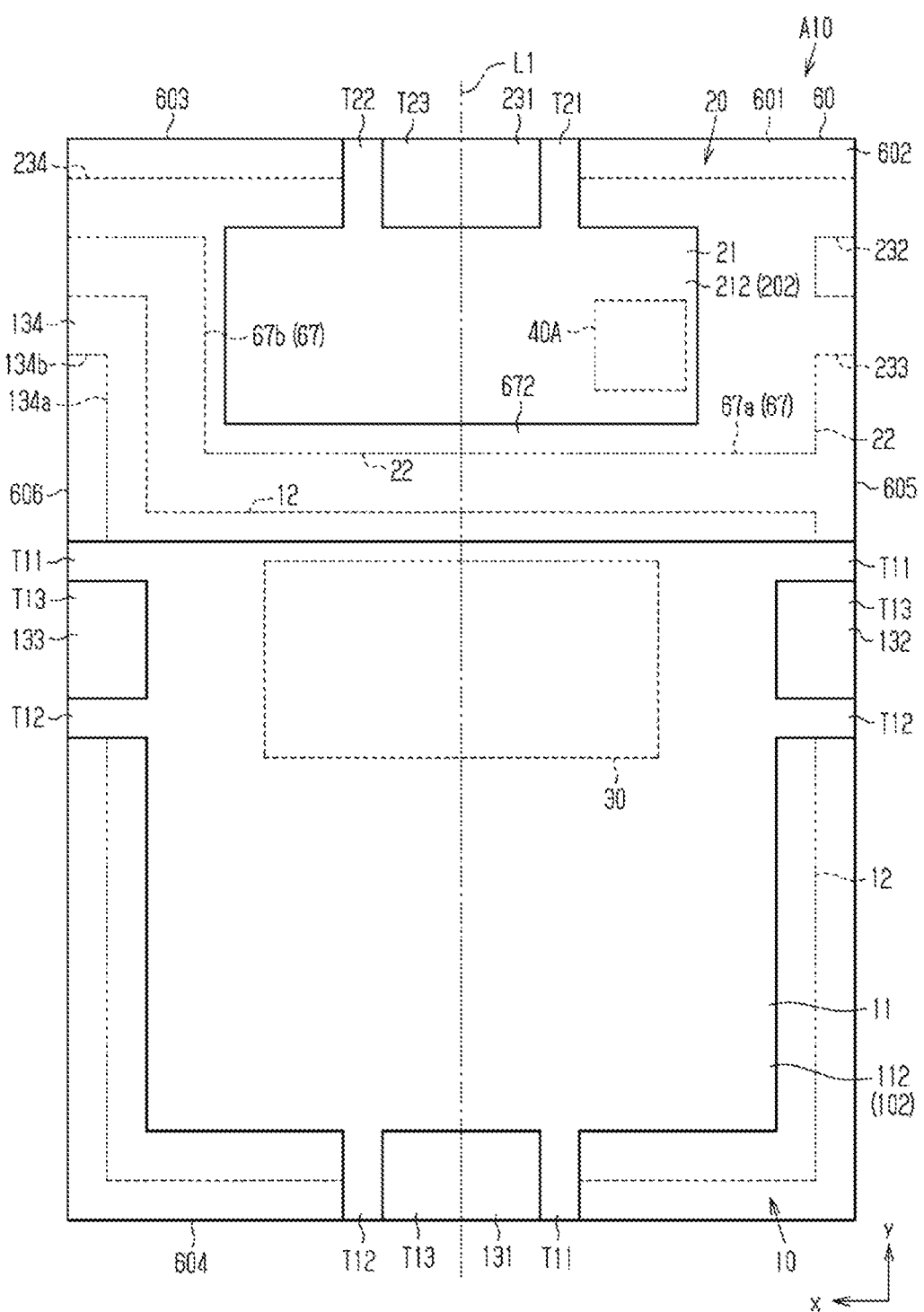
FIG. 2 is a schematic bottom view of the semiconductor light emitting device according to the first embodiment.

As shown in FIGS. 1 and 2, the main lead 10 and the sub lead 20 are arranged in the first direction y. In the first embodiment, the main lead 10 supports the semiconductor light emitting element 30, and the sub lead 20 supports the protective element 40A. That is, the semiconductor light emitting element 30 is mounted on the main lead 10, and the protective element 40A is mounted on the sub lead 20.

The semiconductor light emitting element 30 is, for example, a light emitting diode element (LED element) capable of emitting visible light or infrared light. The semiconductor light emitting element 30 may be a light emitting element such as a laser diode (LD). The protective element 40A is, for example, a Zener diode. The main lead 10 and the sub lead 20 are configured to supply power to the semiconductor light emitting element 30. The main lead 10 is composed of, for example, a base material made of copper (Cu), nickel (Ni), or an alloy containing at least one thereof, and a plating layer on the surface of the base material. The plating layer is composed of, for example, at least one of a Ni plating layer, a gold (Au)-palladium (Pd) plating layer, a silver (Ag) plating layer, and the like. The sub lead 40 is composed of, for example, a base material made of Cu, Ni, or an alloy containing at least one thereof, and a plating layer on the surface of the base material. The plating layer is composed of at least one of a Ni plating layer, a Au—Pd plating layer, a Ag plating layer, and the like.

The case 60 has a rectangular shape as a whole. The case 60 supports the main lead 10 and the sub lead 20. The case 60 has a case main surface 601, a case back surface 602, and case outer side surfaces 603, 604, 605, and 606. The case main surface 601 and the case back surface 602 face opposite sides in the thickness direction z. The case outer side surface 603 and the case outer side surface 604 face opposite sides in the first direction y. The case outer side surface 605 and the case outer side surface 606 face opposite sides in the second direction x.

The case 60 has an opening 61 that exposes portions of main surfaces 101 and 201 of the main lead 10 and the sub lead 20, respectively. The semiconductor light emitting element 30 is mounted on the main surface 101 of the main lead 10 exposed by the opening 61. The protective element 40A is mounted on the main surface 201 of the sub lead 20 exposed by the opening 61.

The main lead 10 and the sub lead 20 will be described in detail. The main lead 10 is provided on a side of one end of the semiconductor light emitting device A10 in the first direction y, and on a lower side in FIGS. 1, 2, and 3. The main lead 10 has a main body portion 11, an edge portion 12, and extension portions 131, 132, 133, and 134. The main body portion 11 has a quadrangular shape when viewed in the thickness direction z. The main body portion 11 has a main surface 111 and a back surface 112 facing opposite sides in the thickness direction z. The thickness of the main body portion 11 is, for example, about 0.2 mm.

Figure 5:
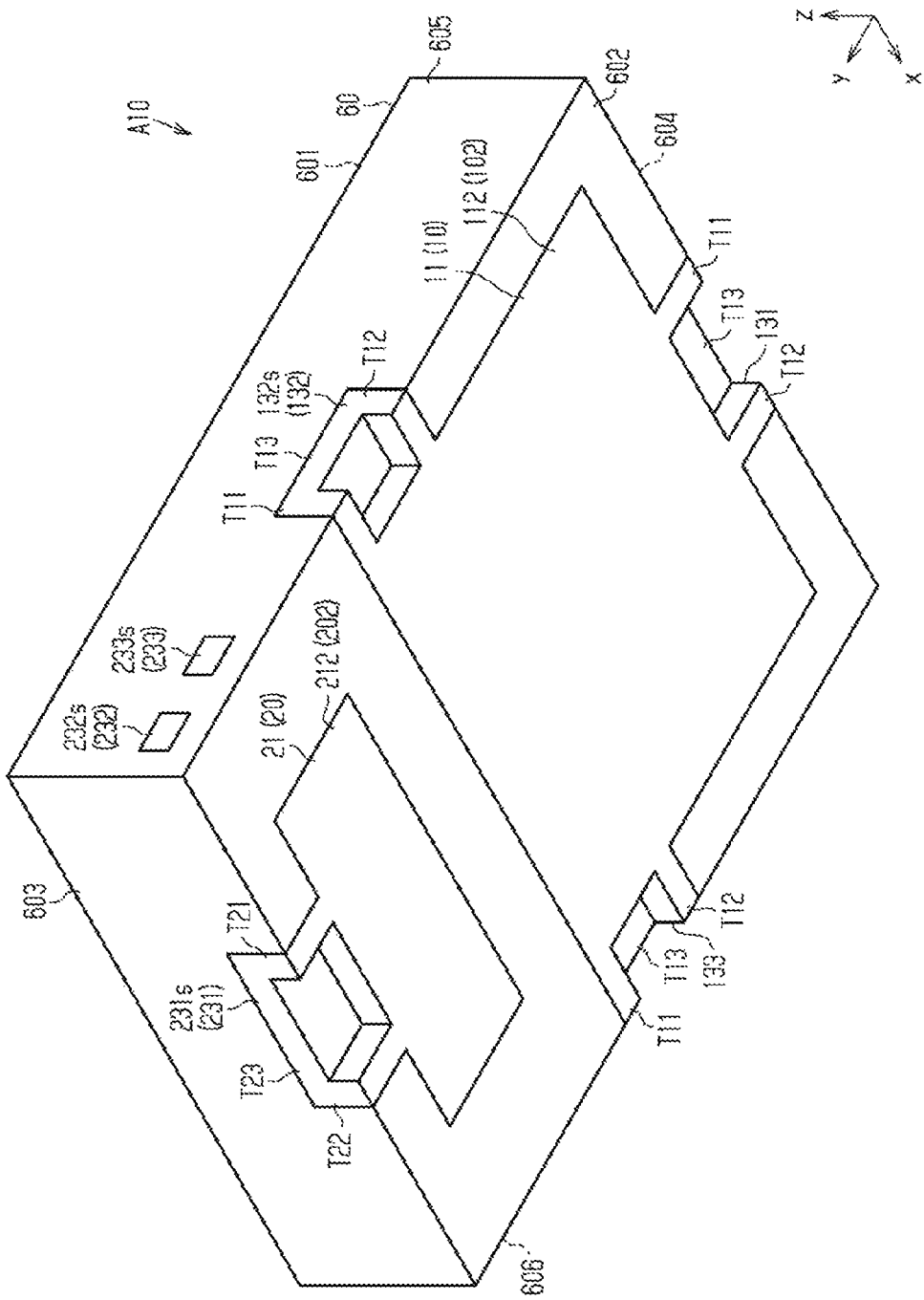
FIG. 5 is a schematic perspective view of the semiconductor light emitting device according to the first embodiment when viewed from a back surface side thereof.
Figure 6:
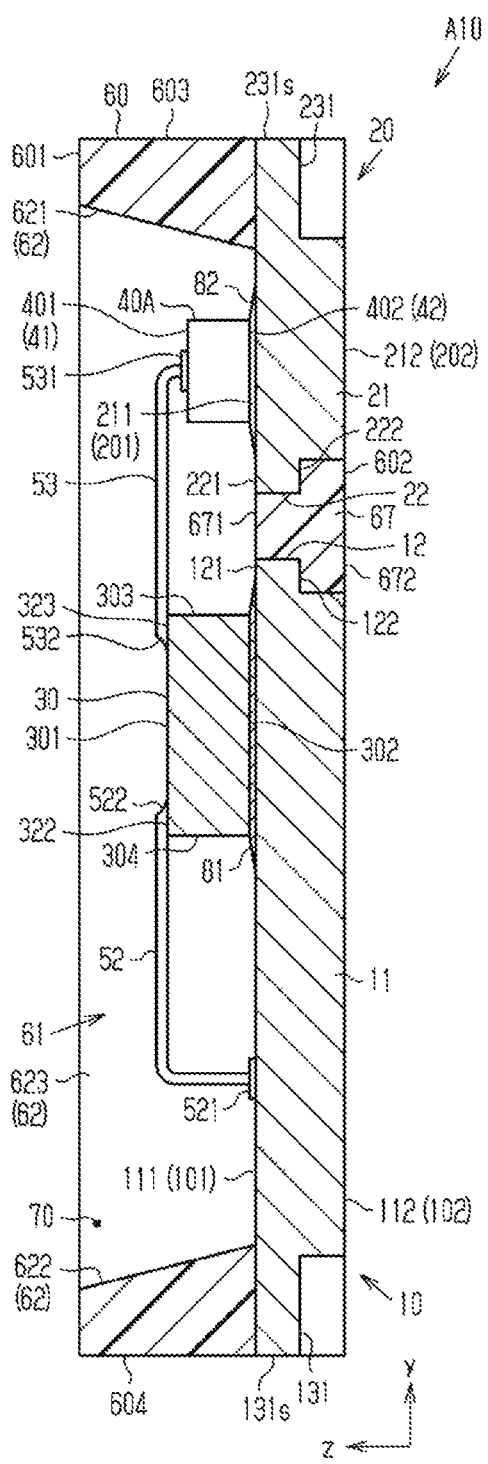
FIG. 6 is a cross-sectional view taken along line 6-6 in FIG. 1.
Figure 7:
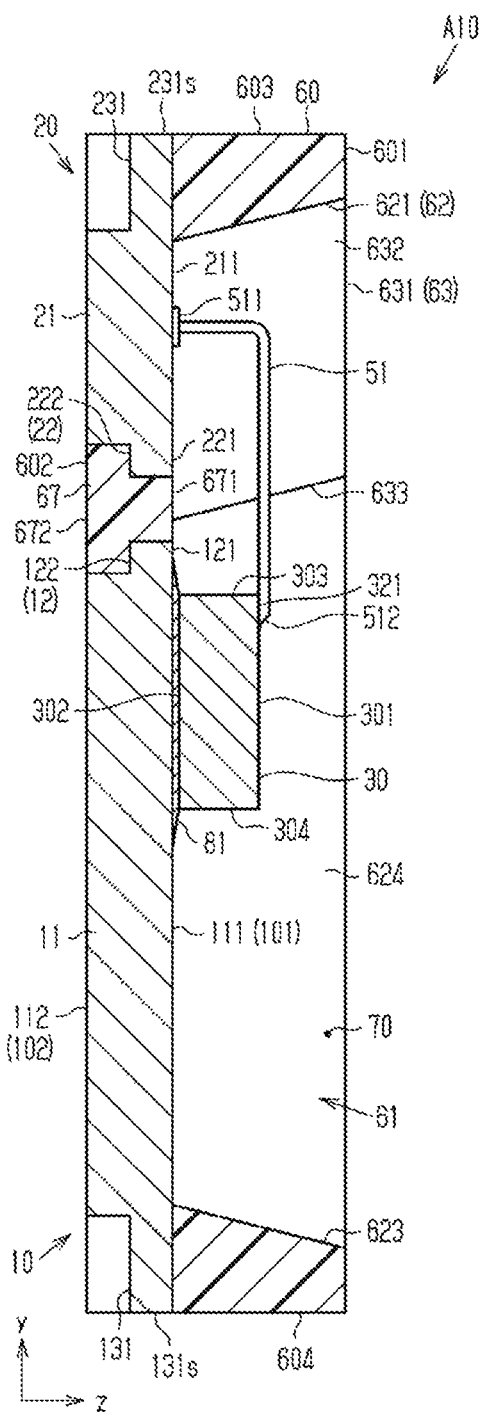
FIG. 7 is a cross-sectional view taken along line 7-7 in FIG. 1.

As shown in FIGS. 5 to 7, the back surface 112 of the main body portion 11 is exposed from the case back surface 602 of the case 60 and is flush with the case back surface 602. The back surface 112 of the main body portion 11 exposed from the case back surface 602 of the case 60 functions as an external terminal for mounting the semiconductor light emitting device A10. As shown in FIG. 2, the back surface 112 of the main body portion 11 is exposed at the center of the case 60 in the second direction x.

Figure 3:
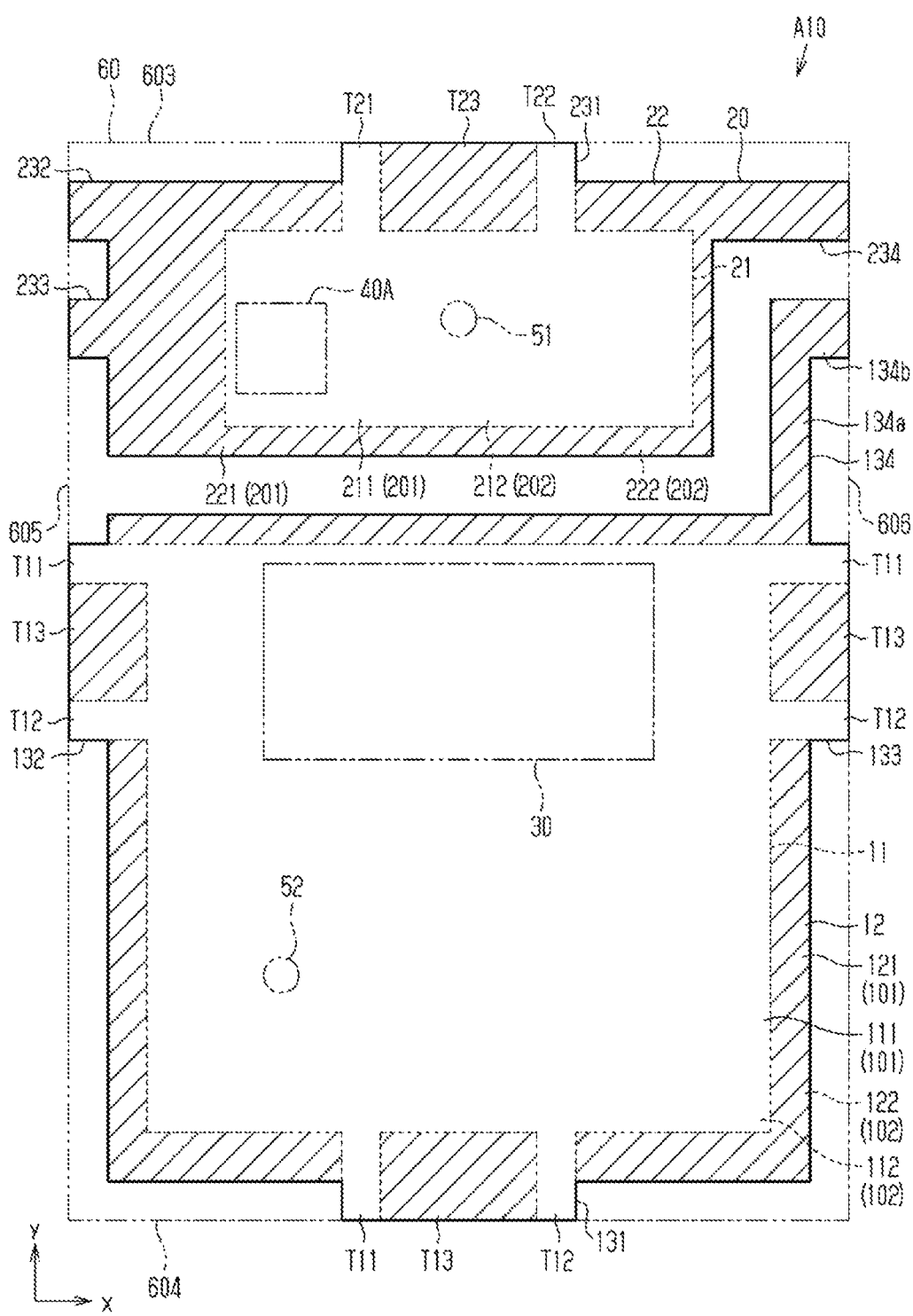
FIG. 3 is a plan view of a main lead and a sub lead according to the first embodiment.

As shown in FIGS. 2 and 3, the edge portion 12 is provided along the periphery of the main body portion 11. That is, the edge portion 12 is provided on both sides in the first direction y and both sides in the second direction x with respect to the main body portion 11. As shown in FIGS. 6 and 7, the edge portion 12 is a portion thinner than the main body portion 11. The thickness of the edge portion 12 is, for example, about 0.1 mm. A main surface 121 of the edge portion 12 is at the same position as the main surface 111 of the main body portion 11 in the thickness direction z. A back surface 122 of the edge portion 12 is located closer to the main surface 111 of the main body portion 11 than the back surface 112 of the main body portion 11. That is, the edge portion 12 is not exposed from the case back surface 602 of the case 60.

As shown in FIGS. 2 and 3, the extension portions 131, 132, and 133 extend from the main body portion 11 to the outside of the edge portion 12. The extension portion 134 extends outward from the edge portion 12. The extension portion 131 is arranged in the center of the main body portion 11 in the second direction x. The extension portion 131 extends along the first direction y from an end portion of the main body portion 11 opposite to the sub lead 20. The extension portions 132 and 133 are arranged at both end portions of the main body portion 11 and one end portion of the sub lead 20 in the second direction x. The extension portions 132 and 133 are arranged at positions overlapping with each other in the second direction x. The extension portions 132 and 133 extend in the opposite directions along the second direction x.

Each of the extension portions 131, 132, and 133 has two thick portions T11 and T12 and a thin portion T13 between the thick portions T11 and T12. In the extension portions 131 and 132, the thick portions T11 and T12 are arranged along the first direction y. In the extension portion 133, the thick portions T11 and T12 are arranged along the second direction x. For example, the thickness of the thick portions T11 and T12 is equal to the thickness of the main body portion 11, and the thickness of the thin portion T13 is equal to the thickness of the edge portion 12. The thicknesses of the thick portions T11 and T12 and the thin portion T13 may be changed as appropriate.

Figure 4:
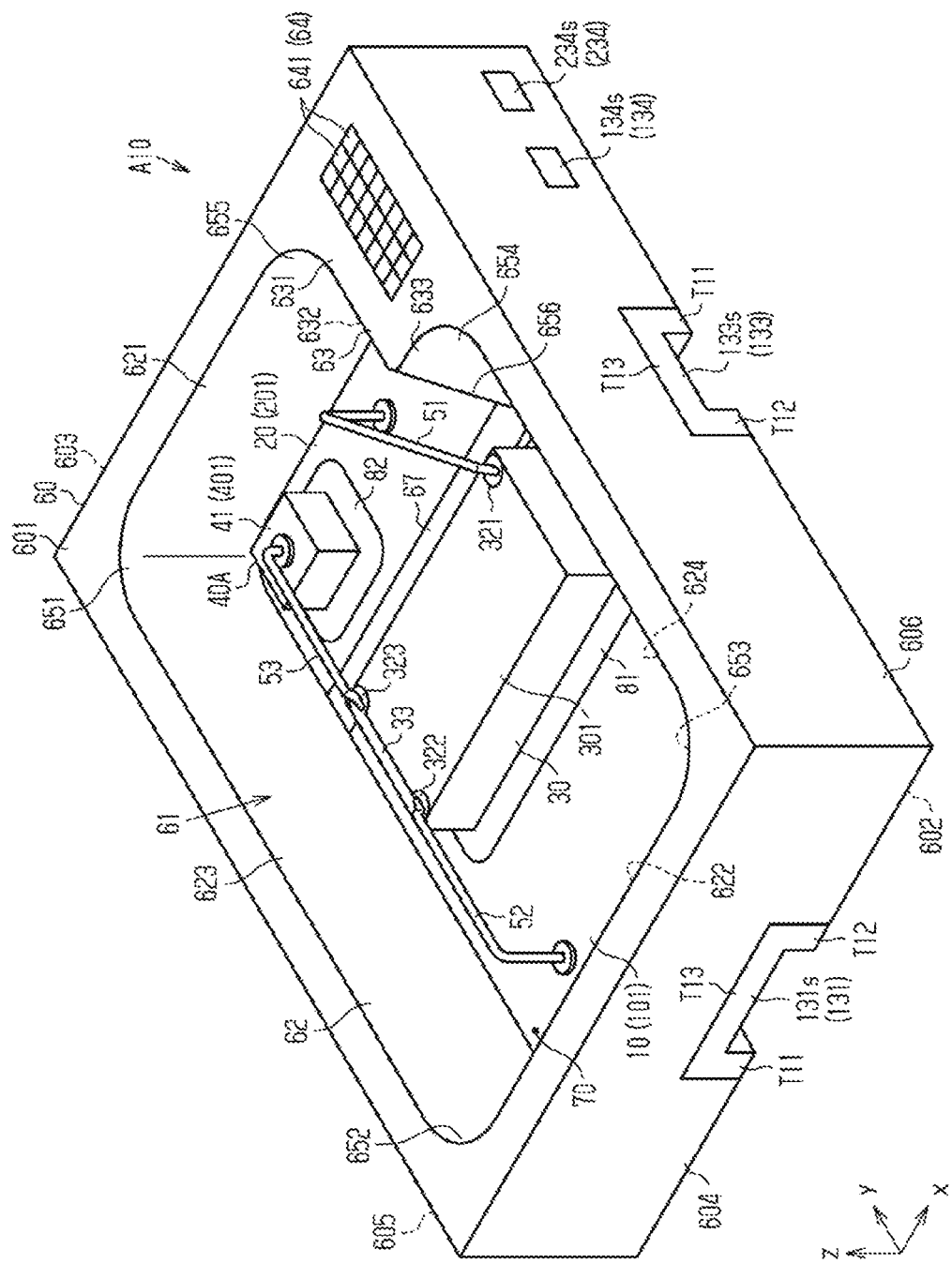
FIG. 4 is a schematic perspective view of the semiconductor light emitting device according to the first embodiment when viewed from a top surface side thereof.

As shown in FIG. 4, an end surface 131s of the extension portion 131 is exposed from the case outer side surface 604 of the case 60. As shown in FIG. 5, an end surface 132s of the extension portion 132 is exposed from the case outer side surface 605 of the case 60. As shown in FIG. 4, an end surface 133s of the extension portion 133 is exposed from the case outer side surface 606 of the case 60. As shown in FIG. 5, the thick portions T11 and T12 of the extension portions 131, 132, and 133 are exposed from the case back surface 602 of the case 60. The base material of the main lead 10 is exposed on each of the end surfaces 131s, 132s, and 133s. A plating layer may be formed on the end surfaces 131s, 132s, and 133s of the extension portions 131, 132, and 133, respectively.

As shown in FIG. 3, the extension portion 134 extends from the edge portion 12 on a side of the extension portion 133. The extension portion 134 includes a first extension portion 134a extending from the edge portion 12 along the first direction y, and a second extension portion 134b extending from the tip of the first extension portion 134a toward the case outer side surface 606 of the case 60 along the second direction x. The tip end surface of the second extension portion 134b is an end surface 134s of the extension portion 134, and the end surface 134s is exposed from the case outer side surface 606. The thickness of the extension portion 134 is equal to the thickness of the edge portion 12. The thickness of the extension portion 134 may be changed as appropriate. The base material of the main lead 10 is exposed on the end surface 134s. A plating layer may be formed on the end surface 134s of the extension portion 134.

As shown in FIGS. 1, 2, and 3, the sub lead 20 has a main body portion 21, an edge portion 22, and extension portions 231, 232, 233, and 234. The main body portion 21 has a rectangular plate shape that is lengthwise in the second direction x when viewed from the thickness direction z. The main body portion 21 has a main surface 211 and a back surface 212. The main surface 211 and the back surface 212 face opposite sides in the thickness direction z. As shown in FIGS. 6 and 7, the main surface 211 faces the same direction as the main surface 111 of the main body portion 11 of the main lead 10 which is the main surface of the main lead 10. The main surface 211 of the main body portion 21 is located at the same position as the main surface 111 of the main body portion 11 of the main lead 10 in the thickness direction z. That is, the main surface 211 of the main body portion 21 of the sub lead 20 and the main surface 111 of the main body portion 11 of the main lead 10 are located on the same plane.

The thickness of the main body portion 21 of the sub lead 20 is equal to the thickness of the main body portion 11 of the main lead 10. Therefore, as shown in FIGS. 5 to 7, the back surface 212 of the main body portion 21 of the sub lead 20 is flush with the case back surface 602 of the case 60 and is exposed from the case back surface 602. The back surface 212 of the main body portion 21 functions as an external terminal for mounting the semiconductor light emitting device A10. As shown in FIG. 2, the back surface 212 of the main body portion 21 is exposed at the center of the case 60 in the second direction x.

The edge portion 22 is provided along the periphery of the main body portion 21. That is, the edge portion 22 is provided on both sides in the first direction y and both sides in the second direction x with respect to the main body portion 21. The edge portion 22 is a portion thinner than the main body portion 21. The thickness of the edge portion 22 is, for example, about 0.1 mm. A main surface 221 of the edge portion 22 is at the same position as the main surface 211 of the main body portion 21 in the thickness direction z. A back surface 222 of the edge portion 22 is located closer to the main surface 211 of the main body portion 21 than the back surface 212 of the main body portion 21. That is, the edge portion 22 is not exposed from the case back surface 602 of the case 60.

The extension portion 231 extends along the first direction y from an end portion in the opposite side to the main lead 10. The extension portion 231 is arranged at a position overlapping the extension portion 131 of the main lead 10 when viewed from the first direction y. The extension portion 231 has two thick portions T21 and T22 and a thin portion T23 between the thick portions T21 and T22. In the extension portion 231, the thick portions T21 and T22 are arranged along the second direction x. In the first embodiment, the thick portions T21 and T22 have the same thickness as the main body portion 21, and the thin portion T23 has the same thickness as the edge portion 22. The thicknesses of the thick portions T21 and T22 and the thin portion T23 may be changed as appropriate. As shown in FIG. 5, an end surface 231s of the extension portion 231 is flush with the case outer side surface 603 of the case 60 and is exposed from the case outer side surface 603. The base material of the sub lead 20 is exposed on the end surface 231s. A plating layer may be formed on the end surface 231s of the extension portion 231.

The extension portions 232 and 234 are provided at the end portion of the edge portion 22 in the opposite side to the main lead 10. The extension portions 232 and 234 extend opposite sides in the second direction x. The extension portions 232 and 234 are arranged at positions overlapping with each other when viewed from the second direction x. The extension portion 233 is arranged on a side of the extension portion 232 and in a position closer to the main lead 10 than the extension portion 232. The extension portion 233 extends in the same direction as the extension portion 232. The extension portion 233 is arranged at a position overlapping the second extension portion 134b of the extension portion 134 of the main lead 10 when viewed from the second direction x.

As shown in FIG. 5, end surfaces 232s and 233s of the extension portions 232 and 233 are flush with the case outer side surface 606 of the case 60 and are exposed from the case outer side surface 606. The base material of the sub lead 20 is exposed on each of the end surfaces 232s and 233s. A plating layer may be formed on the end surfaces 232s and 233s of the extension portions 232 and 233.

As shown in FIG. 4, an end surface 234s of the extension portion 234 is flush with the case outer side surface 606 of the case 60 and is exposed from the case outer side surface 606. The base material of the sub lead 20 is exposed on the end surface 234s. A plating layer may be formed on the end surface 234s of the extension portion 234.

The main lead 10 and the sub lead 20 may be formed by etching or pressing a base material forming the main lead 10 and the sub lead 20. The edge portion 12 of the main lead 10 and the edge portion 22 of the sub lead 20 may be formed by half-etching or pressing the base material. Similarly to the edge portion, the extension portions 131 to 134 of the main lead 10 and the extension portions 231 to 233 of the sub lead 20 may be formed by half-etching or pressing the base material.

As shown in FIGS. 3, 6, and 7, in the main lead 10, the main surface 111 of the main body portion 11, the main surface 121 of the edge portion 12, and the main surfaces of the extension portions 131 to 134 are flush with one another and form the main surface 101 of the main lead 10. As shown in FIG. 5, in the main lead 10, the back surface 112 of the main body portion 11 and the back surfaces of the extension portions 131 to 133 (the back surfaces of the thick portions T11 and T12 of each extension portion) are flush with one another and form a back surface 102 of the main lead 10.

In the sub lead 20, the main surface 211 of the main body portion 21, the main surface 221 of the edge portion 22, and the main surfaces of the extension portions 231 to 233 are flush with one another and form the main surface 201 of the sub lead 20. The back surface 212 of the main body portion 21 and the back surface of the extension portion 233 (the back surfaces of the thick portions T21 and T22) are flush with each other and form a back surface 202 of the sub lead 20.

As shown in FIG. 2, the back surface 112 of the main body portion 11 of the main lead 10 is exposed at the center of the case 60 in the second direction x. The back surface 212 of the main body portion 21 of the sub lead 20 is exposed at the center of the case 60 in the second direction x. The extension portions 132 and 133 of the main lead 10 extend in the opposite directions along the second direction x from the end portion of the main body portion 11 on the side of the sub lead 20 in the first direction y. The extension portion 131 of the main lead 10 is arranged at the center of the case 60 in the second direction x and extends along the first direction y. The extension portion 231 of the sub lead 20 is arranged at the center of the case 60 in the second direction x and extends along the first direction y.

The back surface 102 of the main lead 10, which is composed of the back surface 112 of the main body portion 11 and the back surfaces of the extension portions 131, 132, and 133, is line-symmetric with respect to the case 60 about a central axis L1 extending in the first direction y. The back surface 202 of the sub lead 20, which is composed of the back surface 212 of the main body portion 21 and the back surface of the extension portion 231, is line-symmetric with respect to the case 60 about the central axis L1 extending in the first direction y. The back surface 102 of the main lead 10 and the back surface 202 of the sub lead 20 are arranged along the first direction y.

As shown in FIGS. 1, 3, 6, and 7, the semiconductor light emitting element 30 is mounted on the main surface 101 of the main lead 10. The semiconductor light emitting element 30 is arranged at the center of the semiconductor light emitting device A10 in the first direction y and the second direction x.

The semiconductor light emitting element 30 has a substantially rectangular parallelepiped shape. The semiconductor light emitting element 30 has an element main surface 301, an element back surface 302, and element side surfaces 303, 304, 305, and 306. The element main surface 301 and the element back surface 302 face opposite sides in the thickness direction z. The element main surface 301 is a surface facing the same direction as the main surface 111 of the main body portion 11, and the element back surface 302 is a surface opposed to the main surface 111 of the main body portion 11. The element side surfaces 303 and 304 are side surfaces along the long side of the element main surface 301 and face opposite sides. The element side surfaces 305 and 306 are side surfaces along the short side of the element main surface 301 and face opposite sides. In the present embodiment, the semiconductor light emitting element 30 is arranged with the element side surfaces 303 and 304 facing in the first direction y. That is, the semiconductor light emitting element 30 is arranged such that the long side thereof is orthogonal to the first direction y in which the main lead 10 and the sub lead 20 are arranged. In the present embodiment, the semiconductor light emitting device A10 that is lengthwise in the first direction y is mounted with the semiconductor light emitting element 30 that is lengthwise in the second direction x.

The element main surface 301 has a first side 311, a second side 312, a third side 313, and a fourth side 314. The first side 311 and the second side 312 are sides that extend along the second direction x and are separated from each other in the first direction y. The third side 313 and the fourth side 314 are sides that extend along the first direction y and are separated from each other in the second direction x.

The semiconductor light emitting element 30 is, for example, a light emitting diode (LED) element. The semiconductor light emitting element 30 of the first embodiment is a light emitting element in which a plurality of semiconductor layers such as gallium nitride are stacked on an insulating substrate such as sapphire. When a current is applied to the semiconductor light emitting device A10, the semiconductor light emitting element 30 emits light. The semiconductor light emitting element 30 emits light having a wavelength corresponding to a substance forming the stacked semiconductor layers.

As shown in FIG. 1, the semiconductor light emitting element 30 has electrodes 321, 322, and 323 and a connecting wiring 33 on the element main surface 301. Each of the electrodes 321 to 323 has a circular shape when viewed in the thickness direction z. The width of the connecting wiring 33 is equal to, for example, the radius of each of the electrodes 321 to 323.

The electrodes 321 and 322 are electrodes connected to the internal semiconductor layer. The electrode 321 is, for example, a cathode electrode, and the electrode 322 is, for example, an anode electrode. The electrodes 321 and 322 may be provided at positions along two sides, which are apart from each other in at least one of the first direction y and the second direction x, among the first side 311 to the fourth side 314 forming the element main surface 301 of the semiconductor light emitting element 30. In the present embodiment, the electrode 321 is provided at a position along the first side 311 of the element main surface 301, and the electrode 322 is provided at a position along the second side 312 of the element main surface 301. Further, the electrode 321 is provided at a position along the fourth side 314 of the element main surface 301, and the electrode 322 is provided at a position along the third side 313 of the element main surface 301. That is, the electrode 321 is arranged at the corner between the first side 311 and the fourth side 314, and the electrode 322 is arranged at the corner between the second side 312 and the third side 313. In other words, the electrodes 321 and 322 are arranged diagonally on the rectangular element main surface 301.

The semiconductor light emitting element 30 is arranged with the first side 311 where the electrode 321 is provided and the element side surface 303 facing the sub lead 20. Further, the electrode 321 is connected to the sub lead 20 by the wire 51. The electrode 322 is located on the opposite side of the sub lead 20 and is connected to the main lead 10 by the wire 52. The main lead 10 functions as an anode terminal of the semiconductor light emitting device A10. Specifically, the back surface 112 of the main body portion 11 of the main lead 10 is exposed from the case back surface 602 of the case 60 and functions as an anode terminal among external connecting terminals. The sub lead 20 functions as a cathode terminal of the semiconductor light emitting device A10. Specifically, the back surface 212 of the main body portion 21 of the sub lead 20 is exposed from the case back surface 602 of the case 60 and functions as a cathode terminal among the external connecting terminals.

The electrode 323 is arranged at an end portion (left end) opposite to the electrode 321 in the first side 311 provided with the electrode 321. Accordingly, the electrodes 322 and 323 are arranged at both end portions of the third side 313 of the element main surface 301. The connecting wiring 33 extends along the third side 313 of the element main surface 301. The connecting wiring 33 connects the electrode 322 and the electrode 323. For example, the electrode 323 is not directly connected to the internal semiconductor layer, but is electrically connected to the internal semiconductor layer via the connecting wiring 33 and the electrode 322. Accordingly, the electrode 322 (a second electrode), the electrode 323 (a third electrode), and the connecting wiring 33 form a main surface connecting portion provided on the element main surface 301 of the semiconductor light emitting element 30. The electrode 323 may be directly connected to the internal semiconductor layer. In the present embodiment, the electrodes 322 and 323 and the connecting wiring 33 form the main surface connecting portion.

As shown in FIGS. 6 and 7, the element back surface 302 of the semiconductor light emitting element 30 is connected to the main surface 101 of the main lead 10 by a bonding material 81. The bonding material 81 is made of, for example, solder or a synthetic resin (a so-called Ag paste) having an epoxy resin containing Ag as main material thereof. The element back surface 302 of the semiconductor light emitting element 30 is connected to the main lead 10 via the conductive bonding material 81.

As shown in FIGS. 1 and 6, the protective element 40A is mounted on the main body portion 21 of the sub lead 20. That is, the main body portion 21 of the sub lead 20 is a die bonding portion on which the protective element 40A is mounted. The protective element 40A is, for example, a Zener diode. As the protective element 40A, various protective elements mounted on a general semiconductor light emitting device may be used.

The protective element 40A has a substantially rectangular parallelepiped shape. The protective element 40A has a main surface 401 and a back surface 402. The main surface 401 and the back surface 402 face opposite sides in the thickness direction z. A main surface electrode 41 and a back surface electrode 42 are provided on the main surface 401 and the back surface 402, respectively. The main surface electrode 41 is, for example, an anode electrode, and the back surface electrode 42 is, for example, a cathode electrode. As shown in FIG. 6, the back surface 402 of the protective element 40A is connected to the main body portion 21 of the sub lead 20 by a bonding material 82. The bonding material 82 is composed of, for example, solder or Ag paste and has conductivity. The back surface electrode 42 of the protective element 40A is connected to the sub lead 20 via the conductive bonding material 82.

As shown in FIGS. 1 and 7, the wire 51 connects the sub lead 20 and the electrode 321 of the semiconductor light emitting element 30. In the present embodiment, the electrode 321 functions as a first electrode. The wire 51 is made of, for example, Au. As an example, as shown in FIG. 7, a first end 511 of the wire 51 is connected to the sub lead 20, and a second end 512 of the wire 51 is connected to the electrode 321 of the semiconductor light emitting element 30. In a wire bonding process, the first end 511 of the wire 51 serves as a first bonding portion and the second end 512 serves as a second bonding portion. Thus, by connecting the first end 511 of the wire 51 to the sub lead 20, it is possible to prevent the loop of the wire 51 from becoming too high.

As shown in FIGS. 1 and 6, the wire 52 connects the main lead 10 and the electrode 322 of the semiconductor light emitting element 30. In the present embodiment, the electrode 322 functions as the third electrode. The wire 52 is made of, for example, Au. As an example, as shown in FIG. 6, a first end 521 of the wire 52 is connected to the main lead 10 and a second end 522 of the wire 52 is connected to the electrode 322 of the semiconductor light emitting element 30. Thus, by connecting the first end 521 of the wire 52 to the main lead 10, it is possible to prevent the loop of the wire 52 from becoming too high.

As shown in FIGS. 1 and 6, the wire 53 connects the main surface electrode 41 of the main surface 401 of the protective element 40A and the electrode 323 of the semiconductor light emitting element 30. In the present embodiment, the electrode 323 functions as the second electrode. The wire 53 is made of, for example, Au. As an example, as shown in FIG. 6, a first end 531 of the wire 53 is connected to the main surface electrode 41 of the protective element 40A, and a second end 532 of the wire 53 is connected to the electrode 323 of the semiconductor light emitting element 30. The height of the protective element 40A is lower than the height of the semiconductor light emitting element 30. Thus, by connecting the first end 531 of the wire 53 to the protective element 40A, it is possible to prevent the loop of the wire 53 from becoming too high.

The case 60 is made of white synthetic resin. A thermosetting resin is used as the material of the case 60. An example of the thermosetting resin may include an unsaturated polyester resin. As the material of the case 60, epoxy resin, silicone resin, acrylate resin, polyurethane, or the like may be used. The case 60 is made white by adding, for example, titanium oxide to the thermosetting resin as a material thereof. In addition, silica, alumina, and the like may be used as an additive.

The case 60 has the opening 61. The opening 61 is formed in a substantially rectangular shape when viewed in the thickness direction z. The opening 61 is formed from the case main surface 601 to the main surfaces 101 and 201 of the main lead 10 and the sub lead 20, respectively, in the thickness direction z. The opening 61 is formed so as to expose a portion of each of the main surface 101 of the main lead 10 and the main surface 201 of the sub lead 20.

The case 60 has an inner side surface 62 that defines the opening 61. The inner side surface 62 extends from the case main surface 601 of the case 60 to the main surface 101 of the main lead 10 and the main surface 201 of the sub lead 20 in the thickness direction z.

As shown in FIGS. 6 and 7, the inner side surface 62 is inclined as it becomes distant from the center of the case 60 in a direction orthogonal to the thickness direction z, that is, distant from the semiconductor light emitting element 30 mounted on the main lead 10, from the side of the main surface 101 of the main lead 10 toward the case main surface 601 of the case 60. The inner side surface 62 functions as a reflecting surface that reflects light emitted from the semiconductor light emitting element 30.

As shown in FIG. 1, the inner side surface 62 includes a first inner side surface 621, a second inner side surface 622, a third inner side surface 623, and a fourth inner side surface 624. As shown in FIG. 1, the first inner side surface 621 and the second inner side surface 622 are located on both sides of the semiconductor light emitting element 30 in the first direction y. The first inner side surface 621 is on the side of the sub lead 20 and faces the side of the semiconductor light emitting device A10. The second inner side surface 622 is on the side of the main lead 10 and faces the side of the semiconductor light emitting device A10. The first inner side surface 621 and the second inner side surface 622 face opposite sides in the first direction y. The third inner side surface 623 and the fourth inner side surface 624 are located on both sides of the semiconductor light emitting element 30 in the second direction x. Each of the third inner side surface 623 and the fourth inner side surface 624 faces the side of the semiconductor light emitting element 30. That is, the third inner side surface 623 and the fourth inner side surface 624 face opposite sides in the second direction x.

The case 60 has a recognition part 63 that is convex inside the opening 61 between the first inner side surface 621 and the fourth inner side surface 624. The recognition part 63 is formed in a rectangular shape that is lengthwise in the first direction y when viewed in the thickness direction z. The recognition part 63 extends from the first inner side surface 621 of the case 60 to an end portion of the sub lead 20 on the side of the main lead 10 along the first direction y. In the present embodiment, the sub lead 20 serves as a cathode terminal of the semiconductor light emitting device A10. Accordingly, the recognition part 63 functions as a cathode mark for easily recognizing a side with the cathode terminal when the semiconductor light emitting device A10 is viewed from the side of the case main surface 601.

The recognition part 63 has an upper surface 631 and side surfaces 632 and 633. The side surface 632 of the recognition part 63 extends along the first direction y, and the side surface 633 of the recognition part 63 extends along the second direction x. The side surfaces 632 and 633 are inclined like the inner side surface 62 and function as reflecting surfaces.

A mark region 64 is set on the upper surface 631 of the recognition part 63. The mark region 64 is divided into a plurality of regions 641. A mark is formed in any one of the regions 641 of the mark region 64. The regions 641 are set in the form of a matrix. The mark is formed in one of the regions 641 at a position corresponding to the type of semiconductor light emitting device A10. The mark is a predetermined shape such as a circle formed in each region 641, or one filling the inside of the region 641. The recognition part 63 functions as an identification region for writing identification information of the semiconductor light emitting element 30.

The case 60 also has connecting surfaces 651, 652, 653, 654, 655, and 656. The connecting surfaces 651 to 655 have a quarter annular shape and are formed so as to be concave with respect to the inside of the opening 61, when viewed in the thickness direction z. The connecting surface 656 has a quarter annular shape and is formed so as to be convex inside the opening 61, when viewed in the thickness direction z. The connecting surface 651 connects the first inner side surface 621 and the third inner side surface 623. The connecting surface 652 connects the third inner side surface 623 and the second inner side surface 622. The connecting surface 653 connects the second inner side surface 622 and the fourth inner side surface 624. The connecting surface 654 connects the fourth inner side surface 624 and the side surface 633 of the recognition part 63. The connecting surface 655 connects the side surface 632 of the recognition part 63 and the first inner side surface 621. The connecting surface 656 connects the side surface 633 and the side surface 632 of the recognition part 63.

As shown in FIG. 2, the case 60 has a partition 67 disposed between the main lead 10 and the sub lead 20. The partition 67 includes a first partition portion 67a disposed between the main lead 10 and the sub lead 20 in the first direction y, and a second partition portion 67b disposed between the extension portion 134 of the main lead 10 and the sub lead 20 in the second direction x.

The first partition portion 67a is disposed between the main lead 10 and the sub lead 20 in the first direction y. The first partition portion 67a is formed so as to cover the back surface 122 of the edge portion 12 of the main lead 10 on the side of the sub lead 20 and the back surface 222 of the edge portion 22 of the sub lead 20 on the side of the main lead 10.

The second partition portion 67b is disposed between the extension portion 134 of the main lead 10 and the edge portion 22 of the sub lead 20. The second partition portion 67b is formed so as to cover the back surface 122 of the edge portion 12 on the side of the sub lead 20 and the back surface 222 of the edge portion 22 of the sub lead 20.

As shown in FIGS. 6 and 7, the partition 67 has a main surface 671 and a back surface 672 facing opposite sides. The main surface 671 of the partition 67 is flush with the main surface 101 of the main lead 10 and the main surface 201 of the sub lead 20. The back surface 672 of the partition 67 is flush with the back surface 102 of the main lead 10 and the back surface 202 of the sub lead 20.

The sealing member 70 is filled in the opening 61 of the case 60. As shown in FIGS. 1 and 4, the sealing member 70 covers surfaces of members arranged in the opening 61. FIGS. 1 and 4 show the members inside the opening 61 through the sealing member 70 for ease of understanding. In the present embodiment, the sealing member 70 covers the main lead 10, the sub lead 20, the semiconductor light emitting element 30 mounted on the main lead 10, the protective element 40A mounted on the sub lead 20, and the wires 51 to 53, which are exposed through the opening 61. The sealing member 70 protects the semiconductor light emitting element 30, the protective element 40A, and the wires 51 to 53.

The sealing member 70 is a translucent member that transmits light emitted from the semiconductor light emitting element 30. The material of the sealing member 70 is, for example, synthetic resin. Examples of the material of the sealing member 70 may include transparent or semi-transparent resin materials such as silicone resin, epoxy resin, acrylic resin, polyvinyl resin, and the like. The sealing member 70 may include a diffusing material that diffuses light from the semiconductor light emitting element 30, a phosphor that is excited by light from the semiconductor light emitting element 30 to emit light having a wavelength different from the wavelength of the light from the semiconductor light emitting element 30, and the like.

(Operation)

Next, the operation of the semiconductor light emitting device A10 of the first embodiment will be described. First, a comparative example will be described.

The protective element 40A mounted on the semiconductor light emitting device A10 is connected in parallel with the semiconductor light emitting element 30, that is, between the main lead 10 and the sub lead 20. As in the present embodiment, when the protective element 40A is mounted on the sub lead 20, the protective element 40A is connected to the main lead 10 by a wire. If the wire is to be connected to the main lead 10 on the side of the sub lead 20 with respect to the semiconductor light emitting element 30, the semiconductor light emitting element 30 has to be moved to the side opposite to the sub lead 20, and accordingly the semiconductor light emitting element 30 cannot be arranged at the center of the semiconductor light emitting device. Further, if the semiconductor light emitting element 30 is arranged at the center of the semiconductor light emitting device, the size of the semiconductor light emitting device becomes large. If an attempt is made to connect the wire to the main lead 10 on the side opposite to the sub lead 20 with respect to the semiconductor light emitting element 30, the wire will straddle the semiconductor light emitting element 30. When the protective element 40A is to be mounted on the main lead 10, the protective element 40A is arranged on the side opposite to the sub lead 20 with respect to the semiconductor light emitting element 30, which requires a wire straddling the semiconductor light emitting element 30. The wire straddling the semiconductor light emitting element 30 as described above interferes with the light emitted from the semiconductor light emitting element 30. Further, for example, when the sealing member 70 is filled, the wire may move to come into contact with the semiconductor light emitting element 30, or the wire may be cut. As described above, there are restrictions on the arrangement position of the protective element 40A and the connection of the wire connecting the protective element 40A.

Further, it may be considered that the sub lead 20 is arranged at a position displaced from the center of the semiconductor light emitting device in the second direction x, and the main lead 10 is stretched to a position generated by the displacement of the sub lead 20 to secure the wire bonding portion or the die bonding portion of the protective element 40A. However, if an attempt is made to secure the wire bonding portion or the die bonding portion in this manner, the cathode terminal by the sub lead 20 is biased in the second direction x. Thus, when the semiconductor light emitting device is mounted on a circuit board, there is a risk that it will be mounted at an angle.

In contrast, in the semiconductor light emitting device A10 of the present embodiment, the protective element 40A and the electrode 323 of the semiconductor light emitting element 30 are connected by the wire 53. The electrode 323 is connected to the electrode 322 via the connecting wiring 33, and the electrode 322 is connected to the main lead 10 by the wire 52. The wires 52 and 53 and the connecting wiring 33 form a connecting member WO1 that connects the protective element 40A and the main lead 10 via the semiconductor light emitting element 30. As a result, the protective element 40A is connected between the sub lead 20 and the main lead 10. Accordingly, even when the protective element 40A is mounted on the sub lead 20, the protective element 40A can be easily connected to the main lead 10. That is, there are fewer restrictions on the arrangement position of the protective element 40A and the connection positions of the wires 51 to 53, and the degree of freedom in designing the semiconductor light emitting device A10 can be improved.

Further, in the semiconductor light emitting device A10 of the present embodiment, the back surface 102 of the main lead 10 and the back surface 202 of the sub lead 20 exposed from the case back surface 602 of the case 60 are line-symmetric with respect to the case back surface 602 of the case 60 about the central axis L1 extending in the first direction y. The back surface 102 of the main lead 10 and the back surface 202 of the sub lead 20 are external connecting terminals used for mounting the semiconductor light emitting device. Accordingly, the design (shape) of a connecting pad on a circuit board on which the semiconductor light emitting device A10 is mounted is facilitated. Further, the exposed portions of the main lead 10 and the sub lead 20 are not biased in the second direction x with respect to the outer shape of the case 60 of the semiconductor light emitting device A10, and the mountability is improved.

The semiconductor light emitting element 30 has the electrode 321 connected to the sub lead 20, and the electrode 322 connected to the main lead 10. The electrode 321 and the electrode 322 are arranged diagonally to the semiconductor light emitting element 30 formed in a rectangular shape when viewed in the thickness direction z. Accordingly, a current supplied to the semiconductor light emitting element 30 is easily diffused throughout the semiconductor light emitting element 30, so that light can be emitted from the entire surface.

Figure 8:
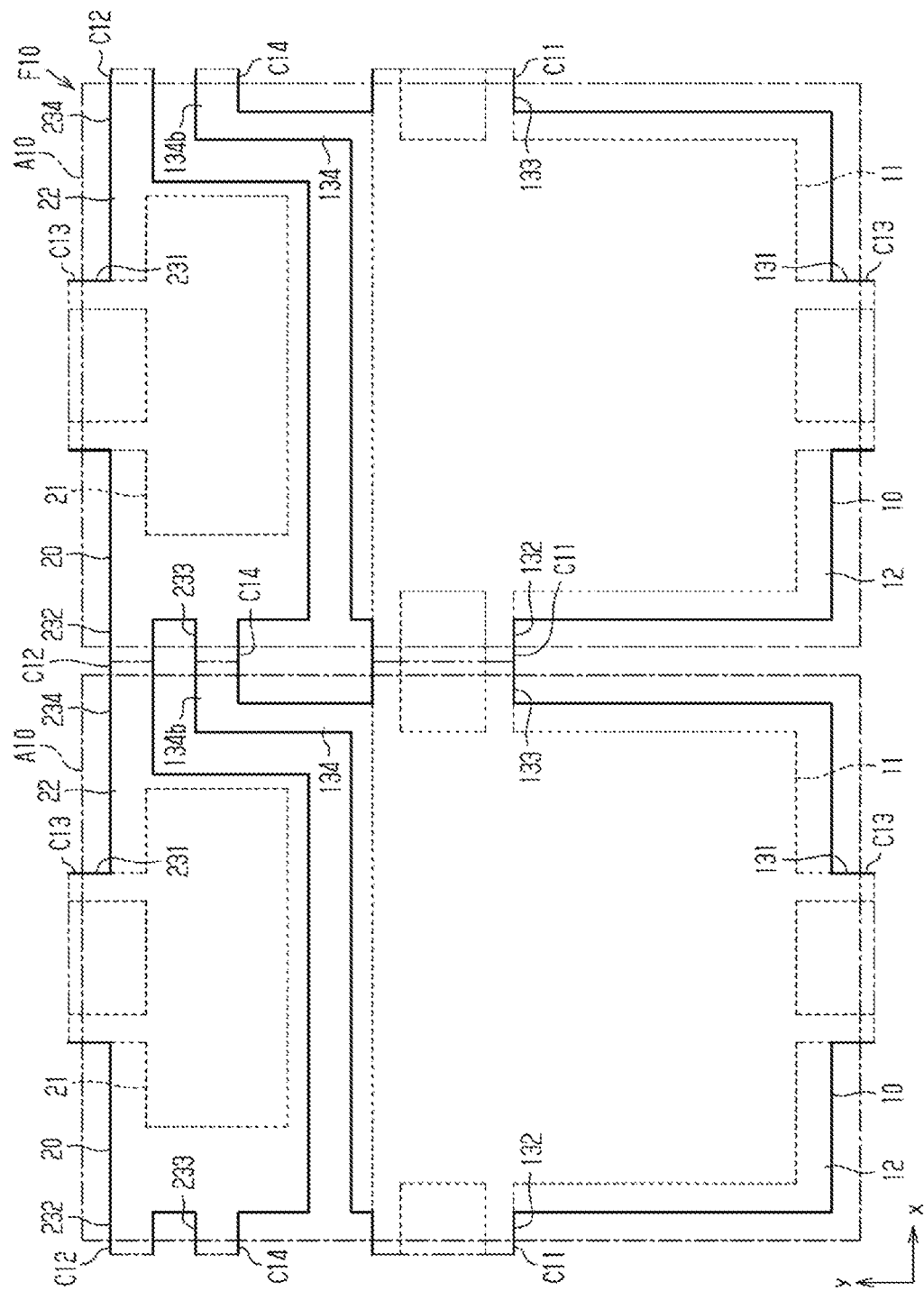
FIG. 8 is a plan view showing a portion of a lead frame.

Further, the semiconductor light emitting device A10 of the present embodiment can suppress bending and the like in the manufacturing process. As shown in FIG. 8, the semiconductor light emitting device A10 is formed using a lead frame F10 including the main leads 10 and the sub leads 20.

FIG. 8 shows a portion of the lead frame F10 for manufacturing the semiconductor light emitting device A10 of the first embodiment. In addition, FIG. 8 shows a portion for manufacturing two semiconductor light emitting devices A10 (each having an outer shape shown by a one-dot chain line in FIG. 8), which are adjacent to each other in the second direction x.

Each semiconductor light emitting device A10 has the main lead 10 and the sub lead 20. The lead frame F10 includes a base material forming the main lead 10 and the sub lead 20. The lead frame F10 is produced, for example, by etching or pressing a metal plate made of Cu, Ni, or an alloy containing at least one thereof. Members forming the lead frame F10 will be described by using the names and reference numerals of the members that will eventually become the semiconductor light emitting device A10.

As shown in FIG. 8, the main lead 10 and the sub lead 20 forming the semiconductor light emitting device A10 are connected to the adjacent main leads 10 and sub leads 20 by connecting portions C11, C12, C13, and C14. The connecting portions C11, C12, C13, and C14 are portions that are removed by, for example, dicing when dividing the semiconductor light emitting devices A10 into individual pieces.

In the second direction x, the main leads 10 of the semiconductor light emitting devices A10 are adjacent to each other, and the sub leads 20 of the semiconductor light emitting devices A10 are adjacent to each other. In the first direction y, the main lead 10 of each semiconductor light emitting device A10 is adjacent to the sub lead 20 of the adjacent semiconductor light emitting device A10. In the second direction x, the extension portion 133 of one main lead 10 and the extension portion 132 of the other main lead 10 adjacent to the main lead 10 are connected to each other by the connecting portion C11. That is, in the second direction x, the adjacent main leads 10 are connected to each other by the connecting portion C11.

In the second direction x, the extension portion 232 of one sub lead 20 and the extension portion 234 of the other sub lead 20 adjacent to the one sub lead 20 are connected to each other by the connecting portion C12. That is, in the second direction x, the adjacent sub leads 20 are connected to each other by the connecting portion C12. In the first direction y, the extension portion 131 of the main lead 10 and the extension portion 231 of the sub lead 20 adjacent to the main lead 10 are connected to each other by the connecting portion C13. That is, in the first direction y, the main lead 10 and sub lead 20 adjacent to each other are connected to each other by the connecting portion C13.

In the present embodiment, the main lead 10 has the extension portion 134 including the first extension portion 134a extending in the first direction y and the second extension portion 134b extending in the second direction x from the tip of the first extension portion 134a. The second extension portion 134b is located at the same position as the extension portion 233 of the sub lead 20 in the first direction y. The second extension portion 134b is connected to the extension portion 233 of the sub lead 20 by the connecting portion C14. That is, the connecting portion C14 connects the main lead 10 of one semiconductor light emitting device A10 and the sub lead 20 of the other semiconductor light emitting device A10 formed adjacent in the second direction x to the one semiconductor light emitting device A10 including the main lead 10.

Accordingly, in the present embodiment, the lead frame F10 includes a row of the main leads 10 arranged along the second direction x and connected by the connecting portions C11, and a row of the sub leads 20 arranged along the second direction x and connected by the connecting portions C12. In the lead frame F10, the row of the main leads 10 and the row of the sub leads 20 are alternately arranged in the first direction y. The row of the main leads 10 and the row of the sub leads 20 are connected to each other by the connecting portions C13 and C14. With such a configuration, bending of the lead frame F10 is suppressed, and the lead frame F10 can be easily transported. Further, since all of the main leads 10 and the sub leads 20 included in the lead frame F10 are electrically connected, a plating layer can be easily formed on the surfaces of all of the main leads 10 and the sub leads 20 by an electrolytic plating method or the like.

In FIG. 3, two-dot chain line rectangles indicate positions where the semiconductor light emitting element 30 and the protective element 40A are mounted, and two-dot chain line circles indicate locations where the wires 51 and 52 in FIG. 1 and the like are connected. The semiconductor light emitting element 30 is mounted on the main surface 111 of the main body portion 11 of the main lead 10 by the bonding member 81. The lead frame F10 (see FIG. 8) including the main lead 10 is arranged on a work table. The work table is a work table of a die bonder for mounting the semiconductor light emitting element 30 and the protective element 40A, a wire bonder for connecting the wires 51 to 53, or the like. The bonding material 81 is applied to the main surface 111 of the main body portion 11, and the semiconductor light emitting element 30 is mounted on the main body portion 11 using a suction collet or the like. The main body portion 11 has the thickness of the lead frame F10. Accordingly, the back surface 112 of the main body portion 11 is brought into contact with the upper surface of the work table of the die bonder on which the semiconductor light emitting element 30 is mounted. A pressing force applied by a die bonding process is received by the work table of the die bonder. Therefore, when the semiconductor light emitting element 30 is mounted on the main lead 10, even if the semiconductor light emitting element 30 is pressed against the main lead 10, the lead frame F10 is not bent. As a result, the semiconductor light emitting element 30 is reliably mounted on the main body portion 11 of the main lead 10. The same applies to the protective element 40A mounted on the sub lead 20, and the protective element 40A is reliably mounted on the main body portion 21 of the sub lead 20.

The first end 511 of the wire 51 shown in FIG. 1 is connected to the sub lead 20. The wire 51 is connected by using, for example, a capillary of the wire bonder. The lead frame F10 on which the semiconductor light emitting element 30 and the protective element 40A are mounted is arranged on the work table of the wire bonder. The wire 51 is pressed against the sub lead 20 and the electrode 321 (see FIG. 1) of the semiconductor light emitting element 30 by the capillary to connect the sub lead 20 and the electrode 321. Similar to the die bonding process, a pressing force applied by the capillary is received by the work table of the wire bonder. Therefore, the wire 51 is reliably connected to the sub lead 20 and the electrode 321 of the semiconductor light emitting element 30. Each of the other wires 52 and 53 (see FIG. 1) is reliably connected similarly to the wire 51.

As shown in FIGS. 6 and 7, the back surface 112 of the main body portion 11, on which the semiconductor light emitting element 30 is mounted, is exposed from the case back surface 602 of the case 60. Accordingly, the entire back surface 112 of the main body portion 11 is brought into contact with, for example, a mounting substrate on which the semiconductor light emitting device A10 is mounted. Heat of the semiconductor light emitting element 30 is transferred to the side of the case back surface 602 of the case 60 via the main body portion 11 and is dissipated to the circuit board.

As shown in FIG. 7, the back surface 212 of the main body portion 21 with the protective element 40A mounted on the main surface 211 thereof is exposed from the case back surface 602 of the case 60. Accordingly, the entire back surface 212 of the main body portion 21 is brought into contact with, for example, the circuit board on which the semiconductor light emitting device A10 is mounted. Heat of the protective element 40A is transferred to the side of the case back surface 602 of the case 60 via the main body portion 21 and is dissipated to the circuit board.

As described above, according to the first embodiment, the following effects can be achieved.

(1-1) The semiconductor light emitting device A10 includes the main lead 10, the sub lead 20, the semiconductor light emitting element 30 bonded to the main lead 10, and the protective element 40A bonded to the sub lead 20. The semiconductor light emitting element 30 is connected to the main lead 10 and the sub lead 20 by the wires 51 and 52, respectively. The protective element 40A has the main surface electrode 41 and the back surface electrode 42, and the back surface electrode 42 is connected to the sub lead 20 by the conductive bonding material 82. The main surface electrode 41 of the protective element 40A is connected to the main lead 10 by the connecting member WO1 including the wire 53, the electrodes 323 and 322 of the semiconductor light emitting element 30, the connecting wiring 33 connecting the electrodes 323 and 322, and the wire 52. Accordingly, the main surface electrode 41 of the protective element 40A bonded to the sub lead 20 can be easily connected to the main lead 10. As a result, it is possible to provide the semiconductor light emitting device A10 with fewer restrictions on the arrangement position of the protective element 40A and the connection position of the wires 51 to 53 and with a high degree of freedom in design.

(1-2) The semiconductor light emitting element 30 is connected to the sub lead 20 and the main lead 10 by the wires 51 and 52, respectively. The semiconductor light emitting element 30 has the connecting wiring 33 that connects the electrode 323 connected to the protective element 40A and the electrode 322 connected to the main lead 10. The wires 51 to 53 connected to the semiconductor light emitting element 30 extend from the electrodes 321 to 323, respectively, toward the outside of the semiconductor light emitting element 30. By connecting the protective element 40A bonded to the sub lead 20 to the electrode 323 of the semiconductor light emitting element 30 by the wire 53 as described above, the protective element 40A can be connected to the main lead 10 via the semiconductor light emitting element 30 and the wire 52.

(1-3) The back surface 102 of the main lead 10 and the back surface 202 of the sub lead 20 exposed from the case back surface 602 of the case 60 are line-symmetric with respect to the case back surface 602 of the case 60 about the central axis L1 extending in the first direction y. The back surface 102 of the main lead 10 and the back surface 202 of the sub lead 20 are the external connecting terminals used for mounting the semiconductor light emitting device. Accordingly, the design (shape) of the connecting pad on the circuit board on which the semiconductor light emitting device A10 is mounted is facilitated. Further, the exposed portions of the main lead 10 and the sub lead 20 are not biased in the second direction x with respect to the outer shape of the case 60 of the semiconductor light emitting device A10, and a semiconductor light emitting device having good mountability can be provided.

(1-4) The back surface 112 of the main body portion 11 of the main lead 10 on which the semiconductor light emitting element 30 is mounted is exposed from the case back surface 602 of the case 60. Accordingly, the entire back surface 112 of the main body portion 11 is brought into contact with, for example, the mounting substrate on which the semiconductor light emitting device A10 is mounted. Since the heat of the semiconductor light emitting element 30 is transferred to the side of the case back surface 602 of the case 60 via the main body portion 11, the heat of the semiconductor light emitting element 30 can be efficiently dissipated to the circuit board.

(1-5) The back surface 212 of the main body portion 21 of the sub lead 20, on which the protective element 40A is mounted, is exposed from the case back surface 602 of the case 60. Accordingly, the entire back surface 212 of the main body portion 21 is brought into contact with, for example, the circuit board on which the semiconductor light emitting device A10 is mounted. Since the heat of the protective element 40A is transferred to the side of the case back surface 602 of the case 60 via the main body portion 21, the heat of the protective element 40A can be efficiently dissipated to the circuit board.

(1-6) The back surface 112 of the main body portion 11 of the main lead 10, on which the semiconductor light emitting element 30 is mounted, is flush with the case back surface 602 of the case 60. In addition, the back surface 212 of the main body portion 21 of the sub lead 20, on which the protective element 40A is mounted, is flush with the case back surface 602 of the case 60. The main lead 10 and the sub lead 20 are placed on the work table of the die bonder, and the back surface 112 of the main body portion 11 and the back surface 212 of the main body portion 21 are brought into contact with the work table. Accordingly, the pressing force applied in the die bonding process is received by the work table. Therefore, the semiconductor light emitting element 30 and the protective element 40A can be reliably mounted on the main lead 10 and the sub lead 20, respectively. Further, the pressing force applied in the wire bonding process is received by the work table. Therefore, the wires 51, 52, and 53 can be reliably connected.

(1-7) In the semiconductor light emitting element 30, the electrode 321 connected to the sub lead 20 and the electrode 322 connected to the main lead 10 are arranged diagonally to the rectangular element main surface 301. Therefore, the current supplied to the semiconductor light emitting element 30 is easily diffused throughout the semiconductor light emitting element 30, so that light can be emitted from the entire surface.

(1-8) The case 60 has the rectangular opening 61 defined by the inner side surface 62. The case 60 has the recognition part 63 that is convex inside the opening 61. The recognition part 63 functions as the cathode mark indicating the side on which the sub lead 20 is located, that is, the side of the cathode electrode to which the cathode terminal of the semiconductor light emitting element 30 is connected. With such a recognition part 63, the side with the cathode terminal can be easily determined from the side of the case main surface 601 of the case 60.

(1-9) The recognition part 63 is formed in the rectangular shape. The upper surface 631 of the recognition part 63 can be used as the identification region in which the identification information is written. Further, by writing a mark for identification on the upper surface 631 of the recognition part 63, the identification information such as the type of the semiconductor light emitting device A10 can be easily recognized.

Modification of First Embodiment

Figure 9:
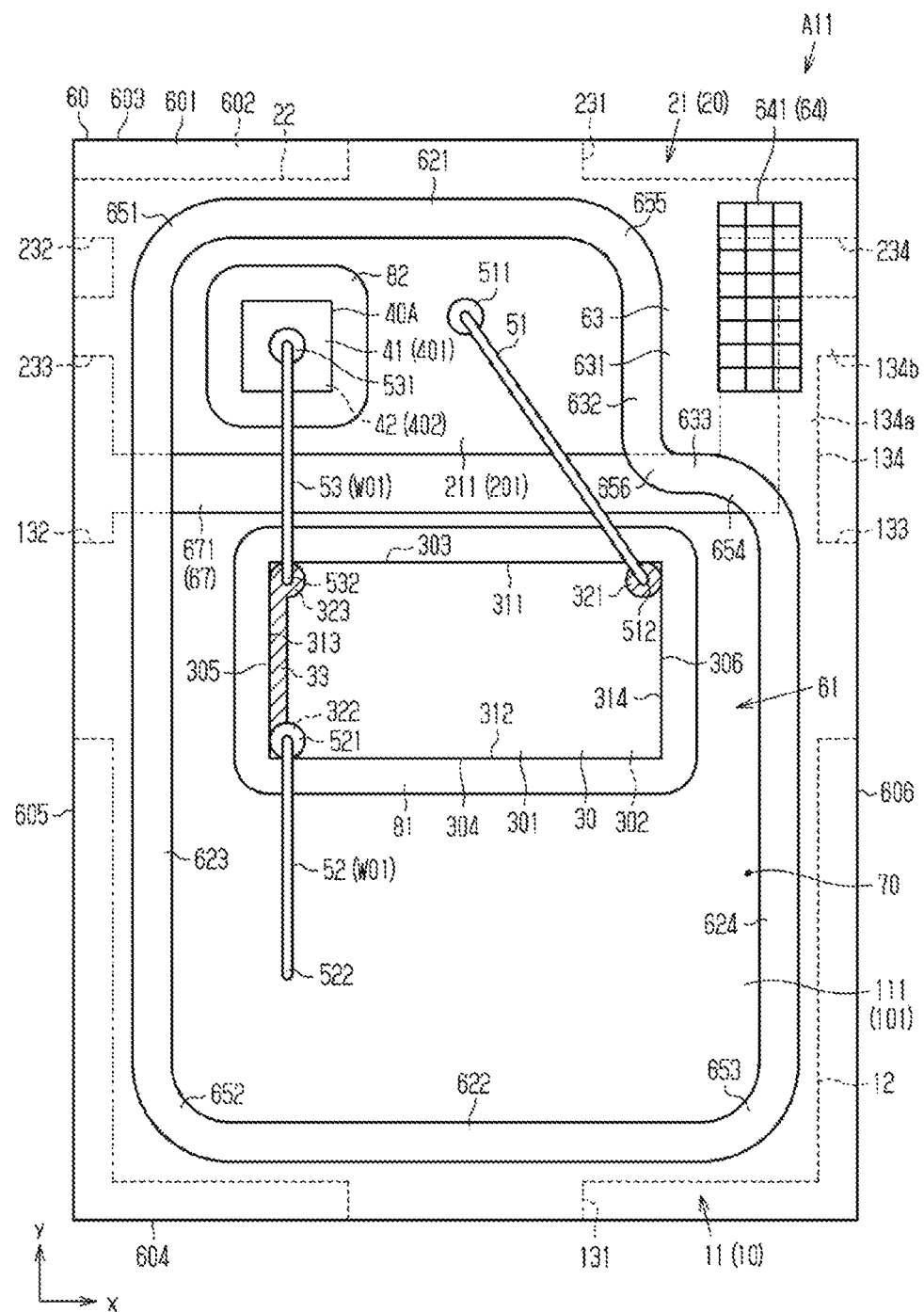
FIG. 9 is a schematic plan view showing a modification of the first embodiment.
Figure 10:
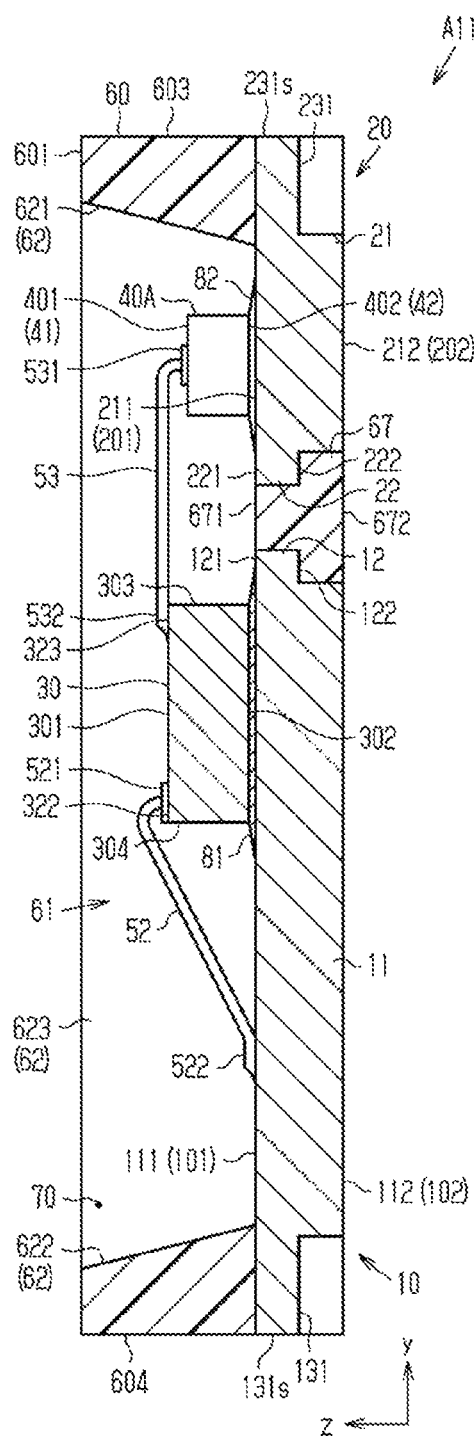
FIG. 10 is a cross-sectional view showing a modification of the first embodiment.

In a semiconductor light emitting device A11 shown in FIGS. 9 and 10, the first end 521 of the wire 52 is connected to the electrode 322 of the semiconductor light emitting element 30, and the second end 522 of the wire 52 is connected to the main lead 10. By doing so, since the first ends 511, 521, and 531 of the wires 51, 52, and 53, respectively, are oriented in the same direction, a capillary connecting the wires 51 to 53 moves in one direction to form a loop, and the wires 51 to 53 can be efficiently connected.

In addition, the connection direction of the wires 51 and 53 may be changed with respect to the semiconductor light emitting device A10 of the first embodiment. For example, the first end 511 of the wire 51 may be connected to the electrode 321 of the semiconductor light emitting element 30, and the second end 512 of the wire 51 may be connected to the sub lead 20. Further, the first end 531 of the wire 53 may be connected to the electrode 323 of the semiconductor light emitting element 30, and the second end 532 of the wire 53 may be connected to the protective element 40A. Even in this case, the capillary connecting the wires 51 to 53 moves in one direction to form a loop, and the wires 51 to 53 can be efficiently connected.

Second Embodiment

Hereinafter, a semiconductor light emitting device A20 according to a second embodiment will be described with reference to FIGS. 11 and 12. In the semiconductor light emitting device A20 of the second embodiment, the same constituent members as those of the semiconductor light emitting device A10 of the first embodiment are denoted by the same reference numerals, and some or all of the explanation thereof will be omitted.

The semiconductor light emitting device A20 of the present embodiment is different from the semiconductor light emitting device A10 of the first embodiment in the electrode position of the semiconductor light emitting element 30 and the mounting position of a protective element 40B. As shown in FIG. 11, the semiconductor light emitting element 30 has electrodes 321, 322, and 323 and a connecting wiring 33 on the element main surface 301. Each of the electrodes 321 to 323 has a circular shape when viewed in the thickness direction z. The width of the connecting wiring 33 is equal to, for example, the radius of each of the electrodes 321 to 323.

The electrodes 321 and 322 are electrodes connected to the internal semiconductor layer. The electrode 321 is, for example, a cathode electrode, and the electrode 322 is, for example, an anode electrode. The electrode 321 is arranged at a corner portion sandwiched between the first side 311 and the third side 313 of the element main surface 301, and the electrode 322 is arranged at a corner portion sandwiched between the second side 312 and the fourth side 314 of the element main surface 301. In other words, the electrodes 321 and 322 are arranged diagonally to the rectangular element main surface 301. The semiconductor light emitting element 30 is arranged with the element side surface 303 on the side where the electrode 321 is provided facing the sub lead 20. Further, the electrode 321 is connected to the sub lead 20 by the wire 51. Accordingly, in the present embodiment, the electrode 321 functions as a second electrode, the electrode 323 functions as a first electrode, and the electrode 322 functions as a connecting electrode. The main body portion 21 of the sub lead 20 functions as a cathode terminal of the semiconductor light emitting device A20. The electrode 322 is located on the opposite side of the sub lead 20, and is connected to the main lead 10 by the wire 52. The main body portion 11 of the main lead 10 functions as an anode terminal of the semiconductor light emitting device A20.

The electrode 323 is arranged at an end portion opposite to the electrode 321 on the third side 313 on which the electrode 321 is provided. That is, the electrode 321 and the electrode 323 are arranged at both end portions of the third side 313 of the element main surface 301. The connecting wiring 33 extends along the third side 313 of the element main surface 301. The connecting wiring 33 connects the electrode 321 and the electrode 323. For example, the electrode 323 is not directly connected to the internal semiconductor layer, but is electrically connected to the internal semiconductor layer via the connecting wiring 33 and the electrode 321. The electrode 323 may be directly connected to the internal semiconductor layer. In the present embodiment, the electrodes 321 and 323 and the connecting wiring 33 form a main surface connecting portion.

Figure 11:
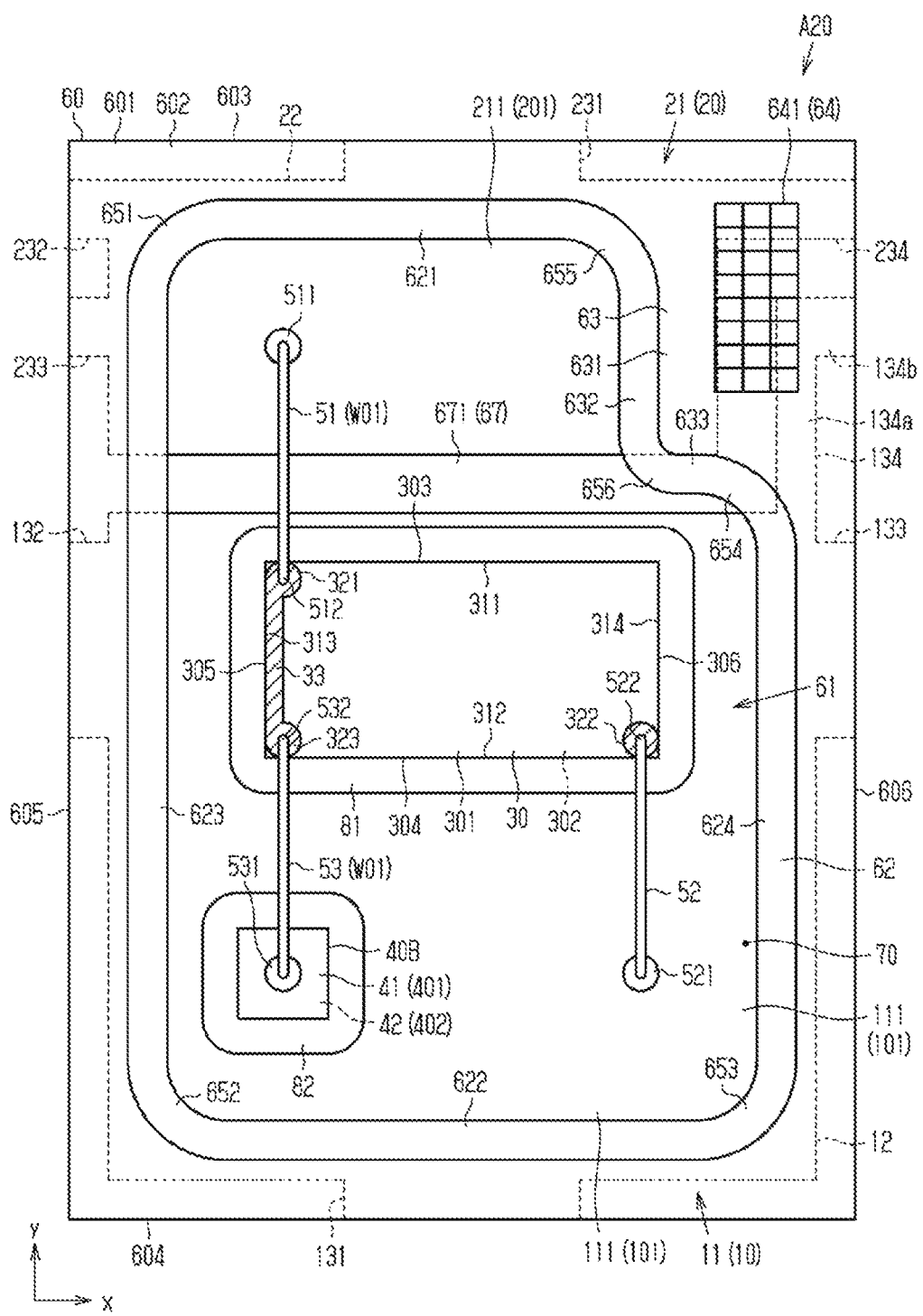
FIG. 11 is a schematic plan view of a semiconductor light emitting device according to a second embodiment.

As shown in FIG. 11, the protective element 40B is mounted on the main body portion 11 of the main lead 10. Specifically, the protective element 40B is mounted on a portion of the main lead 10 on the opposite side of the sub lead 20 with respect to the semiconductor light emitting element 30. That is, the main body portion 11 of the main lead 10 is a die bonding portion on which the semiconductor light emitting element 30 and the protective element 40B are mounted.

The protective element 40B is, for example, a Zener diode. As the protective element 40B, various protective elements mounted on a general semiconductor light emitting device can be used. The protective element 40B has a substantially rectangular parallelepiped shape. The protective element 40B has a main surface 401 and a back surface 402. The main surface 401 and the back surface 402 face opposite sides in the thickness direction z. A main surface electrode 41 is provided on the main surface 401, and a back surface electrode 42 is provided on the back surface 402. The main surface electrode 41 is, for example, a cathode electrode, and the back surface electrode 42 is, for example, an anode electrode. As shown in FIGS. 11 and 12, the back surface electrode 42 of the protective element 40B is connected to the main body portion 11 of the main lead 10 by a bonding material 82. The bonding material 82 is composed of, for example, solder or Ag paste and has conductivity. The back surface electrode 42 of the protective element 40B is connected to the main lead 10 via the conductive bonding material 82.

Figure 12:
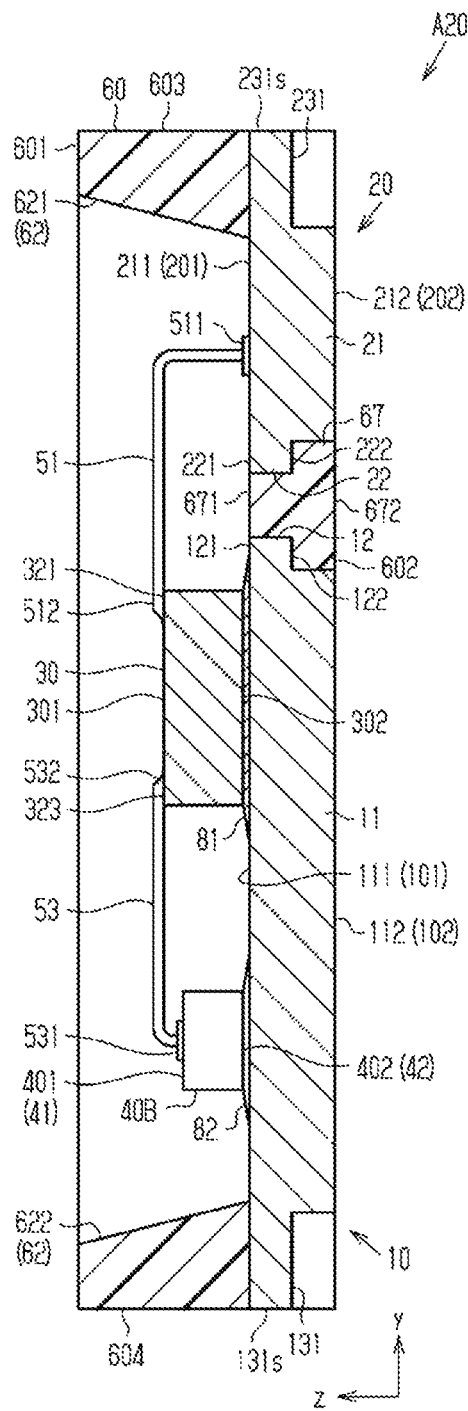
FIG. 12 is a cross-sectional view of the semiconductor light emitting device according to the second embodiment.

As shown in FIGS. 11 and 12, the wire 51 connects the sub lead 20 and the electrode 321 of the semiconductor light emitting element 30. In the present embodiment, the electrode 321 functions as a second electrode. The wire 51 is made of, for example, Au. As an example, the first end 511 of the wire 51 is connected to the sub lead 20, and the second end 512 of the wire 51 is connected to the electrode 321 of the semiconductor light emitting element 30. Thus, by connecting the first end 511 of the wire 51 to the sub lead 20, it is possible to prevent the loop of the wire 51 from becoming too high.

As shown in FIG. 11, the wire 52 connects the main lead 10 and the electrode 322 of the semiconductor light emitting element 30. In the present embodiment, the electrode 322 functions as a connecting electrode. The wire 52 is made of, for example, Au. As an example, the first end 521 of the wire 52 is connected to the main lead 10 and the second end 522 of the wire 52 is connected to the electrode 322 of the semiconductor light emitting element 30. Thus, by connecting the first end 521 of the wire 52 to the main lead 10, it is possible to prevent the loop of the wire 52 from becoming too high.

As shown in FIGS. 11 and 12, the wire 53 connects the main surface electrode 41 of the protective element 40B and the electrode 323 of the semiconductor light emitting element 30. In the present embodiment, the electrode 323 functions as a first electrode. The wire 53 is made of, for example, Au. As an example, the first end 531 of the wire 53 is connected to the main surface electrode 41 of the protective element 40B, and the second end 532 of the wire 53 is connected to the electrode 323 of the semiconductor light emitting element 30. The height of the protective element 40B is lower than the height of the semiconductor light emitting element 30. Thus, by connecting the first end 531 of the wire 53 to the protective element 40B, it is possible to prevent the loop of the wire 53 from becoming too high.

As described above, according to the second embodiment, the following effects are achieved in addition to the effects of the first embodiment.

(2-1) The semiconductor light emitting device A20 includes the main lead 10, the sub lead 20, and the semiconductor light emitting element 30 and the protective element 40B, which are mounted on the main lead 10. The semiconductor light emitting element 30 and the protective element 40B are mounted on the main lead 10. The back surface electrode 42 of the protective element 40B is bonded to the main lead 10 by the conductive bonding material 82. The main surface electrode 41 of the protective element 40B is connected to the sub lead 20 by the connecting member W01 including the wire 53, the electrodes 323 and 321 of the semiconductor light emitting element 30, the connecting wiring 33 connecting the electrodes 323 and 321, and the wire 51. Accordingly, the main surface electrode 41 of the protective element 40B bonded to the main lead 10 can be easily connected to the sub lead 20. As a result, it is possible to provide the semiconductor light emitting device A20 with fewer restrictions on the arrangement position of the protective element 40B and the connection position of the wires 51 to 53 and with a high degree of freedom in design.

Modification of Second Embodiment

Figure 13:
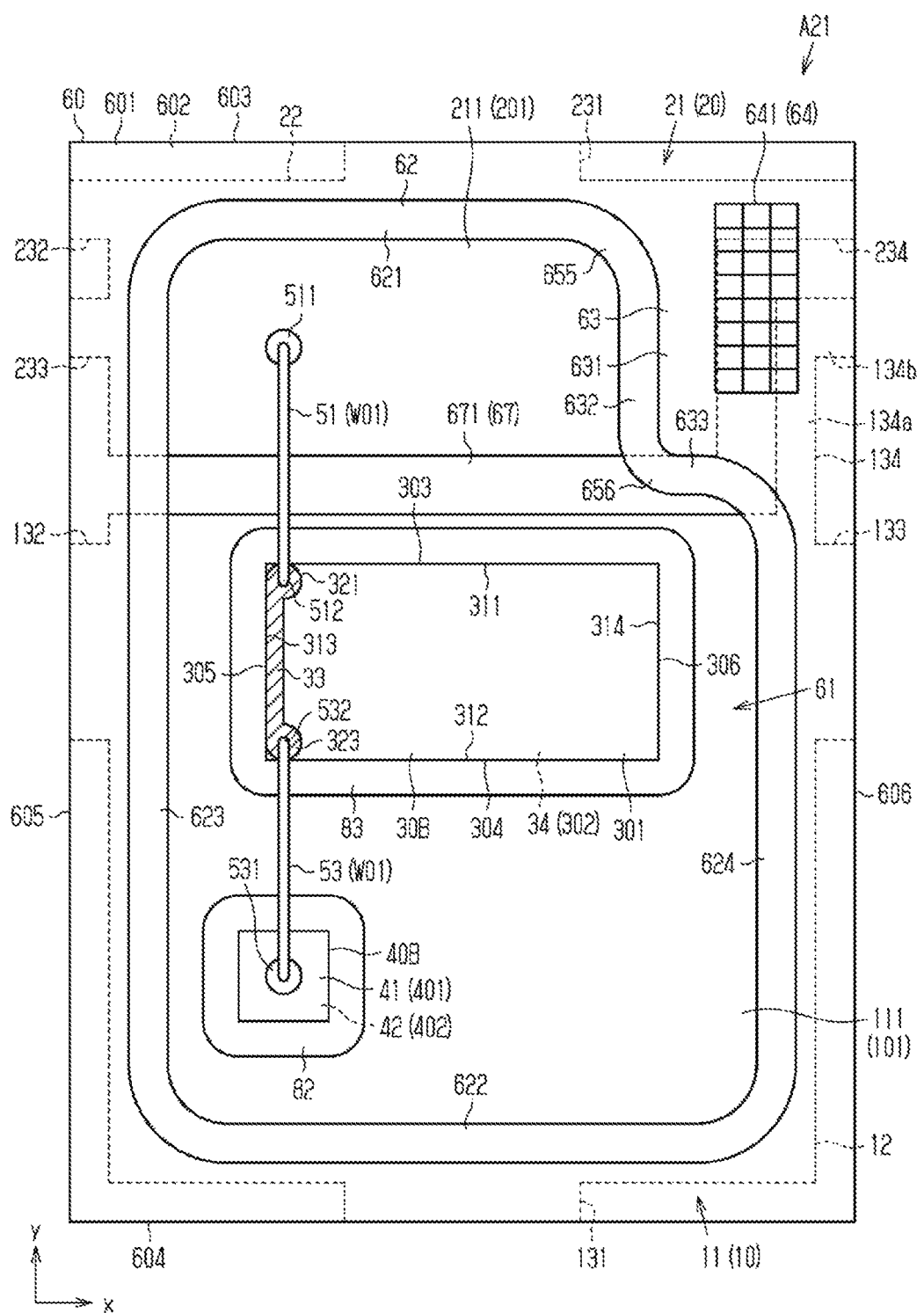
FIG. 13 is a schematic plan view showing a modification of the second embodiment.

A semiconductor light emitting device A21 shown in FIG. 13 includes a semiconductor light emitting element 30B. The semiconductor light emitting element 30B has electrodes 321 and 323 and a connecting wiring 33 on the element main surface 301, and a back surface electrode 34 as a connecting electrode on the element back surface 302. The electrode 321 on the element main surface 301 is, for example, a cathode electrode, and the back surface electrode 34 on the element back surface 302 is, for example, an anode electrode. The semiconductor light emitting element 30B is mounted on the main surface 101 of the main lead 10 by a bonding material 83. The bonding material 83 is made of, for example, solder or Ag paste, and has conductivity. The back surface electrode 34 of the semiconductor light emitting element 30B is electrically connected to the main lead 10 via the conductive bonding material 83. Accordingly, in the semiconductor light emitting element 30B, since the element main surface 301 does not have the electrode 322, the area for light emission can be increased to that extent. Further, when the semiconductor light emitting element 30B is used, the wire 52 shown in FIG. 11 can be omitted, and thus the restrictions on the package design can be further reduced.

Third Embodiment

Figure 14:
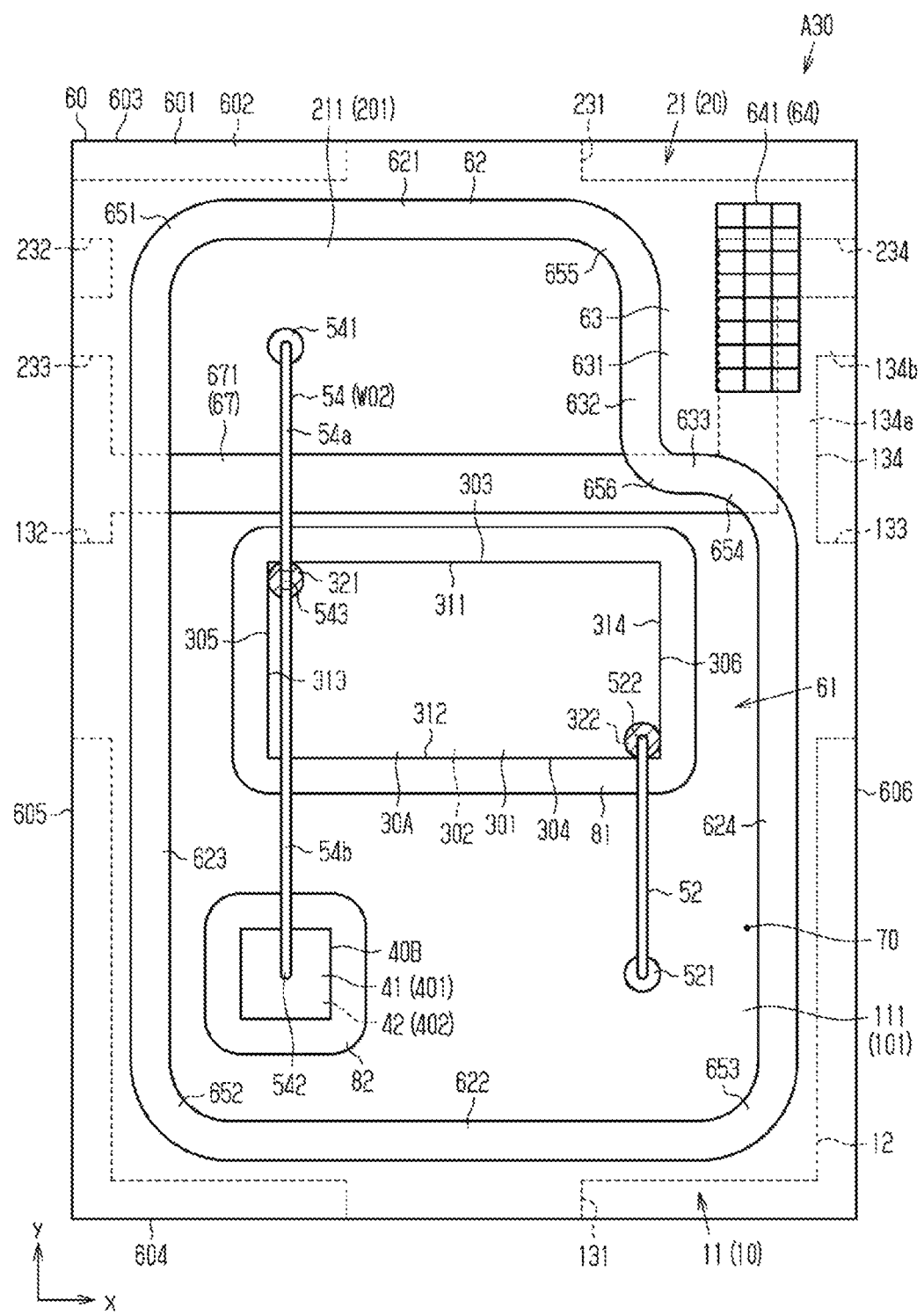
FIG. 14 is a schematic plan view of a semiconductor light emitting device according to a third embodiment.
Figure 15:
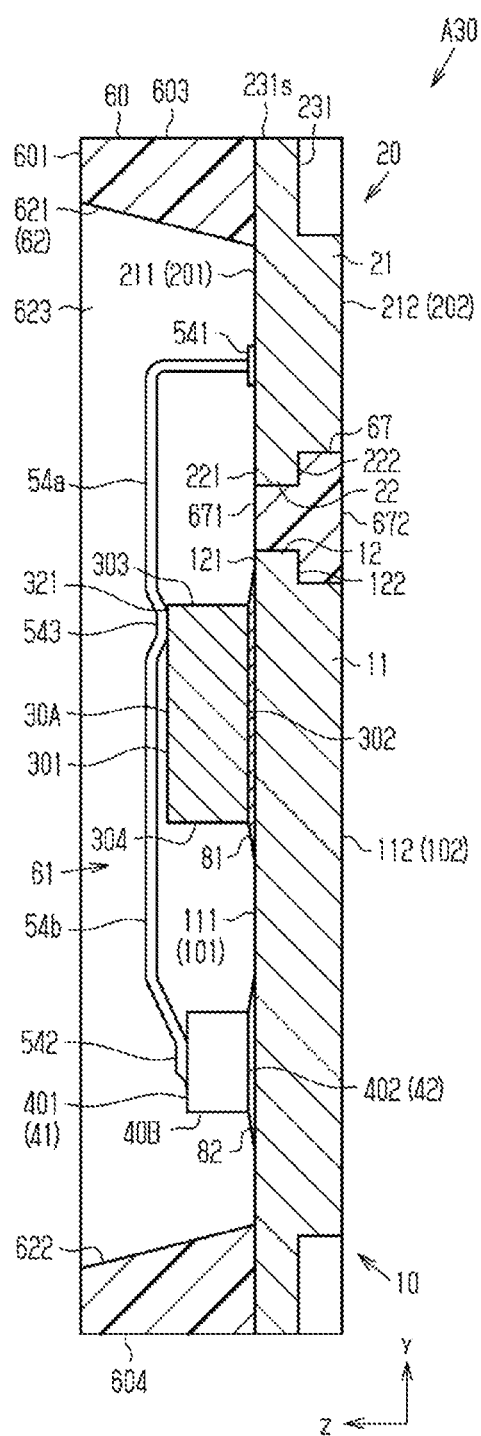
FIG. 15 is a cross-sectional view of the semiconductor light emitting device according to the third embodiment.

Hereinafter, a semiconductor light emitting device A30 according to a third embodiment will be described with reference to FIGS. 14 and 15. In the semiconductor light emitting device A30 of the third embodiment, the same constituent members as those of the semiconductor light emitting devices A10 and A20 of the above embodiments are denoted by the same reference numerals, and some or all of the explanation thereof will be omitted.

The semiconductor light emitting device A30 of the third embodiment is different from the semiconductor light emitting device A20 of the second embodiment in the connection of the electrodes of the semiconductor light emitting element 30A and the protective element 40B. As shown in FIGS. 14 and 15, the semiconductor light emitting device A30 of the present embodiment includes a semiconductor light emitting element 30A. The semiconductor light emitting element 30A is a semiconductor chip formed by laminating a semiconductor material on an insulating substrate. The semiconductor light emitting element 30A has electrodes 321 and 322 on the element main surface 301. The semiconductor light emitting element 30A does not include the electrode 323 and the connecting wiring 33 shown in FIG. 11.

The protective element 40B is mounted on the main body portion 11 of the main lead 10. The protective element 40B has a main surface 401, a back surface 402, a main surface electrode 41 on the main surface 401, and a back surface electrode 42 on the back surface 402. The main surface electrode 41 is, for example, a cathode electrode, and the back surface electrode 42 is an anode electrode. The back surface electrode 42 is connected to the main lead 10 by a conductive bonding material 82.

The main surface electrode 41 of the protective element 40B is connected to the electrode 321 of the semiconductor light emitting element 30A and the sub lead 20 by a wire 54. A first end 541 of the wire 54 is connected to the sub lead 20, and a second end 542 of the wire 54 is connected to the main surface electrode 41 of the protective element 40B. Further, the wire 54 is connected to the electrode 321 of the semiconductor light emitting element 30A at a midpoint 543 between the first end 541 and the second end 542. That is, the wire 54 has the first end 541 connected to the sub lead 20, the midpoint 543 connected to the electrode 321 of the semiconductor light emitting element 30A, and the second end 542 connected to the main lead 10. In the present embodiment, the electrode 321 functions as a supply electrode for supplying a current to the semiconductor light emitting element 30A, and the electrode 322 functions as a connecting electrode for connecting the semiconductor light emitting element 30A to the main lead 10. In addition, in the present embodiment, the electrode 321 forms a main surface connecting portion.

The semiconductor light emitting element 30A is connected to the main lead 10 by the wire 52, and is also connected to the sub lead 20 by a first portion 54a between the first end 541 and the midpoint 543 of the wire 54. The protective element 40B is connected to the main lead 10 by the bonding material 82, and is also connected to the sub lead 20 by a portion between the first end 541 and the second end 542 of the wire 54, that is, the first portion 54a and a second portion 54b. The wire 54 forms a connecting member W02 that interconnects the protective element 40B and the sub lead 20 via the semiconductor light emitting element 30A.

As described above, according to the semiconductor light emitting device A30 of the present embodiment, the following effects are achieved in addition to the effects of the first embodiment.

(3-1) The semiconductor light emitting device A30 has the main lead 10, the sub lead 20, and the semiconductor light emitting element 30A and the protective element 40B, which are bonded to the main lead 10. The semiconductor light emitting element 30A is connected to the main lead 10 and the sub lead 20 by the wires 52 and 54, respectively. The back surface electrode 42 of the protective element 40B is connected to the main lead 10 by the conductive bonding material 82. The main surface electrode 41 of the protective element 40B is connected to the electrode 321 of the semiconductor light emitting element 30A and the sub lead 20 by the wire 54. Accordingly, the protective element 40B bonded to the main lead 10 can be easily connected to the semiconductor light emitting element 30A and the sub lead 20. As a result, it is possible to provide the semiconductor light emitting device A30 with fewer restrictions on the arrangement position of the protective element 40B and the connection position of the wires 52 and 54, and with a high degree of freedom in design.

Modifications of Third Embodiment

Figure 16:
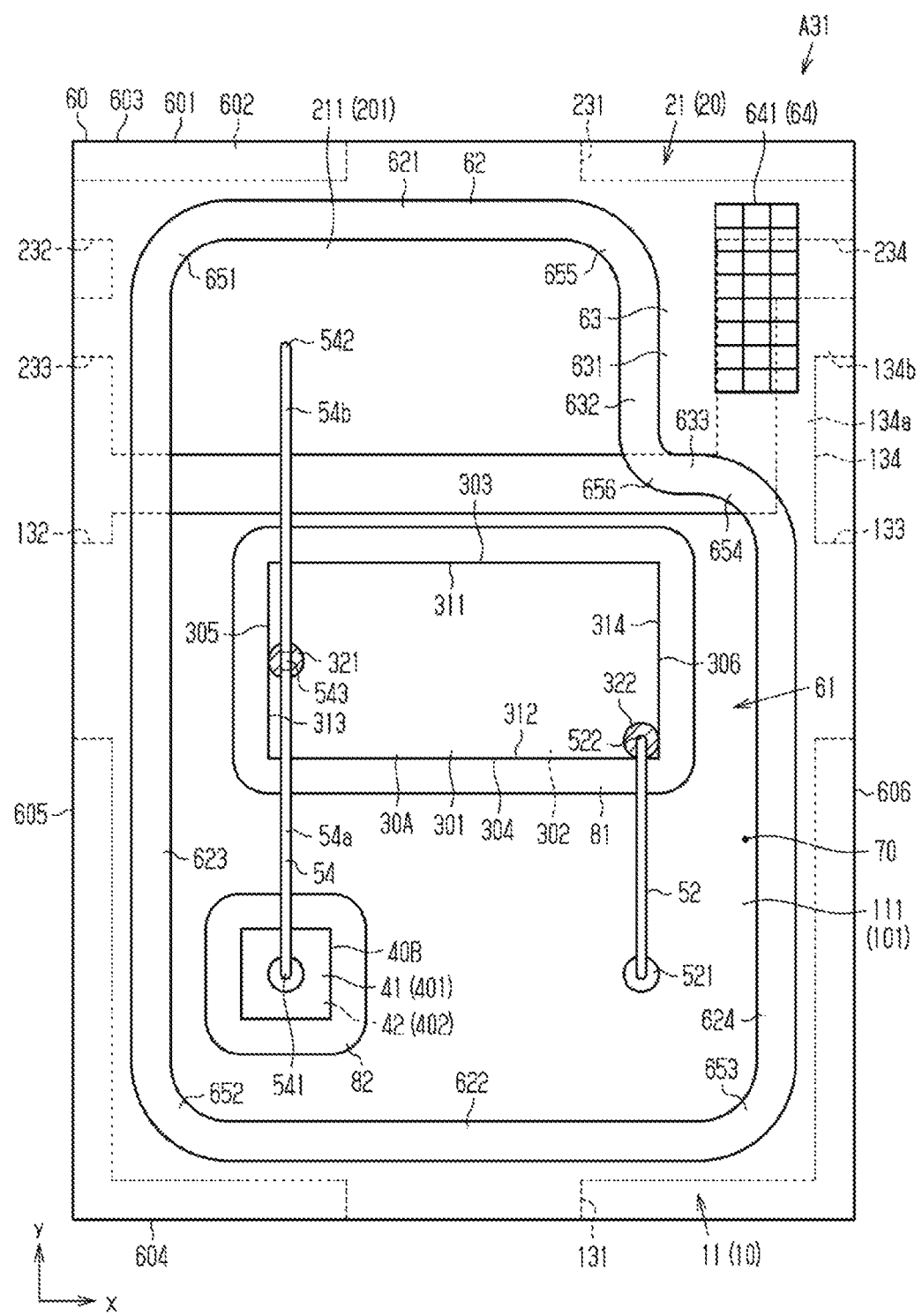
FIG. 16 is a schematic plan view showing a modification of the third embodiment.

In a semiconductor light emitting device A31 shown in FIG. 16, the first end 541 of the wire 54 is connected to the main surface electrode 41 of the protective element 40B, and the second end 542 of the wire 54 is connected to the sub lead 20. The semiconductor light emitting device A31 having the wires 54 connected as described above can also obtain the same effects as those of the third embodiment. In addition, in the semiconductor light emitting device A31, the electrode 321 of the semiconductor light emitting element 30A is provided at the center of the third side 313. The arrangement position of the electrode 321 may be changed as appropriate.

Figure 17:
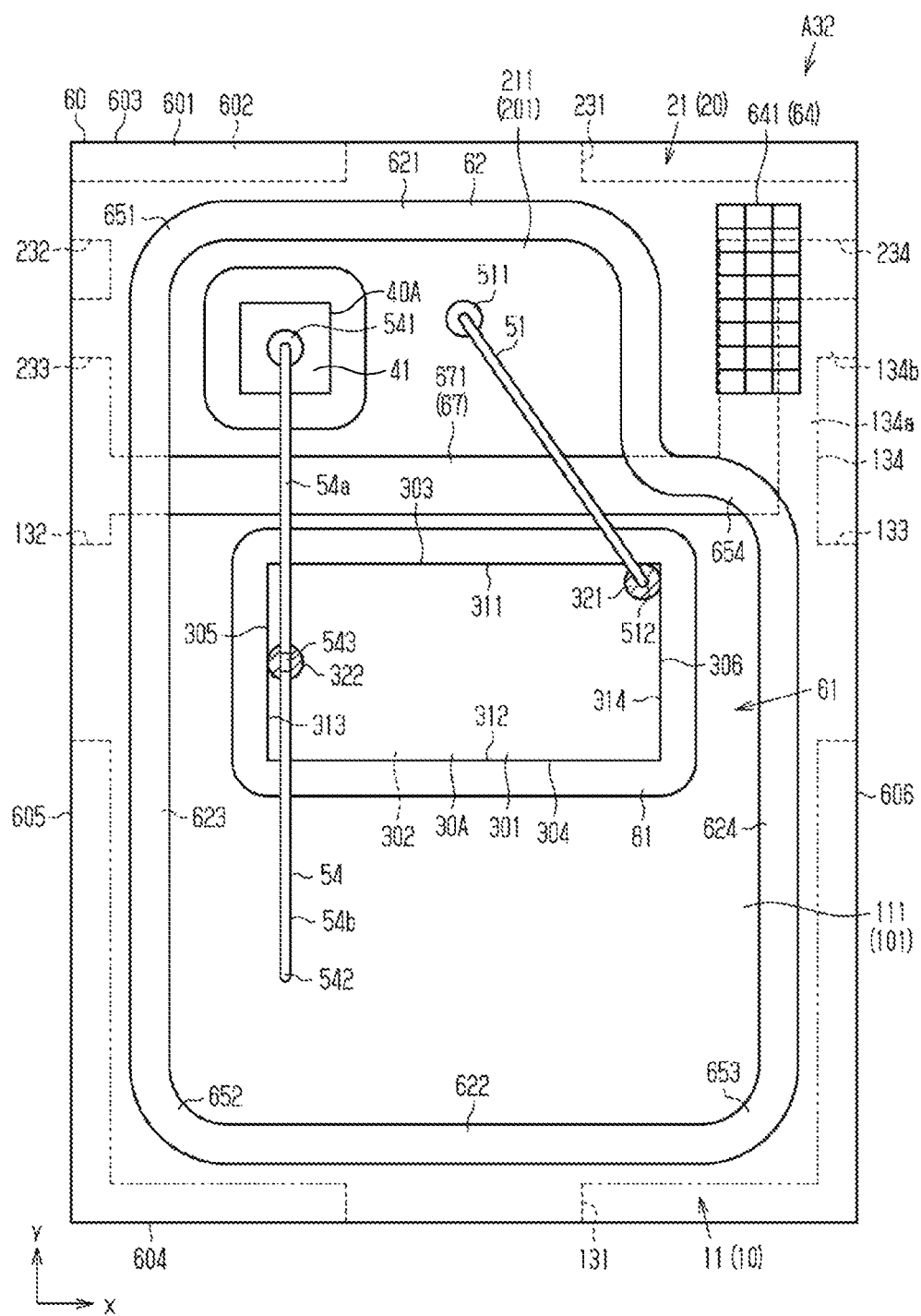
FIG. 17 is a schematic plan view showing a modification of the third embodiment.

In a semiconductor light emitting device A32 shown in FIG. 17, the protective element 40A is mounted on the sub lead 20. The semiconductor light emitting element 30A has the electrodes 321 and 322 on the element main surface 301. On the rectangular element main surface 301, the electrode 321 is arranged at a corner portion between the first side 311 and the fourth side 314, and the electrode 322 is arranged at the center of the third side 313. The arrangement position of the electrode 322 may be changed as appropriate. The first end 541 of the wire 54 is connected to the main surface electrode 41 of the protective element 40A, the midpoint 543 of the wire 54 is connected to the electrode 322, and the second end 542 of the wire 54 is connected to the main lead 10. This semiconductor light emitting device A32 also has the same effects as those of the third embodiment.

Fourth Embodiment

Hereinafter, a semiconductor light emitting device A40 according to a fourth embodiment will be described with reference to FIGS. 18 to 25. In the semiconductor light emitting device A40 of the fourth embodiment, the same constituent members as those of the semiconductor light emitting devices A10, A20, and A30 of the above embodiments are denoted by the same reference numerals, and some or all of the explanation thereof will be omitted.

The semiconductor light emitting device A40 of the present embodiment is different from the semiconductor light emitting device A10 of the first embodiment in the shape of a main lead 10A, a sub lead 20A, and a case 60A. As shown in FIGS. 18 to 24, the semiconductor light emitting device A40 of the fourth embodiment is a package including the semiconductor light emitting element 30 and the protective element 40A. The semiconductor light emitting device A40 includes the main lead 10A, the sub lead 20A, the semiconductor light emitting element 30, the protective element 40A, the wires 51, 52, and 53, the case 60A, and the sealing member 70.

Figure 18:
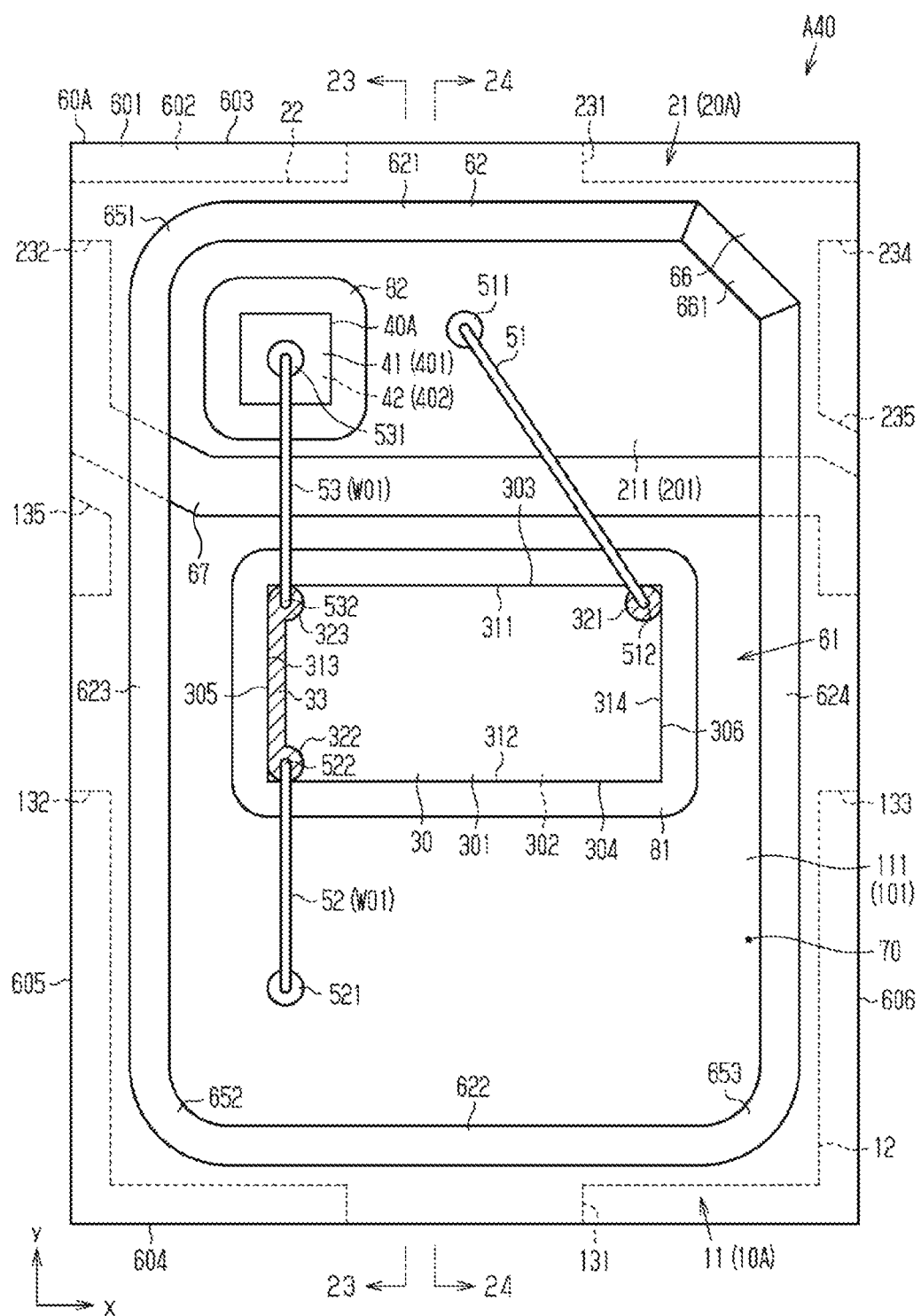
FIG. 18 is a schematic plan view of a semiconductor light emitting device according to a fourth embodiment.
Figure 19:
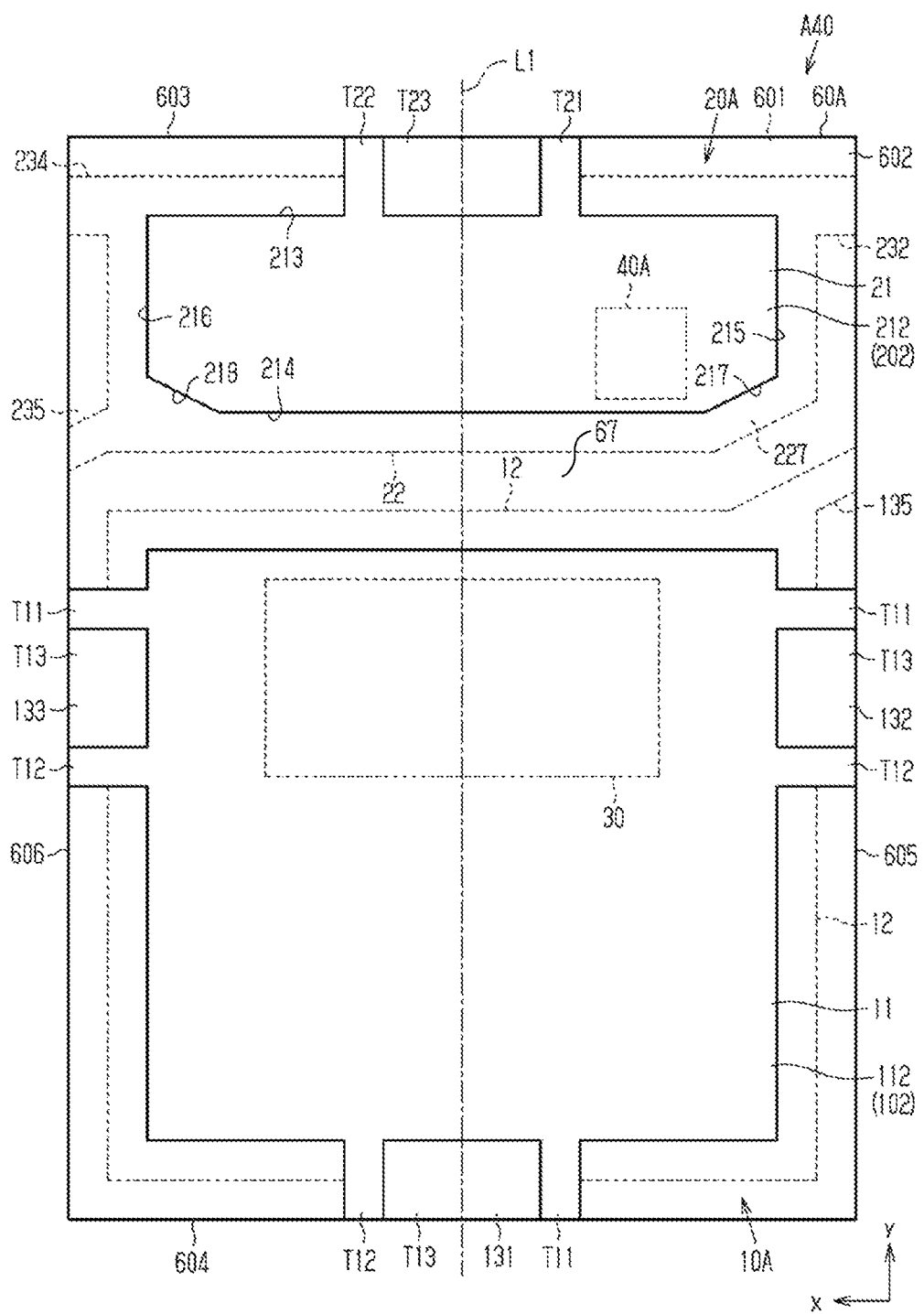
FIG. 19 is a schematic bottom view of the semiconductor light emitting device according to the fourth embodiment.
Figure 20:
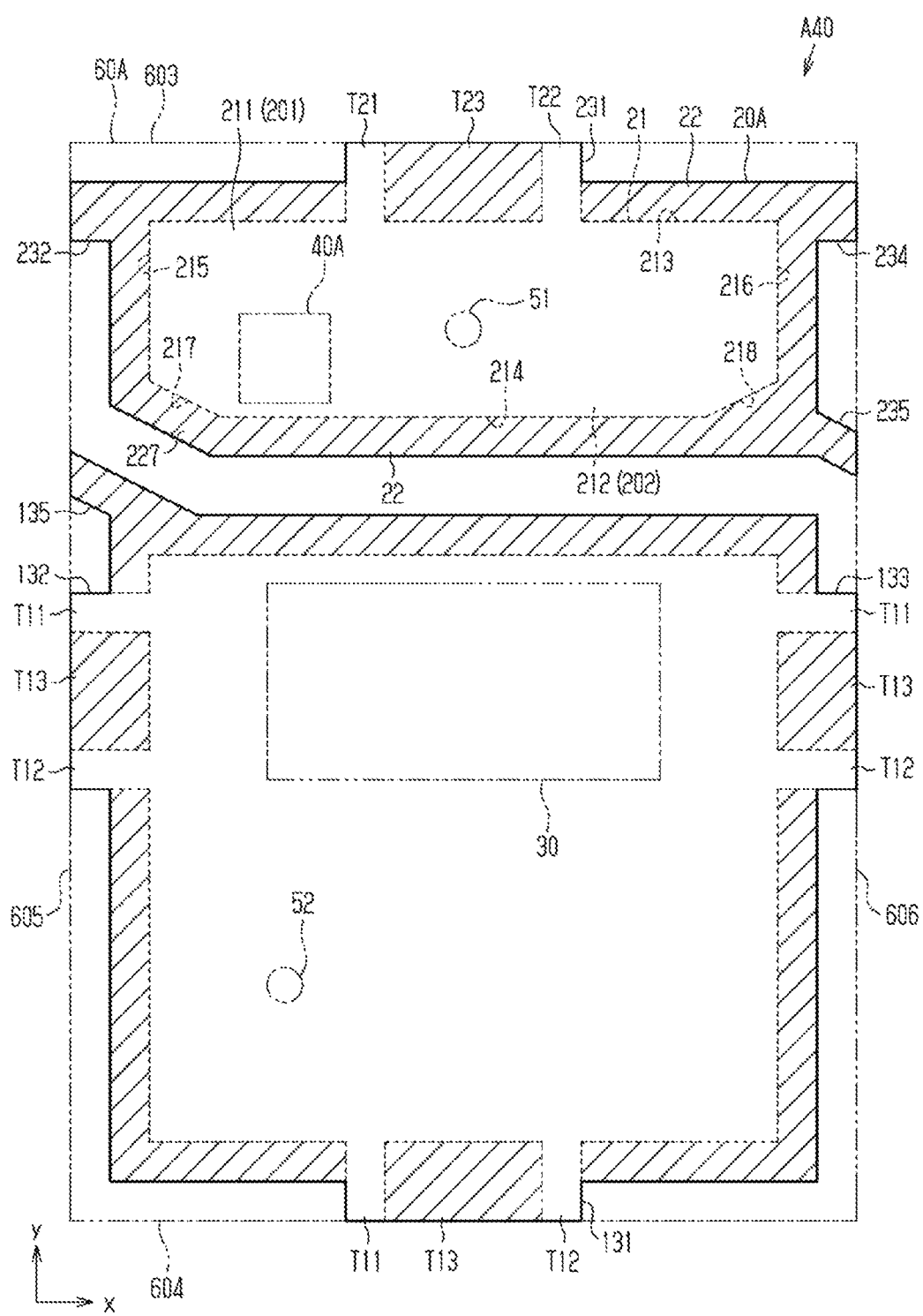
FIG. 20 is a plan view of a main lead and a sub lead according to the fourth embodiment.
Figure 22:
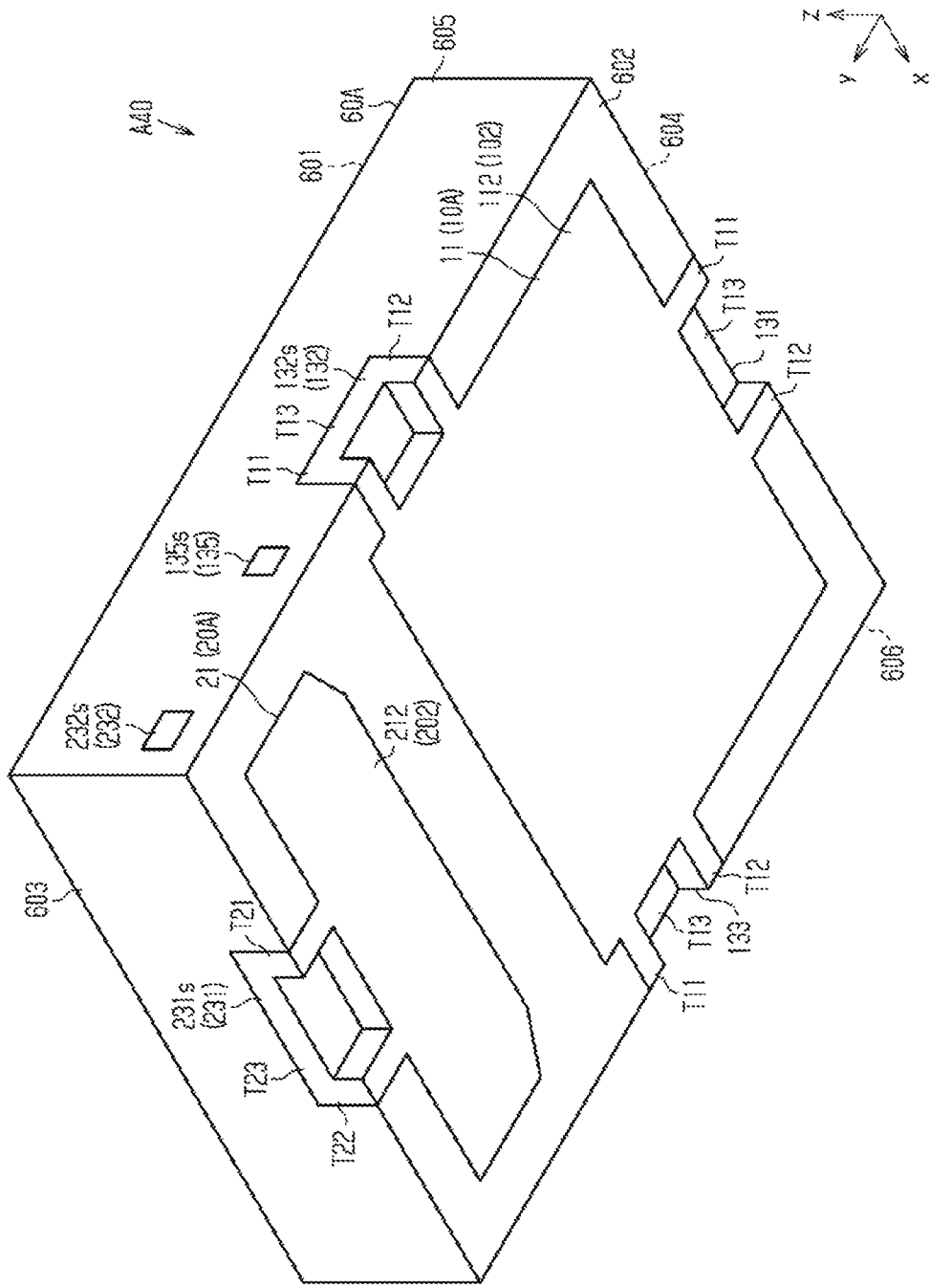
FIG. 22 is a schematic perspective view of the semiconductor light emitting device according to the fourth embodiment when viewed from a back surface side thereof.

As shown in FIGS. 18, 19, and 20, the main lead 10A has a main body portion 11, an edge portion 12, and extension portions 131, 132, 133, and 135. The extension portion 135 extends from the edge portion 12 toward the case outer side surface 605. The extension portion 135 extends obliquely to the first direction y and the second direction x from an end portion on the side of the extension portion 132 toward the case outer side surface 605 at the edge portion 12 of the main lead 10A facing the sub lead 20A. The thickness of the extension portion 135 is equal to, for example, the thickness of the edge portion 12. As shown in FIG. 22, an end surface 135s of the extension portion 135 is exposed from the case outer side surface 605 of the case 60A. A base material of the main lead 10A is exposed at the end surface 135s. A plating layer may be formed on the end surface 135s.

Figure 21:
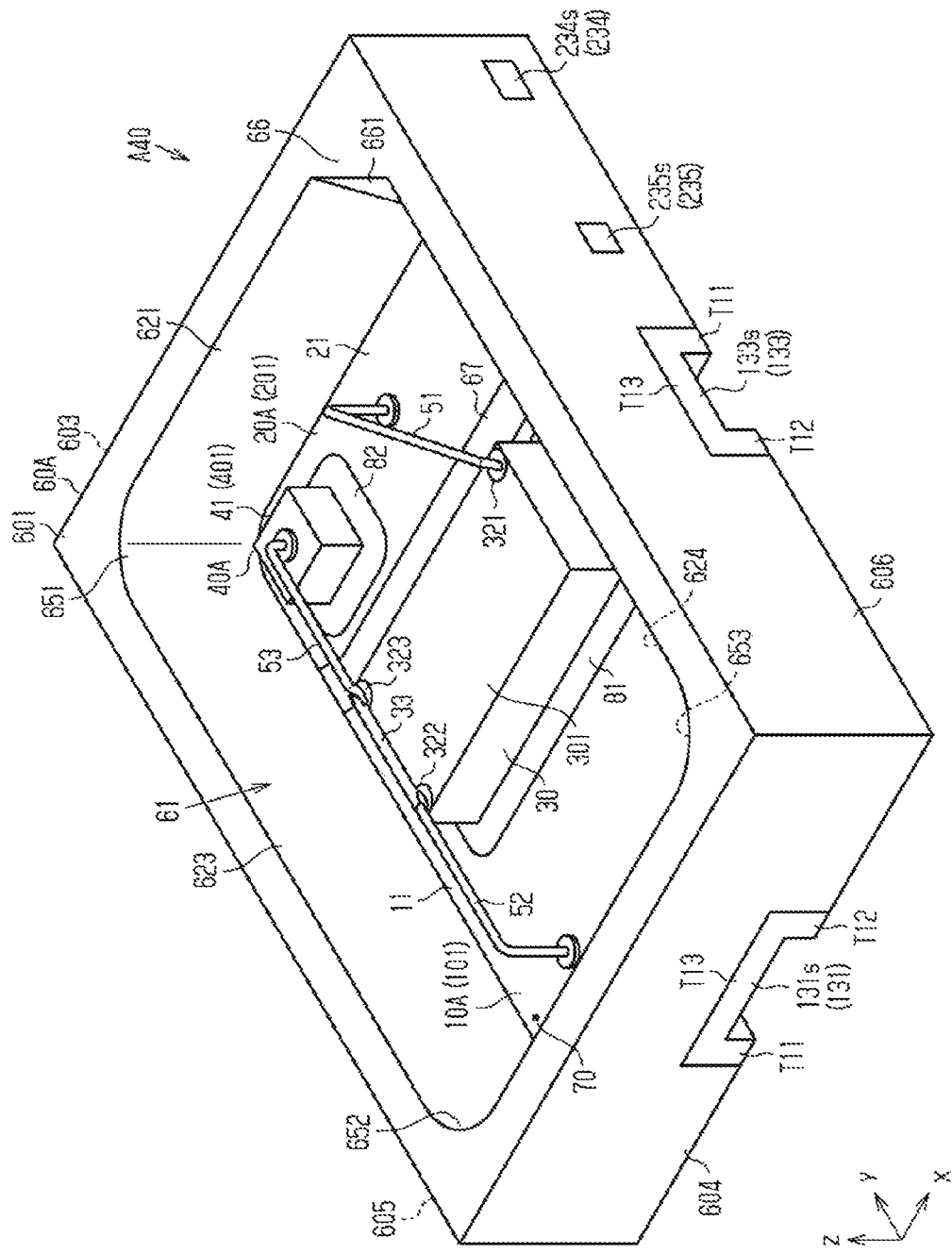
FIG. 21 is a schematic perspective view of the semiconductor light emitting device according to the fourth embodiment when viewed from a top surface side thereof.

As shown in FIGS. 18, 19, and 20, the sub lead 20A has a main body portion 21, an edge portion 22, and extension portions 231, 232, 234, and 235. The main body portion 21 has a rectangular plate shape that is lengthwise in the second direction x when viewed in the thickness direction z. As shown in FIG. 19, the edge portion 22 is provided along the periphery of the main body portion 21. The extension portion 235 extends from the edge portion 22 toward the case outer side surface 606. As shown in FIG. 21, an end surface 235s of the extension portion 235 is exposed from the case outer side surface 606 of the case 60A. A base material of the sub lead 20A is exposed at the end surface 235s. A plating layer may be formed on the end surface 235s.

The extension portion 235 is provided at an end portion on the side of the extension portion 234 of the edge portion 22 of the sub lead 20A facing the main lead 10A. The extension portion 135 of the main lead 10A and the extension portion 235 of the sub lead 20A are provided on the edge portion 12 of the main lead 10A and the edge portion 22 of the sub lead 20A, respectively, which face each other, and are also provided at the end portions on the opposite sides in the second direction x.

The extension portion 235 extends obliquely to the first direction y and the second direction x from the edge portion 22 toward the case outer side surface 606. The extension portion 235 extends in a direction opposite to the extension direction of the extension portion 135 of the main lead 10A. In FIG. 20, the extension portion 135 of the main lead 10A may be provided on the side of the extension portion 133, and the extension portion 235 of the sub lead 20A may be provided on the side of the extension portion 232.

As shown in FIGS. 19 and 20, the main body portion 21 of the sub lead 20A has side surfaces 213 and 214 facing opposite sides in the first direction y, and side surfaces 215 and 216 facing opposite sides in the second direction x. Further, the main body portion 21 has a beveled side surface 217 formed by chamfering one rectangular corner portion on the side of the case outer side surface 605, and a beveled side surface 218 formed by chamfering one rectangular corner portion on the side of the case outer side surface 606.

The beveled side surfaces 217 and 218 are formed so as to be inclined toward the first direction y with respect to the side surface 214 orthogonal to the first direction y, and their angles are equal to each other. Accordingly, the beveled side surfaces 217 and 218 are formed in line-symmetry about the central axis L1 of the semiconductor light emitting device A40 extending in the first direction y. Further, the main body portion 21 is formed in line-symmetry about the central axis L1 of the semiconductor light emitting device A40 extending in the first direction y.

In the sub lead 20A, the edge portion 22 provided along the periphery of the main body portion 21 has a beveled edge portion 227 extending along the beveled side surface 217. The inclination of the beveled edge portion 227 and the beveled side surface 217 with respect to the side surface 214 is equal to the inclination of the extension portion 135 extending from the edge portion 12 of the main lead 10A. Accordingly, a distance between the extension portion 135 of the main lead 10A and the sub lead 20A becomes constant. As a result, a distance between the main lead 10A and the sub lead 20A can be secured.

As shown in FIGS. 18, 19, 21, and 22, the case 60A has a rectangular shape as a whole. The case 60A supports the main lead 10A and the sub lead 20A. The case 60A has a case main surface 601, a case back surface 602, and case outer side surfaces 603, 604, 605, and 606. The case main surface 601 and the case back surface 602 face opposite sides in the thickness direction z. The case outer side surface 603 and the case outer side surface 604 face opposite sides in the first direction y. The case outer side surface 605 and the case outer side surface 606 face opposite sides in the second direction x.

The case 60A is made of white synthetic resin. A thermosetting resin is used as the material of the case 60A. An example of the thermosetting resin may include an unsaturated polyester resin. As the material of the case 60A, epoxy resin, silicone resin, acrylate resin, polyurethane, or the like may be used. The case 60A is made white by adding, for example, titanium oxide to the thermosetting resin as a material thereof. In addition, silica, alumina, etc. may be used as an additive.

The case 60A has an opening 61. The opening 61 is formed in a substantially rectangular shape when viewed in the thickness direction z. The opening 61 is formed from the case main surface 601 to the main surfaces 101 and 201 of the main lead 10A and the sub lead 20A, respectively, in the thickness direction z. The opening 61 is formed so as to expose a portion of each of the main surface 101 of the main lead 10A and the main surface 201 of the sub lead 20A.

The case 60A has an inner side surface 62 that defines the opening 61. The inner side surface 62 extends from the case main surface 601 of the case 60A to the main surface 101 of the main lead 10A and the main surface 201 of the sub lead 20A in the thickness direction z.

Figure 23:
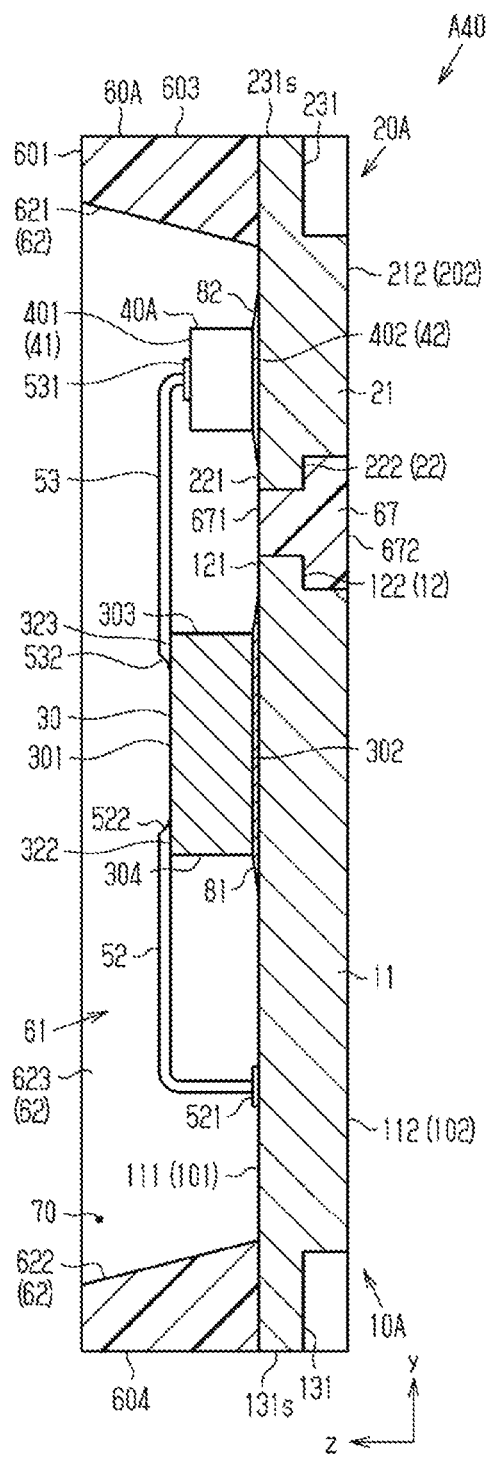
FIG. 23 is a cross-sectional view taken along line 23-23 in FIG. 18.
Figure 24:
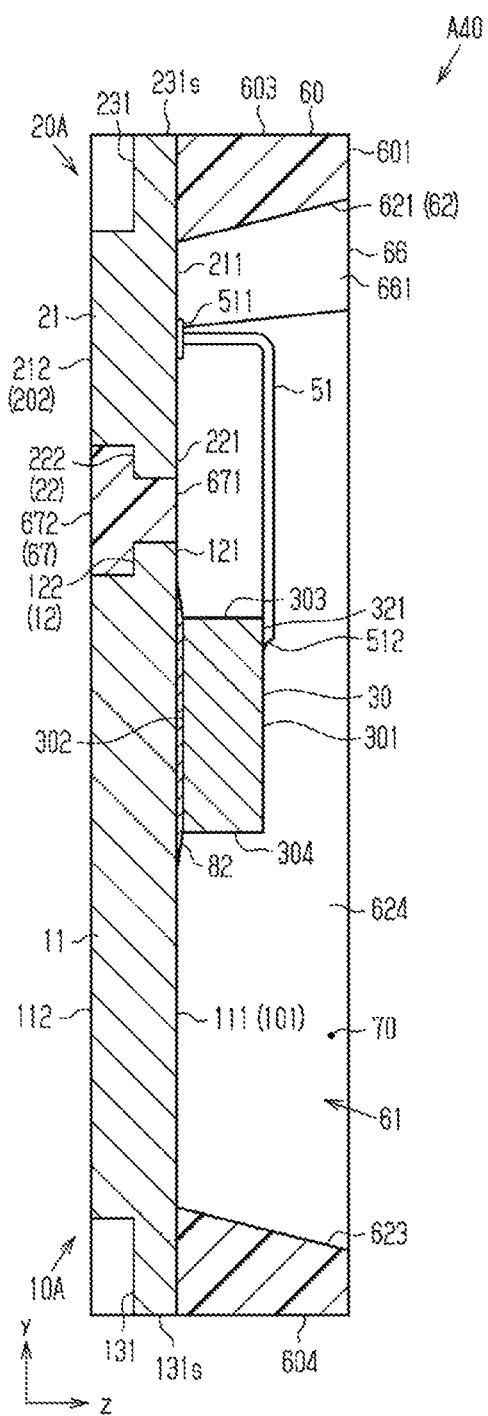
FIG. 24 is a cross-sectional view taken along line 24-24 in FIG. 18.

As shown in FIGS. 23 and 24, the inner side surface 62 is inclined as it becomes distant from the center of the case 60A in a direction orthogonal to the thickness direction z, that is, distant from the semiconductor light emitting element 30 mounted on the main lead 10A, from the side of the main surface 101 of the main lead 10A toward the case main surface 601 of the case 60A. The inner side surface 62 functions as a reflecting surface that reflects light emitted from the semiconductor light emitting element 30.

As shown in FIG. 18, the inner side surface 62 includes a first inner side surface 621, a second inner side surface 622, a third inner side surface 623, and a fourth inner side surface 624. As shown in FIG. 18, the first inner side surface 621 and the second inner side surface 622 are located on both sides of the semiconductor light emitting element 30 in the first direction y. The first inner side surface 621 is on the side of the sub lead 20A and faces the side of the semiconductor light emitting element 30. The second inner side surface 622 is on the side of the main lead 10A and faces the side of the semiconductor light emitting element 30. The first inner side surface 621 and the second inner side surface 622 face opposite sides in the first direction y. The third inner side surface 623 and the fourth inner side surface 624 are located on both sides of the semiconductor light emitting element 30 in the second direction x. Each of the third inner side surface 623 and the fourth inner side surface 624 faces the side of the semiconductor light emitting element 30. That is, the third inner side surface 623 and the fourth inner side surface 624 face opposite sides in the second direction x.

The case 60A has a recognition part 66 formed by chamfering one corner portion of the rectangular opening 61 between the first inner side surface 621 and the fourth inner side surface 624. The recognition part 66 has a triangular shape when viewed from the side of the case main surface 601 of the case 60A. In the semiconductor light emitting device A40, the recognition part 66 functions as a cathode mark for easily recognizing the direction of the sub lead 20A, that is, the side having the cathode terminal. A side surface 661 of the recognition part 66 extends obliquely to the first direction y and the second direction x. The side surface 661 is inclined similarly to the first inner side surface 621 to the fourth inner side surface 624 and functions as a reflecting surface.

Further, the case 60A has connecting surfaces 651, 652, and 653. The connecting surfaces 651 to 653 have a quarter annular shape and are formed to be concave with respect to the inside of the opening 61, when viewed in the thickness direction z. The connecting surface 651 connects the first inner side surface 621 and the third inner side surface 623. The connecting surface 652 connects the third inner side surface 623 and the second inner side surface 622. The connecting surface 653 connects the second inner side surface 622 and the fourth inner side surface 624.

As shown in FIGS. 18 and 19, the case 60A has a partition 67 disposed between the main lead 10A and the sub lead 20A. The partition 67 extends along the second direction x. The partition 67 is formed so as to cover the back surface 122 of the edge portion 12 of the main lead 10A on the side of the sub lead 20A and the back surface 222 of the edge portion 22 of the sub lead 20A on the side of the main lead 10A.

As shown in FIGS. 23 and 24, the partition 67 has a main surface 671 and a back surface 672 facing opposite sides. The main surface 671 of the partition 67 is flush with the main surface 101 of the main lead 10A and the main surface 201 of the sub lead 20A. The back surface 672 of the partition 67 is flush with the back surface 102 of the main lead 10A and the back surface 202 of the sub lead 20A. As shown in FIG. 18, the main surface 671 of the partition 67 extends from the third inner side surface 623 to the fourth inner side surface 624 of the case 60A. The main surface 671 of the partition 67 can be used as an identification region for marking, for example, the type of the semiconductor light emitting device A40.

(Operation)

Figure 25:
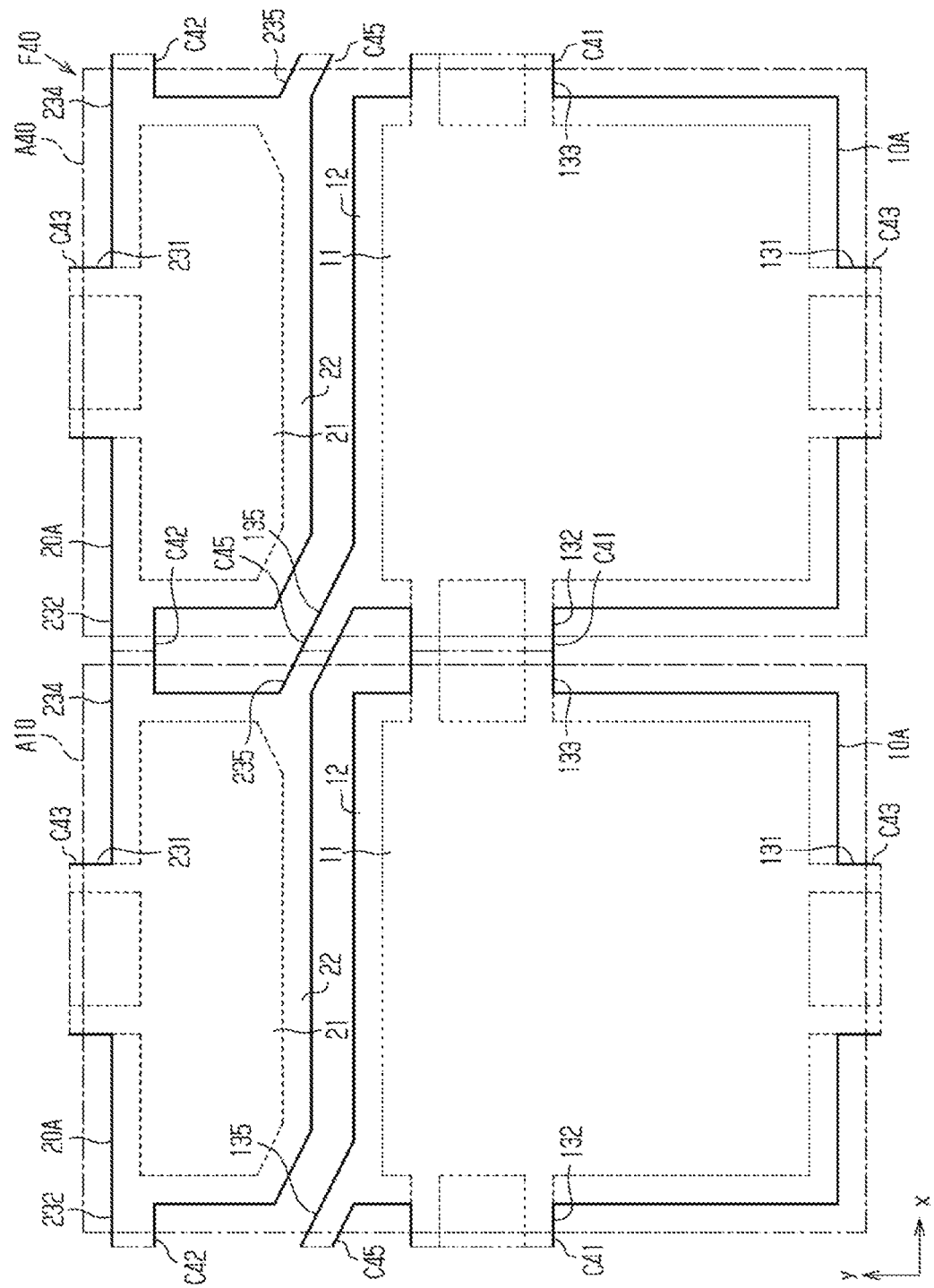
FIG. 25 is a plan view showing a portion of a lead frame.

Next, the operation of the semiconductor light emitting device A40 of the fourth embodiment will be described. As shown in FIG. 25, the semiconductor light emitting device A40 is formed using a lead frame F40 including the main leads 10A and the sub leads 20A.

FIG. 25 shows a portion of the lead frame F40 for manufacturing the semiconductor light emitting device A40 of the fourth embodiment. In addition, FIG. 25 shows a portion for manufacturing two semiconductor light emitting devices A40 (each having an outer shape shown by a one-dot chain line in FIG. 25) which are adjacent to each other in the second direction x.

Each semiconductor light emitting device A40 has the main lead 10A and the sub lead 20A. The lead frame F40 includes a base material forming the main lead 10A and the sub lead 20A. The lead frame F40 is produced, for example, by etching or pressing a metal plate made of Cu, Ni, or an alloy containing at least one thereof. Members forming the lead frame F40 will be described by using the names and reference numerals of the members that will eventually become the semiconductor light emitting device A40.

The main lead 10A and the sub lead 20A forming the semiconductor light emitting device A40 are connected to the adjacent main leads 10A and sub leads 20A by connecting portions C41, C42, C43, and C45. The connecting portions C41, C42, C43, and C45 are portions that are removed by, for example, dicing when the semiconductor light emitting devices A40 are divided into individual pieces.

In the second direction x, the main leads 10A of the semiconductor light emitting devices A40 are adjacent to each other, and the sub leads 20A of the semiconductor light emitting devices A40 are adjacent to each other. In the first direction y, the main lead 10A of each semiconductor light emitting device A40 is adjacent to the sub lead 20A of the adjacent semiconductor light emitting device A40.

In the second direction x, the extension portion 133 of one main lead 10A and the extension portion 132 of the other main lead 10A adjacent to the one main lead 10A are connected to each other by the connecting portion C41. That is, in the second direction x, the adjacent main leads 10A are connected to each other by the connecting portion C41.

In the second direction x, the extension portion 234 of one sub lead 20A and the extension portion 232 of the other sub lead 20 adjacent to the one sub lead 20A are connected to each other by the connecting portion C42. That is, in the second direction x, the adjacent sub leads 20A are connected to each other by the connecting portion C42.

In the first direction y, the extension portion 131 of the main lead 10A and the extension portion 231 of the sub lead 20A adjacent to the main lead 10A are connected to each other by the connecting portion C43. That is, in the first direction y, the main lead 10A and sub lead 20A adjacent to each other are connected to each other by the connecting portion C43.

In the present embodiment, the main lead 10A has the extension portion 135 extending obliquely to the first direction y and the second direction x, and the sub lead 20A has the extension portion 235 extending in a direction opposite to the extension portion 135 of the main lead 10A. The extension portions 135 and 235 are connected to each other by the connecting portion C45 in the lead frame F40. That is, the connecting portion C45 connects the main lead 10A of one semiconductor light emitting device A40 and the sub lead 20A of the other semiconductor light emitting device A40 formed adjacent in the second direction x to the one semiconductor light emitting device A40 including the main lead 10A.

Accordingly, in the present embodiment, the lead frame F40 includes a row of the main leads 10A arranged along the second direction x and connected by the connecting portions C41, and a row of the sub leads 20A arranged along the second direction x and connected by the connecting portions C42. In the lead frame F40, the row of the main leads 10A and the row of the sub leads 20A are alternately arranged in the first direction y. The row of the main leads 10A and the row of the sub leads 20A are connected to each other by the connecting portions C43 and C45. With such a configuration, bending of the lead frame F40 is suppressed, and the lead frame F40 can be easily transported. Further, since all of the main leads 10A and the sub leads 20A included in the lead frame F40 are electrically connected, a plating layer can be easily formed on the surfaces of all of the main leads 10A and the sub leads 20A by an electrolytic plating method or the like.

As described above, according to the fourth embodiment, the following effects are achieved.

(4-1) The same effects as (1-1) to (1-6) of the first embodiment are achieved.

(4-2) The case 60A has the rectangular opening 61 defined by the inner side surface 62.

The case 60A has the recognition part 66 formed by chamfering one corner portion of the rectangular opening 61. The recognition part 66 functions as the cathode mark indicating the side on which the sub lead 20A is located, that is, the side of the cathode electrode to which the cathode terminal of the semiconductor light emitting element 30 is connected. With such a recognition part 66, the side with the cathode terminal can be easily determined from the side of the case main surface 601 of the case 60A.

(4-3) The recognition part 66 is formed by chamfering one corner portion of the rectangular opening 61. Accordingly, the opening 61 of the fourth embodiment is larger than the opening 61 of the first embodiment, and thus the light emitting area of the semiconductor light emitting device A40 can be increased.

Further, since the area of the sub lead 20A exposed by the opening 61 is increased, restrictions on the connection of the wires to the sub lead 20A and the arrangement position of the protective element 40A are further reduced, so that the degree of freedom of the package design can be further improved.

Fifth Embodiment

Figure 26:
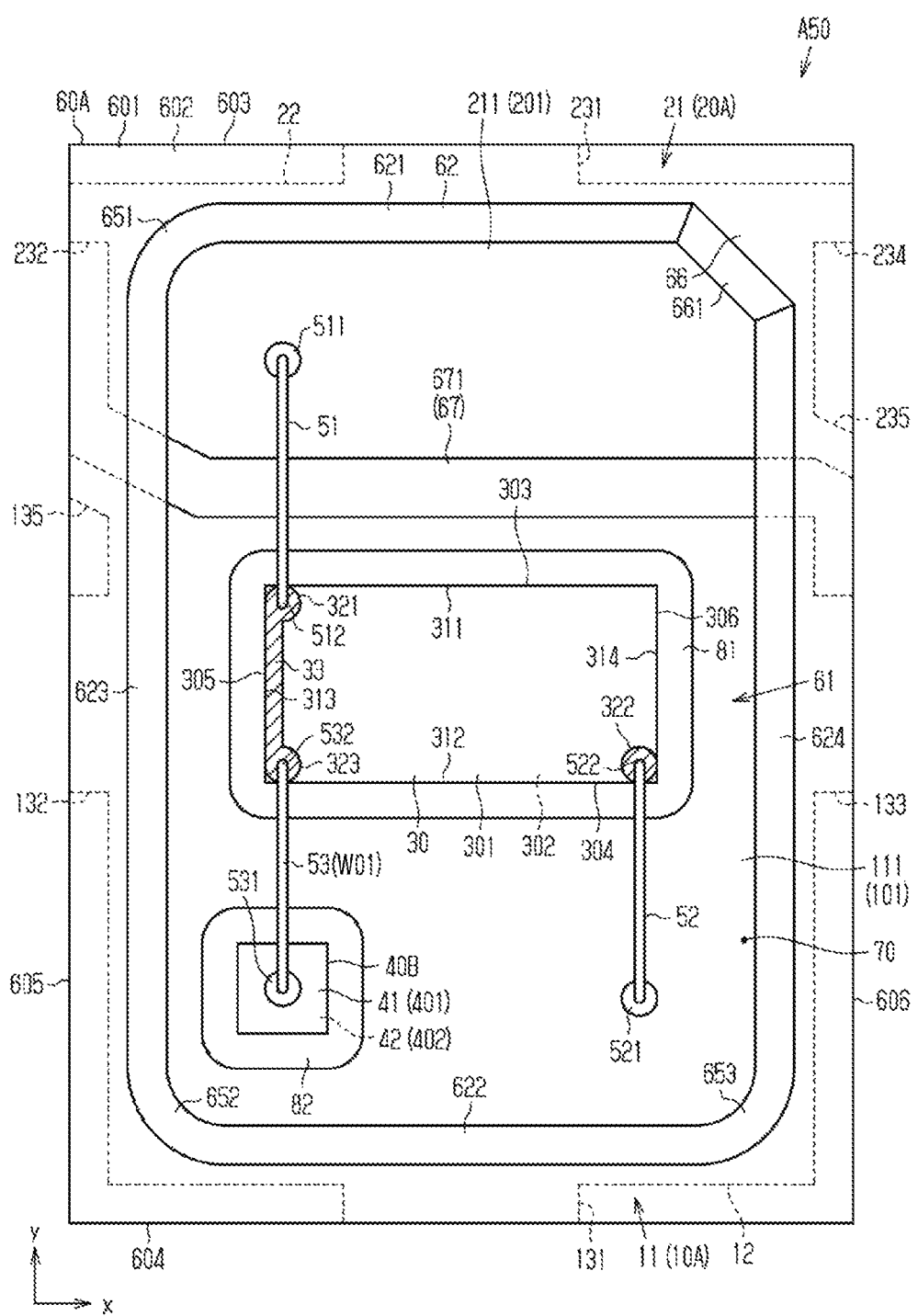
FIG. 26 is a schematic plan view of a semiconductor light emitting device according to a fifth embodiment.

Hereinafter, a semiconductor light emitting device A50 according to a fifth embodiment will be described with reference to FIG. 26. In the semiconductor light emitting device A50 of the fifth embodiment, the same constituent members as those of the semiconductor light emitting devices A10, A20, A30, and A40 of the above embodiments are denoted by the same reference numerals, and some or all of the explanation thereof will be omitted.

The semiconductor light emitting device A50 of the present embodiment is different from the semiconductor light emitting device A40 of the fourth embodiment in the electrode position of the semiconductor light emitting element 30 and the mounting position of the protective element 40B. As shown in FIG. 26, the semiconductor light emitting element 30 has electrodes 321, 322, and 323 and a connecting wiring 33 on the element main surface 301. Each of the electrodes 321 to 323 has a circular shape when viewed in the thickness direction z. The width of the connecting wiring 33 is equal to, for example, the radius of each of the electrodes 321 to 323.

The electrodes 321 and 322 are electrodes connected to the internal semiconductor layer. The electrode 321 is, for example, a cathode electrode, and the electrode 322 is, for example, an anode electrode. The electrode 321 is arranged at a corner portion sandwiched between the first side 311 and the third side 313 of the element main surface 301, and the electrode 322 is arranged at a corner portion sandwiched between the second side 312 and the fourth side 314 of the element main surface 301. In other words, the electrodes 321 and 322 are arranged diagonally to the rectangular element main surface 301. The semiconductor light emitting element 30 is arranged with the element side surface 303 on the side where the electrode 321 is provided facing the sub lead 20A. Further, the electrode 321 is connected to the sub lead 20A by the wire 51. The main body portion 21 of the sub lead 20A functions as a cathode terminal of the semiconductor light emitting device A50. The electrode 322 is located on the opposite side of the sub lead 20A and is connected to the main lead 10A by the wire 52. The main body portion 11 of the main lead 10A functions as an anode terminal of the semiconductor light emitting device A50.

The electrode 323 is arranged at an end portion opposite to the electrode 321 on the third side 313 on which the electrode 321 is provided. That is, the electrode 321 and the electrode 323 are arranged at both end portions of the third side 313 of the element main surface 301. The connecting wiring 33 extends along the third side 313 of the element main surface 301. The connecting wiring 33 connects the electrode 321 and the electrode 323. For example, the electrode 323 is not directly connected to the internal semiconductor layer, but is electrically connected to the internal semiconductor layer via the connecting wiring 33 and the electrode 321. The electrode 323 may be directly connected to the internal semiconductor layer. In the present embodiment, the electrodes 321 and 323 and the connecting wiring 33 form a main surface connecting portion.

The protective element 40B is mounted on the main body portion 11 of the main lead 10A. Specifically, the protective element 40B is mounted on a portion of the main lead 10A on the opposite side of the sub lead 20A with respect to the semiconductor light emitting element 30. That is, the main body portion 21 of the main lead 10A is a die bonding portion on which the semiconductor light emitting element 30 and the protective element 40B are mounted.

The protective element 40B is, for example, a Zener diode. As the protective element 40B, various protective elements mounted on a general semiconductor light emitting device can be used. The protective element 40B has a substantially rectangular parallelepiped shape. The protective element 40B has a main surface 401 and a back surface 402. The main surface 401 and the back surface 402 face opposite sides in the thickness direction z. Electrodes (not shown) are provided on the main surface 401 and the back surface 402, respectively. The main surface electrode 41 is, for example, a cathode electrode, and the back surface electrode 42 is, for example, an anode electrode. The back surface 402 of the protective element 40B is connected to the main body portion 11 of the main lead 10A by a bonding material 82. The bonding material 82 is composed of, for example, solder or Ag paste and has conductivity. The back surface electrode 42 of the protective element 40B is connected to the main lead 10A via the conductive bonding material 82.

The wire 51 connects the sub lead 20A and the electrode 321 of the semiconductor light emitting element 30. The wire 51 is made of, for example, Au. As an example, the first end 511 of the wire 51 is connected to the sub lead 20A, and the second end 512 of the wire 51 is connected to the electrode 321 of the semiconductor light emitting element 30. In a wire bonding process, the first end 511 of the wire 51 serves as a first bonding portion and the second end 512 serves as a second bonding portion. Thus, by connecting the first end 511 of the wire 51 to the sub lead 20A, it is possible to prevent the loop of the wire 51 from becoming too high.

The wire 52 connects the main lead 10A and the electrode 322 of the semiconductor light emitting element 30. The wire 52 is made of, for example, Au. As an example, the first end 521 of the wire 52 is connected to the main lead 10A and the second end 522 of the wire 52 is connected to the electrode 322 of the semiconductor light emitting element 30. Thus, by connecting the first end 521 of the wire 52 to the main lead 10A, it is possible to prevent the loop of the wire 52 from becoming too high.

The wire 53 connects the main surface electrode 41 of the protective element 40B and the electrode 323 of the semiconductor light emitting element 30. The wire 53 is made of, for example, Au. As an example, the first end 531 of the wire 53 is connected to the main surface electrode 41 of the protective element 40B, and the second end 532 of the wire 53 is connected to the electrode 323 of the semiconductor light emitting element 30. The height of the protective element 40B is lower than the height of the semiconductor light emitting element 30. Thus, by connecting the first end 531 of the wire 53 to the protective element 40B, it is possible to prevent the loop of the wire 53 from becoming too high.

As described above, according to the semiconductor light emitting device A50 of the present embodiment, the following effects are achieved in addition to the effects of the fourth embodiment.

(5-1) In the semiconductor light emitting device A50, the semiconductor light emitting element 30 and the protective element 40B are mounted on the main lead 10A. The back surface electrode 42 of the protective element 40B is bonded to the main lead 10A by the conductive bonding material 82. The main surface electrode 41 of the protective element 40B is connected to the sub lead 20A by the connecting member WO1 including the wire 53, the electrodes 323 and 321 of the semiconductor light emitting element 30, the connecting wiring 33 connecting the electrodes 323 and 321, and the wire 51. Accordingly, the main surface electrode 41 of the protective element 40B bonded to the main lead 10A can be easily connected to the sub lead 20A. As a result, it is possible to provide the semiconductor light emitting device A50 with fewer restrictions on the arrangement position of the protective element 40B and the connection position of the wires 51 to 53 and with a high degree of freedom in design.

Modification of Fifth Embodiment

Figure 27:
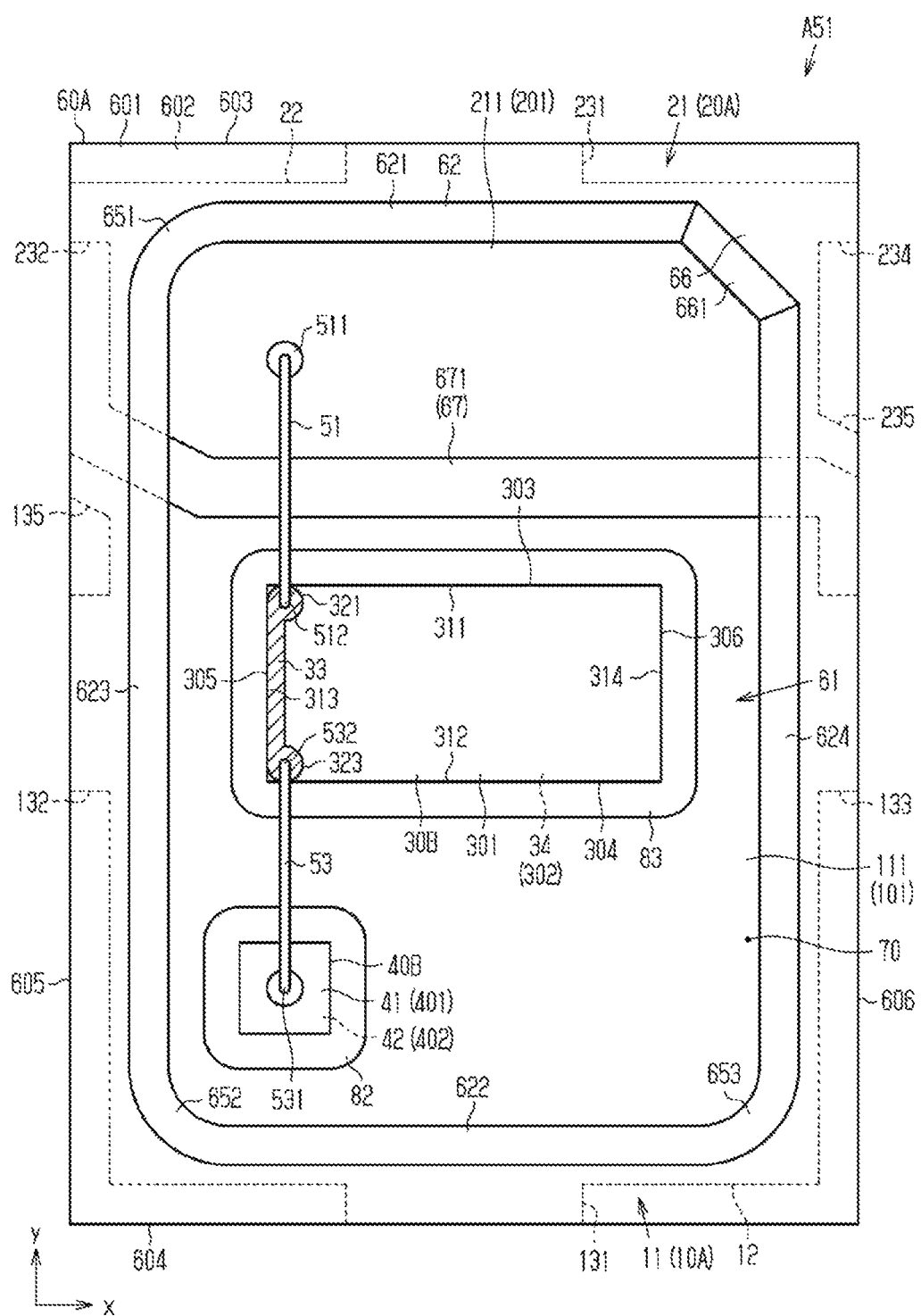
FIG. 27 is a schematic plan view showing a modification of the fifth embodiment.

A semiconductor light emitting device A51 shown in FIG. 27 includes a semiconductor light emitting element 30B.

The semiconductor light emitting element 30B has electrodes 321 and 323 and a connecting wiring 33 on the element main surface 301, and a back surface electrode 34 on the element back surface 302. The electrode 321 on the element main surface 301 is, for example, a cathode electrode, and the back surface electrode 34 on the element back surface 302 is, for example, an anode electrode. The semiconductor light emitting element 30B is mounted on the main surface 101 of the main lead 10A by a bonding material 83. The bonding material 83 is composed of, for example, solder or Ag paste, and has conductivity. The back surface electrode 34 of the semiconductor light emitting element 30B is electrically connected to the main lead 10A via the conductive bonding material 83. Accordingly, in the semiconductor light emitting element 30B, since the element main surface 301 does not have the electrode 322, the area for light emission can be increased to that extent. Further, when the semiconductor light emitting element 30B is used, the wire 52 shown in FIG. 26 can be omitted, and thus the restrictions on the package design can be further reduced.

Sixth Embodiment

Figure 28:
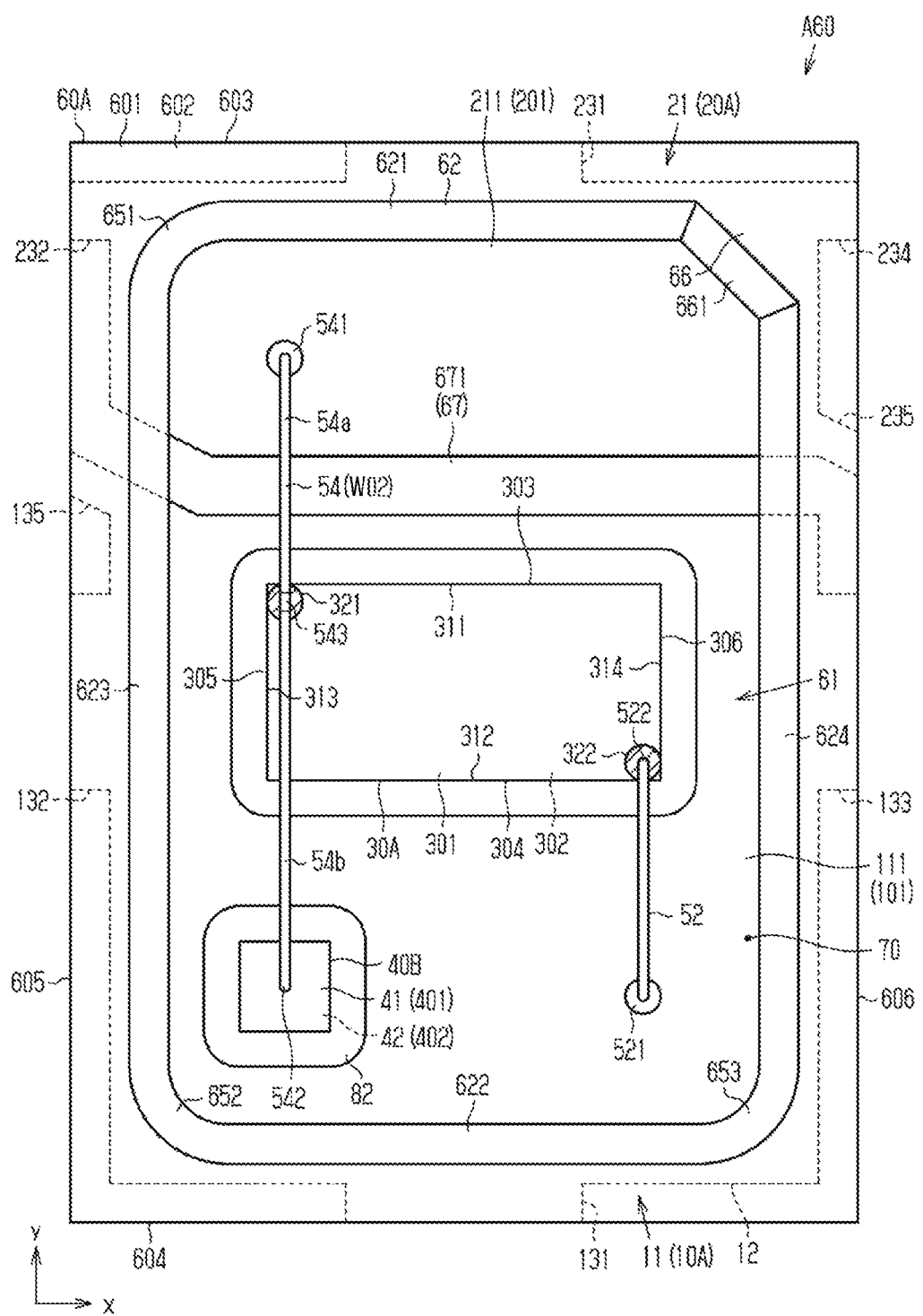
FIG. 28 is a schematic plan view of a semiconductor light emitting device according to a sixth embodiment.

Hereinafter, a semiconductor light emitting device A60 according to a sixth embodiment will be described with reference to FIG. 28. In the semiconductor light emitting device A60 of the sixth embodiment, the same constituent members as those of the semiconductor light emitting devices A10, A20, A30, A40, and A50 of the above embodiments are denoted by the same reference numerals, and some or all of the explanation thereof will be omitted.

The semiconductor light emitting device A60 of the sixth embodiment is different from the semiconductor light emitting device A50 of the fifth embodiment in the connection of the electrodes of the semiconductor light emitting element 30A and the protective element 40B. As shown in FIG. 28, the semiconductor light emitting device A60 of the present embodiment includes a semiconductor light emitting element 30A. The semiconductor light emitting element 30A is a semiconductor chip formed by laminating a semiconductor material on an insulating substrate. The semiconductor light emitting element 30A has electrodes 321 and 322 on the element main surface 301. The semiconductor light emitting element 30A does not include the electrode 323 and the connecting wiring 33 shown in FIG. 27.

The protective element 40B is mounted on the main body portion 11 of the main lead 10A. The protective element 40B has a main surface 401, a back surface 402, a main surface electrode 41 on the main surface 401, and a back surface electrode 42 on the back surface 402. The main surface electrode 41 is, for example, a cathode electrode, and the back surface electrode 42 is an anode electrode. The back surface electrode 42 is connected to the main lead 10A by a conductive bonding material 82.

The main surface electrode 41 of the protective element 40B is connected to the electrode 321 of the semiconductor light emitting element 30A and the sub lead 20A by a wire 54. A first end 541 of the wire 54 is connected to the sub lead 20A, and a second end 542 of the wire 54 is connected to the main surface electrode 41 of the protective element 40B. Further, the wire 54 is connected to the electrode 321 of the semiconductor light emitting element 30A at a midpoint 543 between the first end 541 and the second end 542. That is, the wire 54 has the first end 541 connected to the sub lead 20A, the midpoint 543 connected to the electrode 321 of the semiconductor light emitting element 30A, and the second end 542 connected to the main lead 10A.

The semiconductor light emitting element 30A is connected to the main lead 10A by the wire 52, and is also connected to the sub lead 20A by a first portion 54a between the first end 541 and the midpoint 543 of the wire 54. The protective element 40B is connected to the main lead 10A by the bonding material 82, and is also connected to the sub lead 20A by a portion between the first end 541 and the second end 542 of the wire 54, that is, the first portion 54a and a second portion 54b. The wire 54 forms a connecting member W02 that interconnects the protective element 40B and the sub lead 20A via the semiconductor light emitting element 30A.

As described above, according to the semiconductor light emitting device A60 of the present embodiment, the following effects are achieved in addition to the effects of the fifth embodiment.

(6-1) The semiconductor light emitting device A60 has the main lead 10A, the sub lead 20A, and the semiconductor light emitting element 30A and the protective element 40B, which are bonded to the main lead 10A. The semiconductor light emitting element 30A is connected to the main lead 10A and the sub lead 20A by the wires 52 and 54, respectively. The back surface electrode 42 of the protective element 40B is connected to the main lead 10A by the conductive bonding material 82. The main surface electrode 41 of the protective element 40B is connected to the electrode 321 of the semiconductor light emitting element 30A and the sub lead 20 by the wire 54. Accordingly, the protective element 40B bonded to the main lead 10A can be easily connected to the semiconductor light emitting element 30A and the sub lead 20A. As a result, it is possible to provide the semiconductor light emitting device A60 with fewer restrictions on the arrangement position of the protective element 40B and the connection position of the wires 52 and 54 and with a high degree of freedom in design.

Modification of Sixth Embodiment

Figure 29:
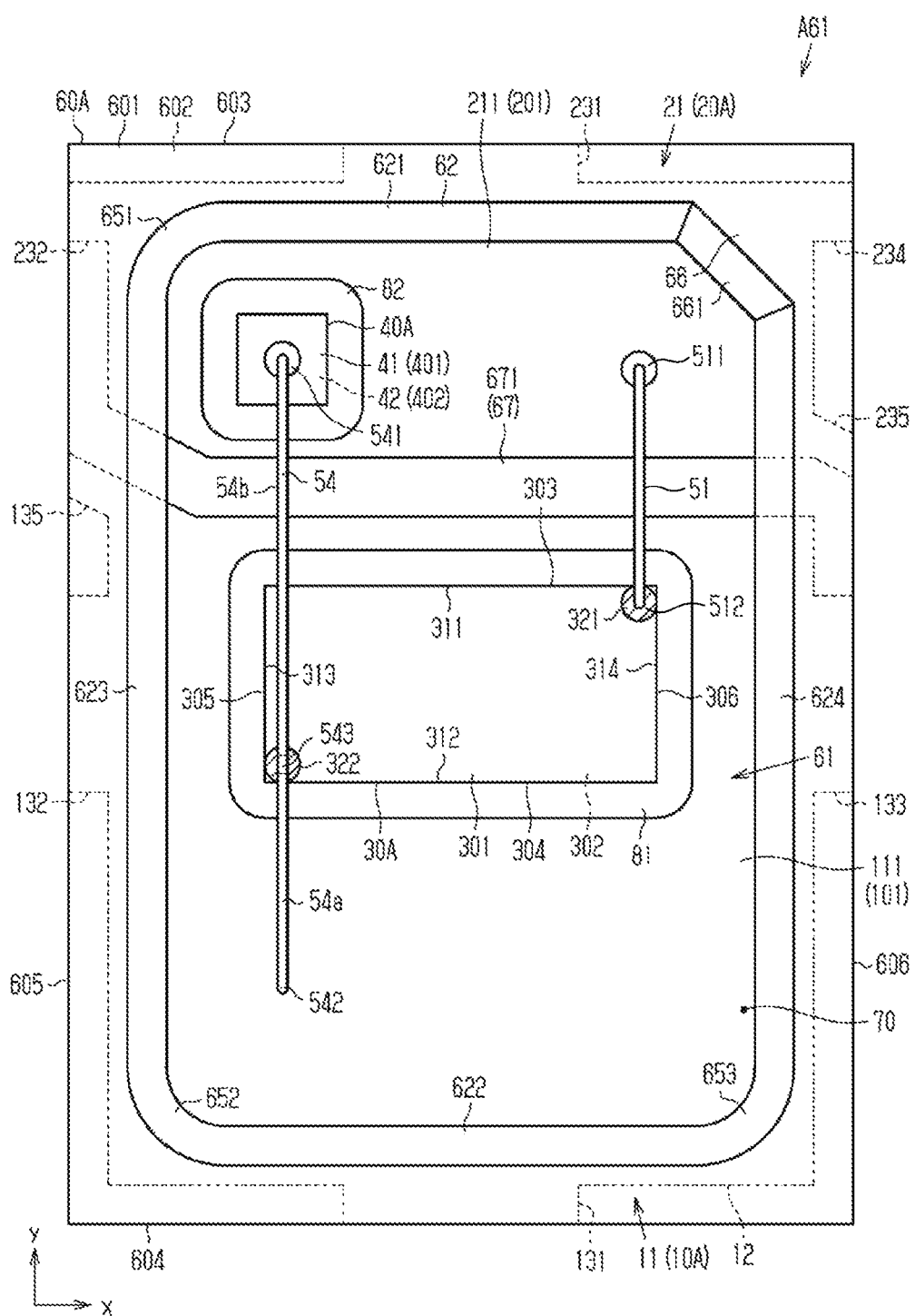
FIG. 29 is a schematic plan view showing a modification of the sixth embodiment.

In a semiconductor light emitting device A61 shown in FIG. 29, the protective element 40A is mounted on the sub lead 20A. The semiconductor light emitting element 30A has electrodes 321 and 322 on the element main surface 301. In the rectangular element main surface 301, the electrode 321 is arranged at a corner portion sandwiched between the first side 311 and the fourth side 314, and the electrode 322 is arranged at a corner portion sandwiched between the second side 312 and the third side 313. The arrangement position of the electrode 322 may be changed as appropriate. The first end 541 of the wire 54 is connected to the main surface electrode 41 of the protective element 40A, the midpoint 543 of the wire 54 is connected to the electrode 322 of the semiconductor light emitting element 30A, and the second end 542 of the wire 54 is connected to the main lead 10A. The first end 511 of the wire 51 is connected to the sub lead 20A, and the second end 512 of the wire 51 is connected to the electrode 321 of the semiconductor light emitting element 30A. In this modification, the recognition part 66 is formed by chamfering one corner portion of the rectangular opening 61 in the case 60A. Accordingly, the exposed portion of the main surface 201 of the sub lead 20A becomes large and the wire 51 can be connected along the first direction y, so that the connectivity of the wire 51 can be further improved.

As compared with the semiconductor light emitting device A60 of the sixth embodiment, the first end 541 of the wire 54 is connected to the main surface electrode 41 of the protective element 40B, and the second end 542 of the wire 54 is connected to the sub lead 20A. The semiconductor light emitting device having the wire 54 connected as described above also achieves the same effects as those of the above embodiment.

(Other Modifications)

Each of the embodiments described above can be modified and implemented as follows. The shape of each of the electrodes 321 to 323 can be changed as appropriate. Further, the line width of the connecting wiring 33 can be changed as appropriate.

Figure 30:
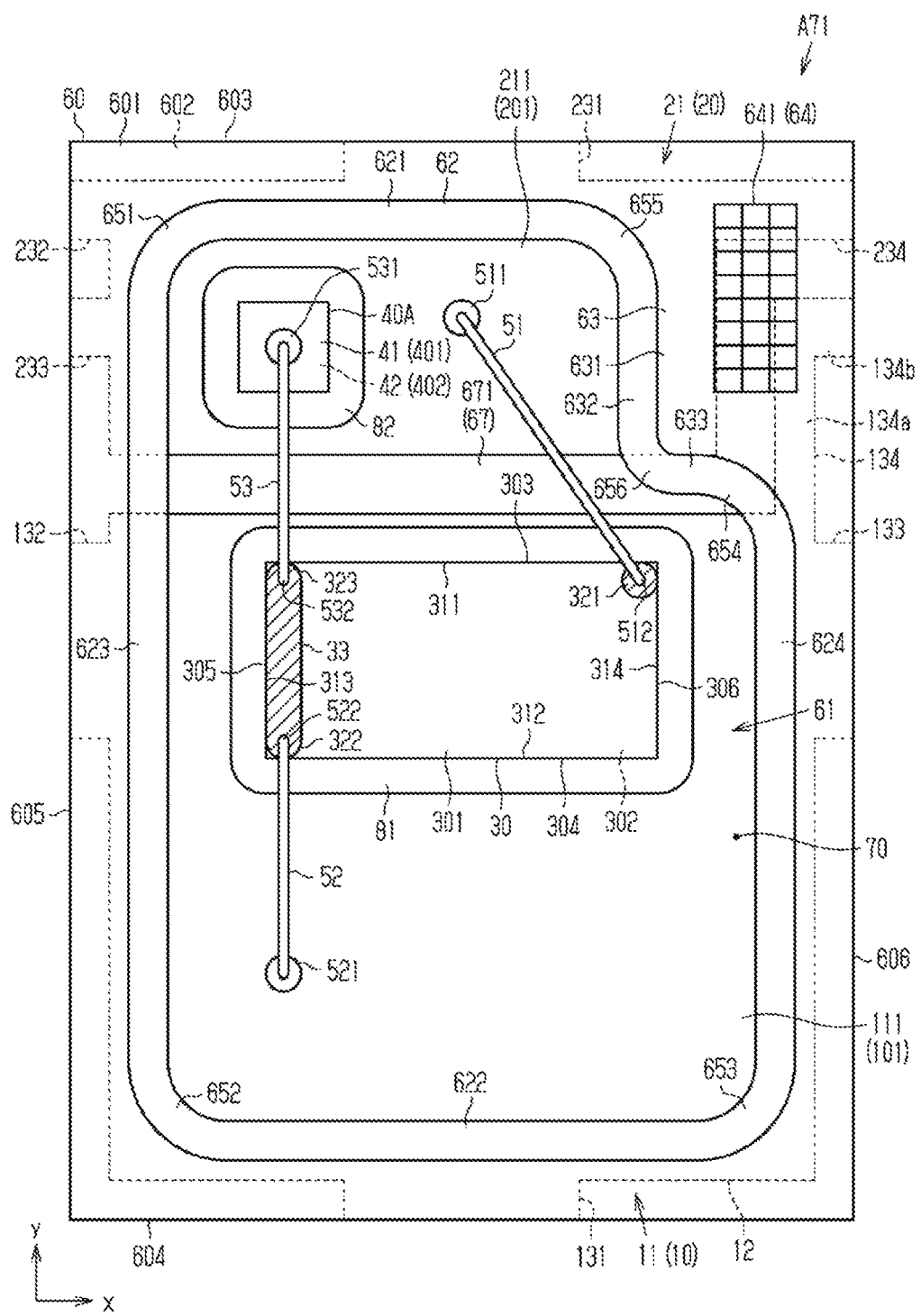
FIG. 30 is a schematic plan view of a semiconductor light emitting device according to a modification.

In a semiconductor light emitting element 30 of a semiconductor light emitting device A71 shown in FIG. 30, the line width of the connecting wiring 33 is equal to the diameter of the electrodes 322 and 323. The line width of the connecting wiring 33 may be larger than the diameter of the electrodes 322 and 323.

Figure 31:
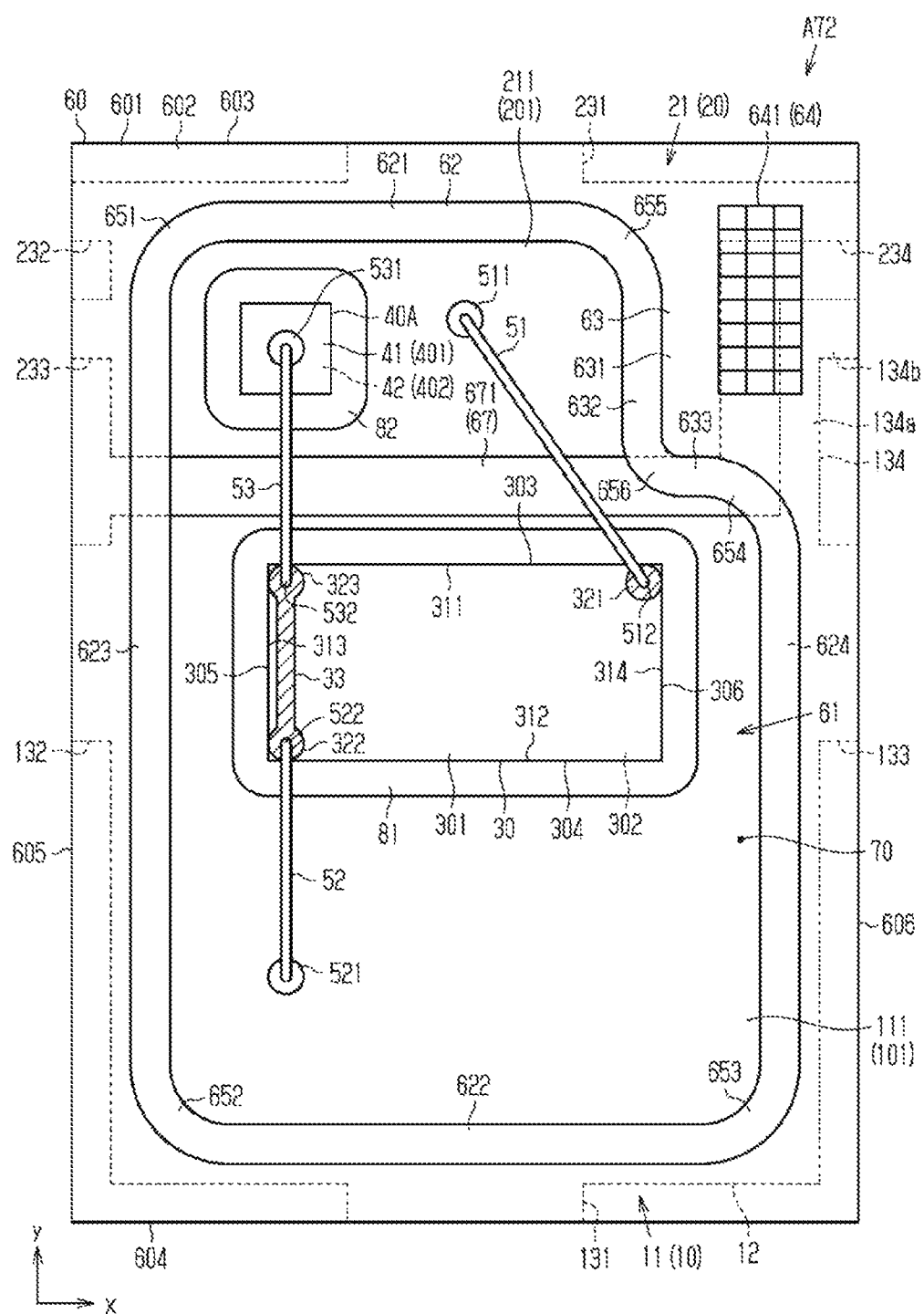
FIG. 31 is a schematic plan view of a semiconductor light emitting device according to a modification.

In a semiconductor light emitting element 30 of a semiconductor light emitting device A72 shown in FIG. 31, the line width of the connecting wiring 33 is equal to, for example, the radius of the electrodes 322 and 323. The connecting wiring 33 is arranged apart from the third side 313 of the element main surface 301 so as to interconnect the centers of the electrodes 322 and 323. The connecting wiring 33 may be arranged inward of a line segment connecting the centers of the electrodes 322 and 323 on the element main surface 301.

Figure 32:
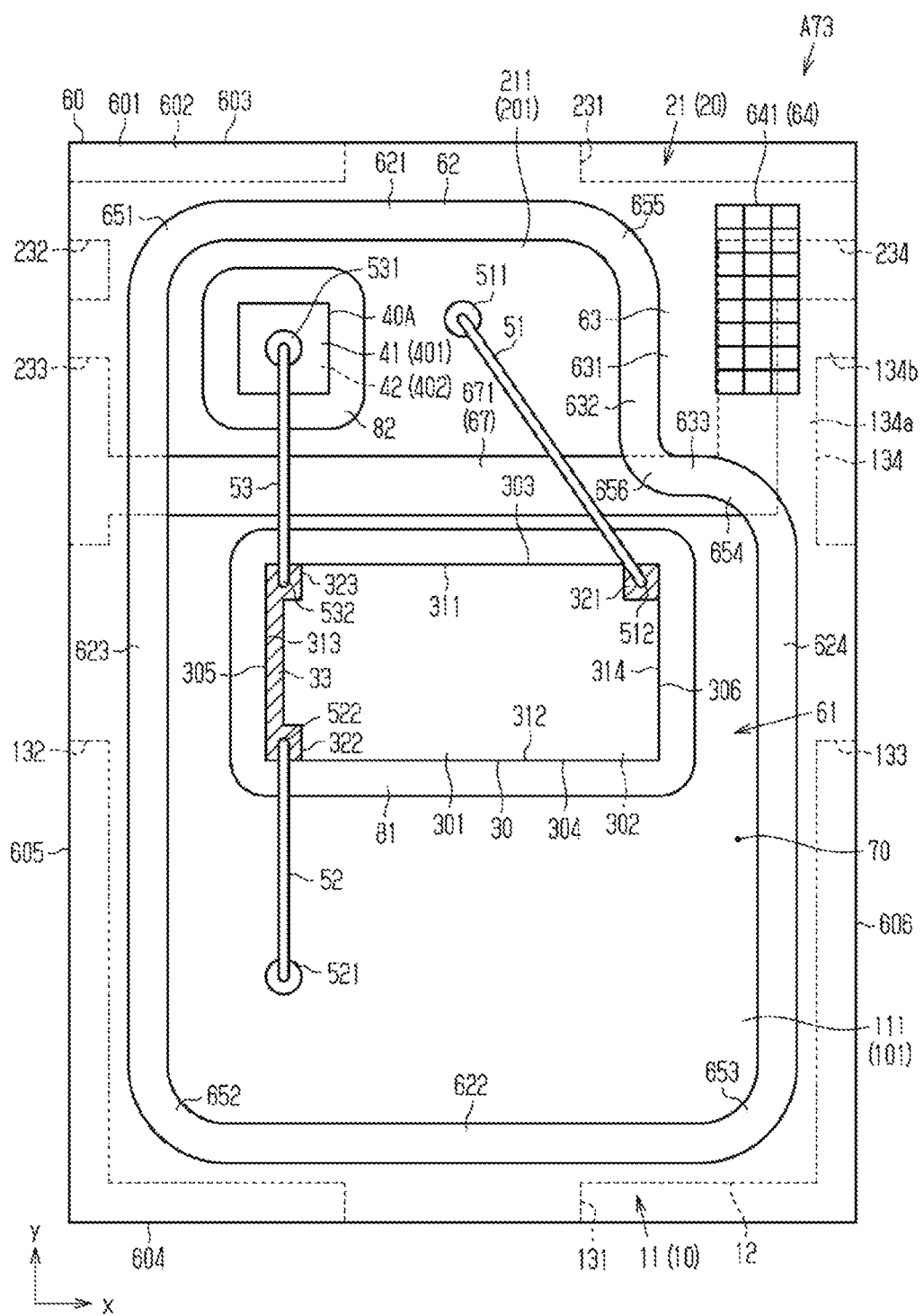
FIG. 32 is a schematic plan view of a semiconductor light emitting device according to a modification.

In a semiconductor light emitting device A73 shown in FIG. 32, each of the electrodes 321, 322, and 323 of a semiconductor light emitting element 30 is formed in a rectangular shape, for example, a square shape. The connecting wiring 33 is provided so as to extend along the third side 313 of the element main surface 301, and connects the electrode 322 and the electrode 323. The line width of the connecting wiring 33 is set to be, for example, half the length of the side of the electrodes 322 and 323. The line width of the connecting wiring 33 may be changed as appropriate.

Figure 33:
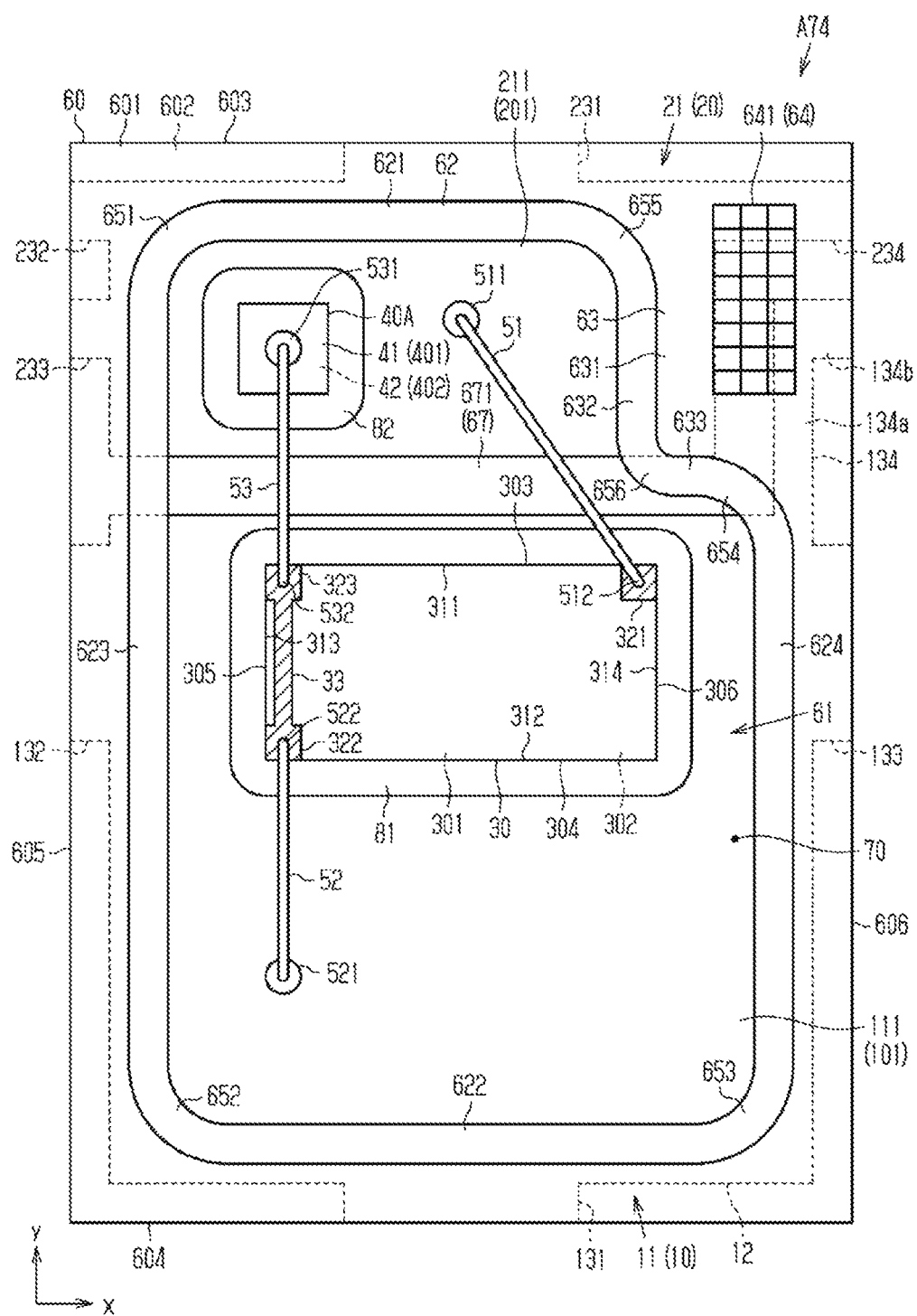
FIG. 33 is a schematic plan view of a semiconductor light emitting device according to a modification.

In a semiconductor light emitting element 30 of a semiconductor light emitting device A74 shown in FIG. 33, the connecting wiring 33 that connects the rectangular electrodes 322 and 323 may be arranged apart from the third side 313 of the semiconductor light emitting element 30. The line width of the connecting wiring 33 may be changed as appropriate.

Figure 34:
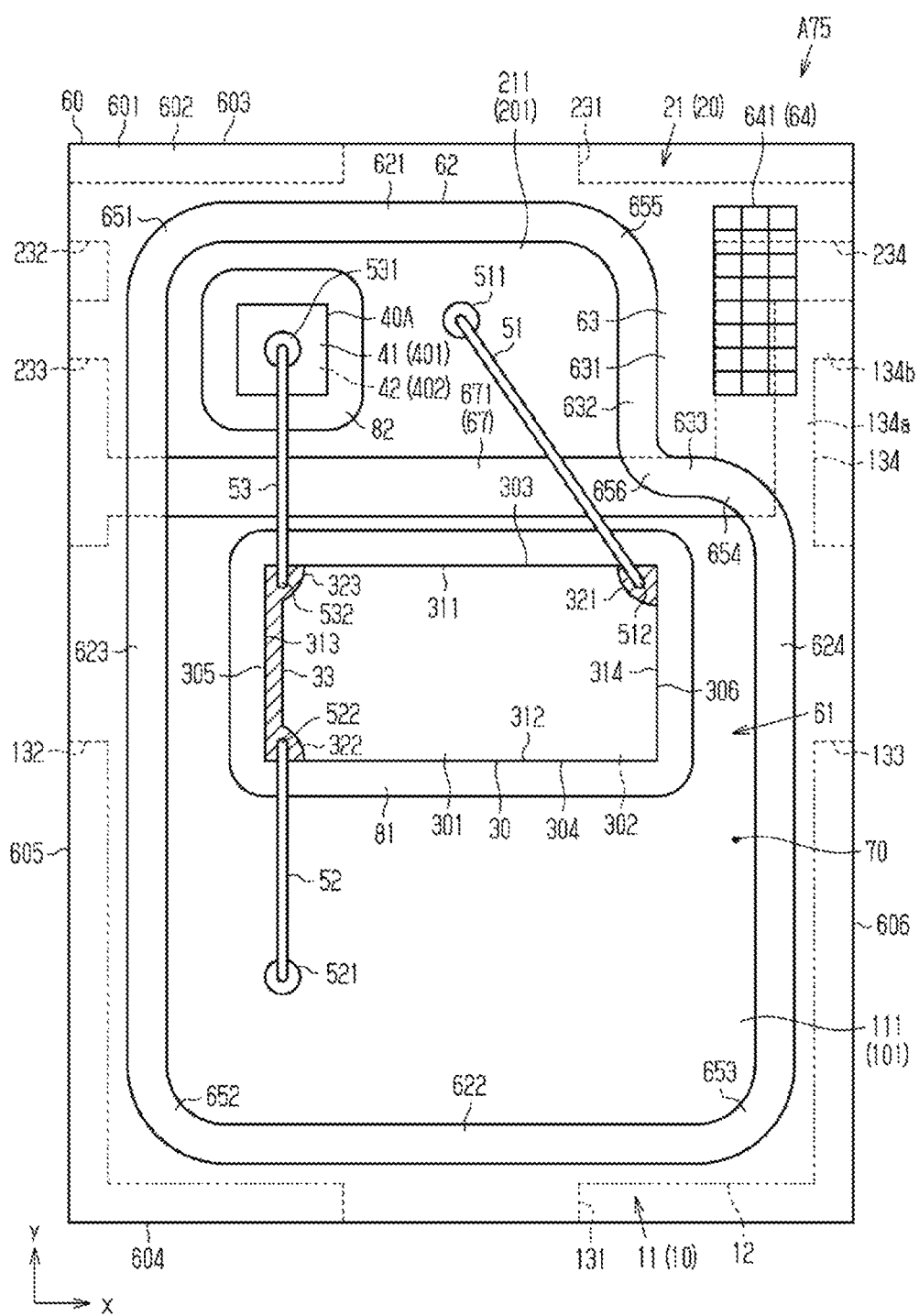
FIG. 34 is a schematic plan view of a semiconductor light emitting device according to a modification.

In a semiconductor light emitting device A75 shown in FIG. 34, each of the electrodes 321, 322, and 323 of a semiconductor light emitting element 30 is formed in a quarter circle shape when viewed in the thickness direction z. The connecting wiring 33 is provided so as to extend along the third side 313 of the element main surface 301, and connects the electrode 322 and the electrode 323. The line width of the connecting wiring 33 is set to be, for example, half the radius of the electrodes 322 and 323. The line width of the connecting wiring 33 may be changed as appropriate.

Figure 35:
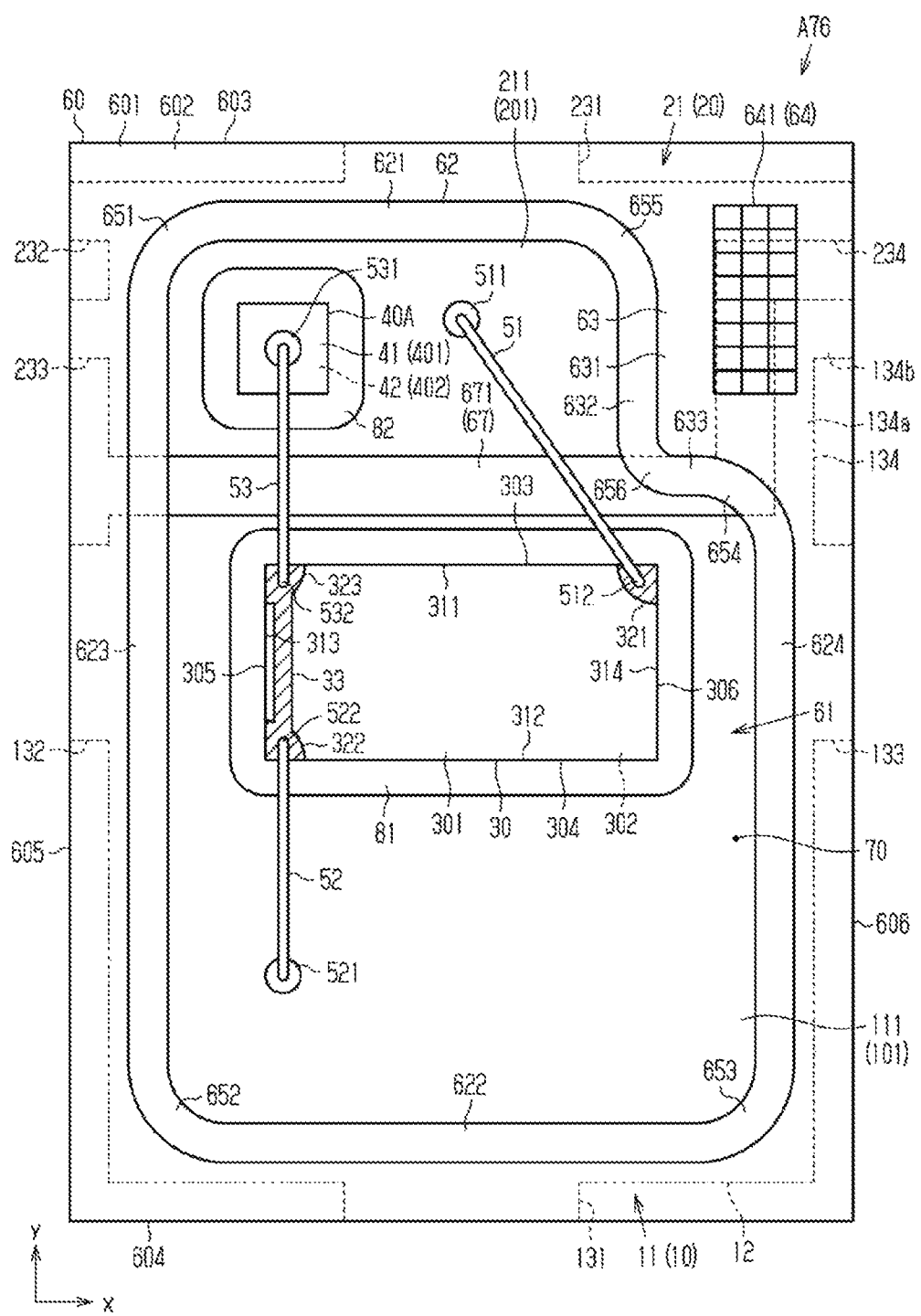
FIG. 35 is a schematic plan view of a semiconductor light emitting device according to a modification.

As shown in FIG. 35, in a semiconductor light emitting element 30 of a semiconductor light emitting device A76, the connecting wiring 33 that connects the electrodes 322 and 323 may be arranged apart from the third side 313. The line width of the connecting wiring 33 may be changed as appropriate.

The sizes of the electrodes 321, 322, and 323 on the element main surface 301 of the semiconductor light emitting element 30 may be different from one another. Further, the shapes of the electrodes 321, 322, and 323 on the element main surface 301 of the semiconductor light emitting element 30 may be different from one another.

The connecting wiring 33 may be omitted as compared with the first embodiment. For example, the electrodes 322 and 323 shown in FIG. 1 may be interconnected to form one electrode, and the wires 52 and 53 may be connected to the one electrode. Such one electrode functions as a supply electrode that supplies a current to the semiconductor light emitting element 30. For example, in some embodiments, on the element main surface 301 of the semiconductor light emitting element 30, the one electrode may be arranged on the side 312 opposite to the side 311 on which the electrode 321 is arranged. Specifically, for example, the one electrode may be arranged diagonally to the electrode 321 in some embodiments.

According to the present disclosure in some embodiments, it is possible to provide a semiconductor light emitting device that includes a semiconductor light emitting element and a protective element and that can be easily mounted on a mounting substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor light emitting device comprising:
   a main lead having a main surface and a first back surface facing a side opposite to the main surface;
   a sub lead arranged in a first direction with respect to the main lead, and having a main surface facing a same side as the main surface of the main lead and a second back surface facing the side opposite to the main surface of the sub lead;
   a case configured to support the main lead and the sub lead, and having a case main surface facing the same side as the main surfaces of the main lead and the sub lead, and an opening formed in the case main surface to expose portions of the main lead and the sub lead;
   a semiconductor light emitting element arranged on the main surface of the main lead, and having an element main surface facing the same side as the main surface of the main lead, an element back surface facing the main surface of the main lead, a first electrode formed on the element main surface, and a main surface connecting portion formed on the element main surface;
   a first bonding material bonding the semiconductor light emitting element to the main lead;
   a first wire connecting the first electrode of the semiconductor light emitting element to the sub lead;
   a protective element arranged on the main surface of the sub lead, and having a main surface and a back surface facing opposite directions, a main surface electrode formed on the main surface of the protective element, and a back surface electrode formed on the back surface of the protective element;
   a conductive second bonding material bonding the back surface electrode of the protective element to the sub lead; and
   a connecting member configured to connect the main surface electrode of the protective element to the main lead via the main surface connecting portion of the semiconductor light emitting element.

2. The semiconductor light emitting device of claim 1, wherein the connecting member has a second wire connecting the main surface electrode of the protective element and the main surface connecting portion of the semiconductor light emitting element, and a third wire connecting the main surface connecting portion of the semiconductor light emitting element and the main lead.

3. The semiconductor light emitting device of claim 1, wherein the connecting member is a wire including a first portion connecting the main surface electrode of the protective element and the first electrode of the semiconductor light emitting element, and a second portion connecting the first electrode of the semiconductor light emitting element and the main lead.

4. The semiconductor light emitting device of claim 1, wherein the main surface connecting portion includes a second electrode and a third electrode which are arranged apart from each other, and a connecting wiring connecting the second electrode and the third electrode, and
wherein the connecting member includes a second wire connecting the main surface electrode of the protective element and the second electrode of the semiconductor light emitting element, and a third wire connecting the third electrode of the semiconductor light emitting element and the main lead.

5. The semiconductor light emitting device of claim 1, wherein the case has a rectangular parallelepiped shape that is lengthwise in the first direction, and
wherein the semiconductor light emitting element is arranged in a center of the case in the first direction.

6. The semiconductor light emitting device of claim 1, wherein the connecting member is connected to a portion of the main lead on the side opposite to the sub lead with respect to the semiconductor light emitting element.

7. The semiconductor light emitting device of claim 1, wherein each of the main lead and the sub lead has a main body portion having a main surface and a back surface facing opposite directions, and an edge portion extending from the main body portion and having a main surface and a back surface facing opposite directions, the edge portion being thinner than the main body portion, and
wherein the main surface of the main body portion is flush with the main surface of the edge portion.

8. The semiconductor light emitting device of claim 7, wherein the case has a case back surface facing a side opposite to the case main surface, and
wherein the back surface of the main body portion is exposed by the case back surface.

9. The semiconductor light emitting device of claim 1, wherein the protective element comprises a Zener diode.

10. A semiconductor light emitting device comprising:
a main lead having a main surface and a first back surface facing a side opposite to the main surface;
a sub lead arranged in a first direction with respect to the main lead, and having a main surface facing a same side as the main surface of the main lead and a second back surface facing a side opposite to the main surface of the sub lead;
a case configured to support the main lead and the sub lead, and having a case main surface facing the same side as the main surfaces of the main lead and the sub lead, and an opening formed in the case main surface to expose portions of the main lead and the sub lead;
a semiconductor light emitting element arranged on the main surface of the main lead, and having an element main surface facing the same side as the main surface of the main lead, an element back surface facing the main surface of the main lead, and a main surface connecting portion formed on the element main surface;
a protective element arranged on the main surface of the main lead, and having a main surface and a back surface facing opposite directions, a main surface electrode formed on the main surface of the protective element, and a back surface electrode formed on the back surface of the protective element;
a first bonding material bonding the semiconductor light emitting element to the main lead;
a conductive second bonding material bonding the back surface electrode of the protective element to the main lead; and
a connecting member configured to connect the main surface electrode of the protective element to the sub lead via the main surface connecting portion of the semiconductor light emitting element.

11. The semiconductor light emitting device of claim 10, wherein the connecting member has a first wire connecting the main surface electrode of the protective element and the main surface connecting portion of the semiconductor light emitting element, and a second wire connecting the main surface connecting portion of the semiconductor light emitting element and the sub lead.

12. The semiconductor light emitting device of claim 10, wherein the connecting member is a wire having a first portion connecting the main surface electrode of the protective element and the main surface connecting portion of the semiconductor light emitting element, and a second portion connecting the main surface connecting portion of the semiconductor light emitting element and the sub lead.

13. The semiconductor light emitting device of claim 10, wherein the main surface connecting portion includes a first electrode and a second electrode which are arranged apart from each other, and a connecting wiring connecting the first electrode and the second electrode, and
wherein the connecting member includes a first wire connecting the main surface electrode of the protective element and the first electrode, and a second wire connecting the second electrode of the semiconductor light emitting element and the sub lead.

14. The semiconductor light emitting device of claim 10, wherein the semiconductor light emitting element has a connecting electrode on the element main surface,
wherein the semiconductor light emitting device further comprises a third wire connecting the connecting electrode and the main lead.

15. The semiconductor light emitting device of claim 10, wherein the semiconductor light emitting element has a connecting electrode on the element back surface, and
wherein the first bonding material has conductivity and bonds the connecting electrode and the main lead.

* * * * *